(12) United States Patent
Adegawa et al.

(10) Patent No.: US 6,720,128 B2
(45) Date of Patent: Apr. 13, 2004

(54) POSITIVE RESIST COMPOSITION

(75) Inventors: Yutaka Adegawa, Shizuoka (JP); Toshiaki Aoai, Shizuoka (JP); Ippei Nakamura, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 142 days.

(21) Appl. No.: 10/062,497

(22) Filed: Feb. 5, 2002

(65) Prior Publication Data

US 2003/0039916 A1 Feb. 27, 2003

(30) Foreign Application Priority Data

Feb. 5, 2001 (JP) .................... P. 2001-028336
Mar. 16, 2001 (JP) .................... P. 2001-076688

(51) Int. Cl.$^7$ ............................. G03F 7/004
(52) U.S. Cl. ............... 430/270.1; 430/905; 430/914
(58) Field of Search .................. 430/270.1, 905, 430/914, 921

(56) References Cited

U.S. PATENT DOCUMENTS 5,064,741 A * 11/1991 Koike et al. ............... 430/191

OTHER PUBLICATIONS

Yagi et al, "Synthesis and Reactions of Polymers with Photoactive Terminal Groups–3. The Use of Radical Promoted Cationic Polymerization for the Synthesis of Poly(n–Butyl Vinylether) with N–Acyl Dibenz(b,f)Azepine Terminal Units", Eur. Polym. J., vol. 23, No. 10, pp. 737–740, 1987.

* cited by examiner

Primary Examiner—Rosemary Ashton
(74) Attorney, Agent, or Firm—Sughrue Mion, PLLC

(57) ABSTRACT

A positive resist composition comprises: a compound capable of directly or indirectly generating a radical (A) on irradiation with an energy ray; or a cyclic ether compound.

12 Claims, No Drawings

POSITIVE RESIST COMPOSITION

FIELD OF THE INVENTION

The present invention relates to a positive chemical amplification resist composition, more specifically relates to a positive chemical amplification resist composition excellent in pattern profile obtained by exposure with electron beams or X-rays, exhibiting high sensitivity and high resolution, and excellent in process delay stability (PCD, PED and PBD) with the lapse of time.

"PCD (Post Coating Delay) stability" means the film stability in the case where a resist composition is coated on a substrate and allowed to stand inside or outside of an irradiation apparatus. "PED (Post Exposure Delay) stability" means the film stability in the case where a resist composition is allowed to stand inside or outside of an irradiation apparatus during the period of time after electron beam irradiation and before heating operation. "PBD (post bake delay) stability" means the film stability in the case where a resist composition is allowed to stand inside or outside of an irradiation apparatus during the period of time from heating operation after exposure (post exposure bake) to development.

BACKGROUND OF THE INVENTION

The degree of integration of integrated circuits has been heightened more and more, and processing of ultra-fine pattern comprising a line width of half a micrometer or less has been required in the manufacture of semiconductor substrates, such as ultra LSI. For satisfying the necessity, a chemical amplification resist is used as the resist material for lithography.

In particular, the electron beam and X-ray are positioned as the pattern-forming technique of the next generation or the next of the next generation, and the development of a positive resist composition capable of obtaining high sensitivity, high resolution and a rectangular profile has been desired.

Further, the positive chemical amplification resist is easily influenced by the basic contaminants in air, or liable to be influenced by exposure to air in and outside an irradiation apparatus (drying of a film), and the surface of the compositions becomes hardly soluble. As a result, there arises a problem that the pattern becomes a T-top shape (the surface forms T-shaped eaves) in case of a line pattern, and the surface becomes a capped shape (eaves are formed on the contact hole surface) in case of a contact hole pattern. In addition, there is another problem that the stability with the lapse of time (PCD and PED) in and outside an irradiation apparatus is deteriorated and the pattern dimension fluctuates.

Furthermore, as compared with resists for photolithography, such as an i-ray resist, a KrF eximer laser resist and an ArF eximer laser resist, resists for electron beam lithography and X-ray lithography are high in resolution, but low in throughput. Therefore, the development of a resist which shows high sensitivity while maintaining high resolution has been desired.

Further, there is another problem that the storage stability (PBD stability) of a positive chemical amplification resist is also deteriorated when allowed to stand during the period of time from heating operation after exposure to development.

SUMMARY OF THE INVENTION

An object of the present invention is to provide a positive chemical amplification resist composition which is high sensitivity, high resolution and capable of providing an excellent rectangular pattern profile, and is excellent in PCD and PED stability as well.

Another object of the present invention is to provide a positive chemical amplification resist composition which is excellent in coating property (in-plane uniformity).

A further object of the present invention is to provide a positive resist composition for an electron beam or an X-ray which can obtain high sensitivity, high resolution and also PBD (post bake delay) stability.

That is, the above objects of the present invention have been accomplished by the following positive resist composition.

1. A positive chemical amplification resist composition (a first embodiment) which comprises (a) a compound capable of directly or indirectly generating a radical (A) on irradiation with an energy ray.

2. The positive chemical amplification resist composition as described in 1., which further comprises (b) a compound capable of generating an acid on irradiation with an energy ray.

3. The positive chemical amplification resist composition as described in 1., which further comprises at least one of: (e) a resin: containing an acid-decomposable group; and being capable of increasing the solubility in an alkali developer by the action of an acid; and (g) a resin insoluble in water and soluble in an alkali developer.

4. The positive chemical amplification resist composition as described in 1., which further comprises (f) a low molecular weight dissolution-inhibiting compound: having a molecular weight of 3,000 or less; containing an acid-decomposable group; and being capable of increasing the solubility in an alkali developer by the action of an acid.

5. The positive chemical amplification resist composition as described in 1., wherein the radical (A) is capable of generating an acid by a reaction with the compound (a).

6. The positive chemical amplification resist composition as described in 1., wherein the compound (a) is at least one compound selected from the group consisting of:

(1) an alkyl halide other than an alkyl fluoride, an aryl halide other than an aryl fluorine, an aralkyl halide other than an aralkyl fluorine, and an allyl halide other than an allyl fluorine, in which a part or all of the hydrogens in the alkyl halide, the aryl halide, the aralkyl halide and the allyl halide may be substituted with a fluorine, (2) a thiol compound, a secondary alcohol, a substituted or unsubstituted allyl alcohol, a benzyl alcohol which may be a substituent on the aromatic ring, ester and ether compounds of them, a sulfide compound, and a disulfide compound, (3) a halogen-containing silicon compound and an alkoxy silicon compound, (4) a straight chain, branched or cyclic acetal compound, and (5) an N-hydroxyl compound.

7. The positive chemical amplification resist composition as described in 2., wherein the compound (b) contains at least one compound represented by formula (II) or (III):

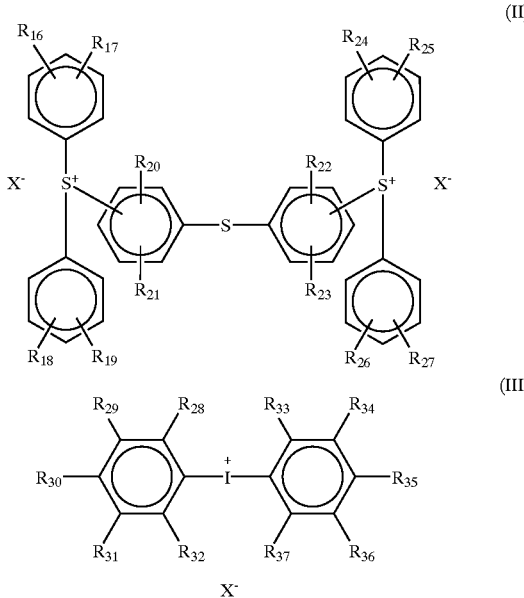

wherein $R_{16}$ to $R_{37}$, which are the same or different, each represents a hydrogen atom, a straight chain, branched or cyclic alkyl group, a straight chain, branched or cyclic alkoxyl group, a hydroxyl group, a halogen atom, or an —S—$R_{38}$ group; $R_{38}$ represents a straight chain, branched or cyclic alkyl group, or an aryl group, and at least two of $R_{16}$ to $R_{27}$, and at least two of $R_{28}$ to $R_{37}$ may be bonded to form a ring containing at least one selected from a single bond, a carbon atom, an oxygen atom, a sulfur atom and a nitrogen atom; and $X^-$ represents an anion of a sulfonic acid.

8. The positive chemical amplification resist composition as described in 7., wherein $X^-$ represents an anion of an alkylsulfonic acid, a benzenesulfonic acid, a naphthalenesulfonic acid or an anthracenesulfonic acid, each of which has at least one group selected from the group consisting of:

at least one fluorine atom;

a straight chain, branched, or cyclic alkyl group substituted with at least one fluorine atom;

a straight chain, branched, or cyclic alkoxyl group substituted with at least one fluorine atom;

an acyl group substituted with at least one fluorine atom;

an acyloxy group substituted with at least one fluorine atom;

a sulfonyl group substituted with at least one fluorine atom;

a sulfonyloxy group substituted with at least one fluorine atom;

a sulfonylamino group substituted with at least one fluorine atom;

an aryl group substituted with at least one fluorine atom;

an aralkyl group substituted with at least one fluorine atom; and an alkoxycarbonyl group substituted with at least one fluorine atom.

9. The positive chemical amplification resist composition as described in 1., which further comprises (c) an organic basic compound.

10. The positive chemical amplification resist composition as described in 1., which further comprises (d) a surfactant containing at least one of a fluorine atom and a silicon atom.

11. The positive chemical amplification resist composition as described in 1., which further comprises propylene glycol monomethyl ether acetate as a solvent.

12. The positive chemical amplification resist composition as described in 1., wherein the energy ray is one of an electron beam and an X-ray.

13. A positive resist composition to be irradiated with one of an electron beam and X-ray (a second embodiment), which comprises:

(b1) a compound capable of generating an acid on irradiation with one of an electron beam and an X-ray;

(h) a cyclic ether compound; and (c) an organic basic compound.

14. The positive resist composition as described in 13., wherein the compound (b1) contains at least one compound represented by formula (I), (II) or (III):

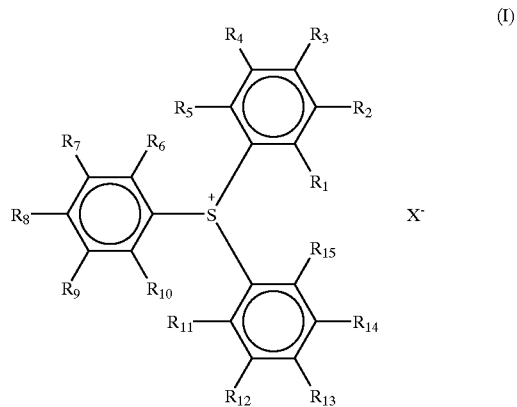

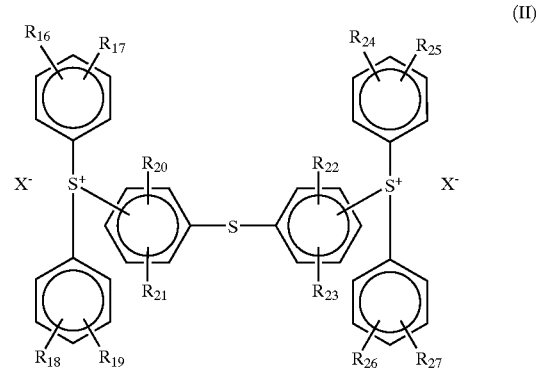

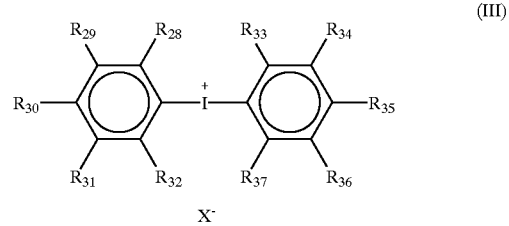

wherein $R_1$ to $R_{37}$, which are the same or different, each represents hydrogen atom, a straight chain, branched or cyclic alkyl group, a straight chain, branched or cyclic alkoxyl group, a hydroxyl group; halogen atom, or an —S—$R_{38}$ group; $R_{38}$ represents a straight chain, branched or cyclic alkyl group, or an aryl group, and at least two of $R_1$ to $R_{15}$, at least two of $R_{16}$ to $R_{27}$, and at least two of $R_{28}$ to $R_{37}$ may be bonded to form a ring containing at least one selected from a single bond, a carbon atom, an oxygen atom, a sulfur atom and a nitrogen atom; and $X^-$ represents an anion of a sulfonic acid.

15. The positive resist composition as described in 14., wherein $X^-$ represents an anion of an alkylsulfonic acid, a benzenesulfonic acid, a naphthalenesulfonic acid or an anthracenesulfonic acid, each of which may have a substituent.

16. The positive resist composition as described in 14., wherein $X^-$ represents an anion of an alkylsulfonic acid, a benzenesulfonic acid, a naphthalenesulfonic acid or an anthracenesulfonic acid, each of which has at least one group selected from the group consisting of:

- at least one fluorine atom;
- a straight chain, branched, or cyclic alkyl group substituted with at least one fluorine atom;
- a straight chain, branched, or cyclic alkoxyl group substituted with at least one fluorine atom;
- an acyl group substituted with at least one fluorine atom;
- an acyloxy group substituted with at least one fluorine atom;
- a sulfonyl group substituted with at least one fluorine atom;
- a sulfonyloxy group substituted with at least one fluorine atom;
- a sulfonylamino group substituted with at least one fluorine atom;
- an aryl group substituted with at least one fluorine atom;
- an aralkyl group substituted with at least one fluorine atom; and
- an alkoxycarbonyl group substituted with at least one fluorine atom.

17. The positive resist composition as described in 13., which further comprises at least one of:

- (e) a resin: containing an acid-decomposable group; and being capable of increasing the solubility in an alkali developer by the action of an acid; and
- (f) a low molecular weight dissolution-inhibiting compound: having a molecular weight of 3,000 or less; containing an acid-decomposable group; and being capable of increasing the solubility in an alkali developer by the action of an acid.

18. The positive resist composition as described in 13., which further comprises (d) a surfactant containing at least one of a fluorine atom and a silicon atom.

19. The positive resist composition as described in 13., which further comprises a propylene glycolmonomethyl etheracetate as a solvent.

As a result of eager investigation by the present inventors for solving the above various problems of the electron beam resist, it has been found that these problems can be solved by a positive resist composition comprising (h) a cyclic ether compound and (c) an organic basic compound (the second embodiment), thus the present invention has been accomplished. Further, it has been found that the above positive resist composition is also effective as an X-ray resist composition.

The present invention (the second embodiment) is characterized in that it is not necessary to contain an alkali-reactive group but a cyclic ether compound is contained instead of that. The technique of the present invention (the second embodiment) aims at the irradiation with an electron beam or an X-ray itself, and the above particular problems of the electron beam resist can be solved by the use of a cyclic ether compound astonishingly. This fact has not been known at all until now.

DETAILED DESCRIPTION OF THE INVENTION

[I] (a) A Compound Capable of Directly or Indirectly Generating a Radical (A) on Irradiation with an Energy Ray (Hereinafter Also Referred to as "Component (a)" or "Compound (a)")

The energy ray means a visible ray, an ultraviolet ray, an electron beam and an X-ray.

A compound that directly generates a radical means the compound that generates a radical by the reaction caused by irradiation with an electron beam or an X-ray, in which only one molecule is concerned. A compound that indirectly generates a radical means the compound that generates a radical by the reaction in which two or more molecules are concerned, such as with other molecule of the compound or the molecules of other compounds.

Any compound which satisfies the above conditions can be used as compound (a) in the present invention but compound (a) is preferably at least one compound selected from the following group.

(1) an alkyl halide other than an alkyl fluoride,
   an aryl halide other than an aryl fluorine,
   an aralkyl halide other than an aralkyl fluorine, and
   an allyl halide other than an allyl fluorine, in which a part or all of the hydrogens in the alkyl halide, the aryl halide, the aralkyl halide and the allyl halide may be substituted with a fluorine,ps (2) a thiol compound, a secondary alcohol, a substituted or unsubstituted allyl alcohol, a benzyl alcohol which may be a substituent on the aromatic ring, ester and ether compounds of them, a sulfide compound, and a disulfide compound, (3) a halogen silane-containing compound, and an alkoxy silane compound, (4) a straight chain, branched or cyclic acetal compound, and (5) an N-hydroxyl compound.

The above compounds (1) to (5) are described below in sequence.

Compound Belonging to Group (1)

As the halogen atom in each of the alkyl halide, the aryl halide, the aralkyl halide and the allyl halide, at least one of bromine atom, iodine atom and chlorine atom is preferable.

Of the compounds belonging to group (1), a part or all of the hydrogens in the alkyl halide, the aryl halide, the aralkyl halide and the allyl halide may be substituted with fluorine atom, and the alkyl and the aralkyl groups may be branched.

The specific examples of the compounds belonging to group (1) are shown below, but the present invention is not limited thereto.

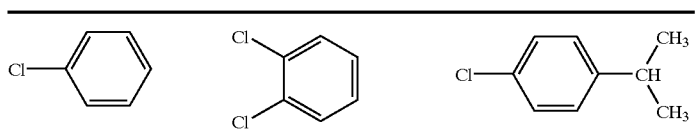

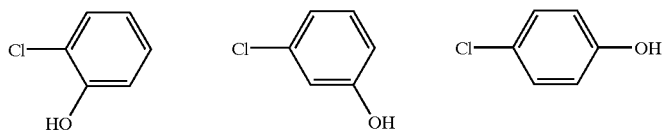

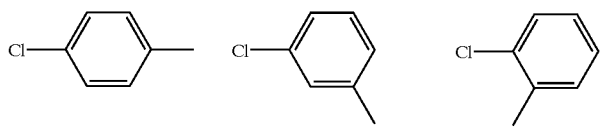

CHCl$_3$  CCl$_4$  CH$_2$Cl$_2$
CH$_3$Cl  C$_2$H$_5$Cl  C$_3$H$_7$Cl
C$_4$H$_9$Cl  C$_5$H$_{11}$Cl  C$_6$H$_{13}$Cl
C$_7$H$_{15}$Cl  C$_8$H$_{17}$Cl
ClCH$_2$COOH  ClCH$_2$COOCH$_3$  ClCH$_2$COOC$_2$H$_5$
ClCH$_2$COOC$_4$H$_9$  Cl$_2$CHCOOH  Cl$_2$CHCOOCH$_3$
ClCH$_2$CH$_2$Cl  Cl$_3$CCH$_3$  Cl$_2$CHCOOC$_2$H$_5$
Cl$_2$CH$_2$COOC$_4$H$_9$  Cl$_3$CCOOH  Cl$_3$CCOOCH$_3$
Cl$_3$CCOOC$_2$H$_5$  Cl$_3$CCOOC$_4$H$_9$
ClCH$_2$—CH=CH—CH$_2$Cl  ClCH$_2$—CH=CH$_2$
Cl—CH=CH—Cl  Cl—CH=CH$_2$

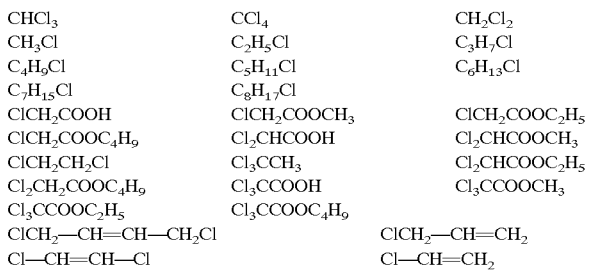

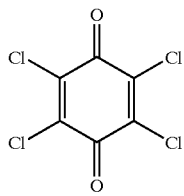

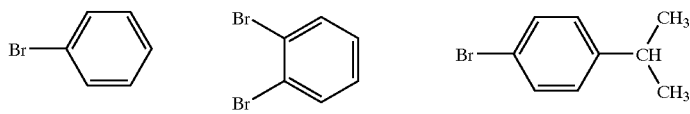

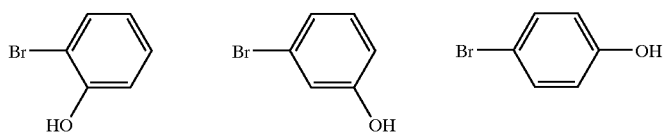

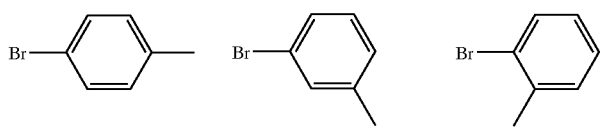

CHBr$_3$  CClBr$_3$  CBr$_4$
CH$_2$ClBr  CH$_3$Br  C$_2$H$_5$Br
C$_3$H$_7$Br  C$_4$H$_9$Br  C$_5$H$_{11}$Br
C$_6$H$_{13}$Br  C$_7$H$_{15}$Br  C$_8$H$_{17}$Br
BrCH$_2$COOH  BrCH$_2$COOCH$_3$  BrCH$_2$COOC$_2$H$_5$
BrCH$_2$COOC$_4$H$_9$  Br$_2$CHCOOH  Br$_2$CHCOOCH$_3$
BrCH$_2$CH$_2$Br  Br$_3$CCH$_3$  Br$_2$CHCOOC$_2$H$_5$
Br$_2$CH$_2$COOC$_4$H$_9$  Br$_3$CCOOH  Br$_3$CCOOCH$_3$
Br$_3$CCOOC$_2$H$_5$  Br$_3$CCOOC$_4$H$_9$
BrCH$_2$—CH=CH—CH$_2$Br  BrCH$_2$—CH=CH$_2$
Br—CH=CH—Br  Br—CH=CH$_2$

-continued

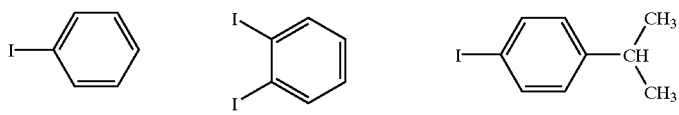

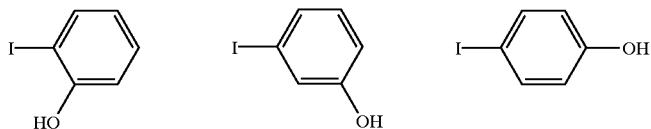

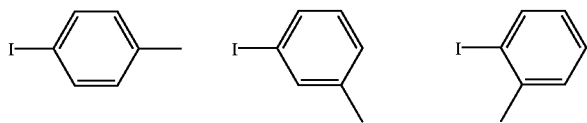

CHI₃        CCl₃        CI₄
CH₂ClI      CH₃I        C₂H₅I
C₃H₇I       C₄H₉I       C₅H₁₁I
C₆H₁₃I      C₇H₁₅I      C₈H₁₇I
ICH₂COOH    ICH₂COOCH₃  ICH₂COOC₂H₅
ICH₂COOC₄H₉ I₂CHCOOH    I₂CHCOOCH₃
ICH₂CH₂I    I₃CCH₃      I₂CHCOOC₂H₅
I₂CH₂COOC₄H₉ I₃CCOOH    I₃CCOOCH₃
I₃CCOOC₂H₅  I₃CCOOC₄H₉
ICH₂—CH=CH—CH₂I         ICH₂—CH=CH₂
I—CH=CH—I               I—CH=CH₂

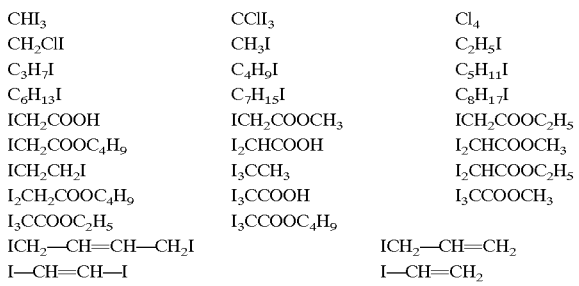

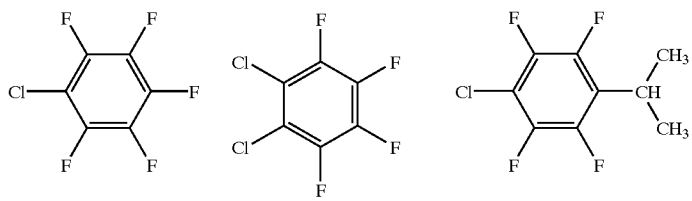

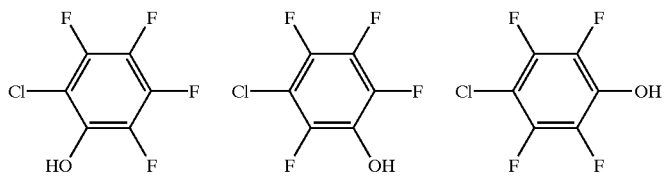

CFCl₃                   CF₂Cl₂
CF₃Cl       C₂F₅Cl      C₃F₇Cl
C₄F₉Cl      C₅F₁₁Cl     C₆F₁₃Cl
C₇F₁₅Cl     C₈F₁₇Cl
ClCF₂COOH   ClCF₂COOCF₃ ClCF₂COOC₂F₅
ClCF₂COOC₄F₉ Cl₂CFCOOH  Cl₂CFCOOCF₃
ClCF₂CF₂Cl  Cl₃CCF₃     Cl₂CFCOOC₂F₅
Cl₂CF₂COOC₄F₉ Cl₃CCOOH  Cl₃CCOOCF₃
Cl₃CCOOC₂F₅ Cl₃CCOOC₄F₉
ClCF₂—CF=CF—CF₂Cl       ClCF₂—CF=CF₂
Cl—CF=CF—Cl             Cl—CF=CF₂

-continued

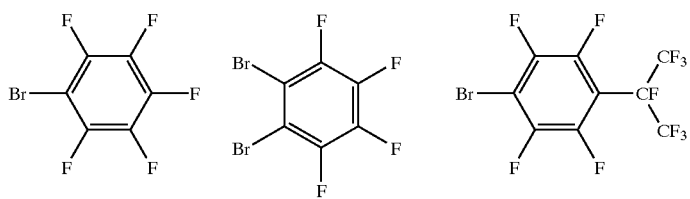

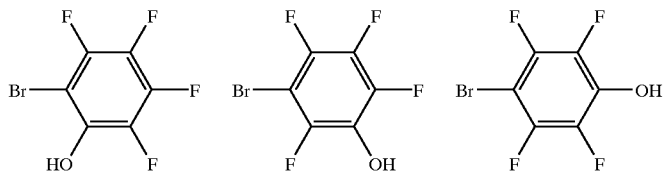

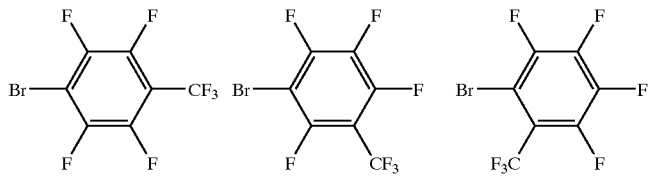

CFBr$_3$
CF$_2$ClBr
C$_3$F$_7$Br
C$_6$F$_{13}$Br
BrCF$_2$COOH
BrCF$_2$COOC$_4$F$_9$
BrCF$_2$CF$_2$Br
Br$_2$CF$_2$COOC$_4$F$_9$
Br$_3$CCOOC$_2$F$_5$
BrCF$_2$—CF=CF—CF$_2$Br
Br—CF=CF—Br

CF$_3$Br
C$_4$F$_9$Br
C$_7$F$_{15}$Br
BrCF$_2$COOCF$_3$
Br$_2$CFCOOH
Br$_3$CCF$_3$
Br$_3$CCOOH
Br$_3$CCOOC$_4$F$_9$

BrCF$_2$—CF=CF$_2$
Br—CF=CF$_2$

C$_2$F$_5$Br
C$_5$F$_{11}$Br
C$_8$F$_{17}$Br
BrCF$_2$COOC$_2$F$_5$
Br$_2$CFCOOCF$_3$
Br$_2$CFCOOC$_2$F$_5$
Br$_3$CCOOCF$_3$

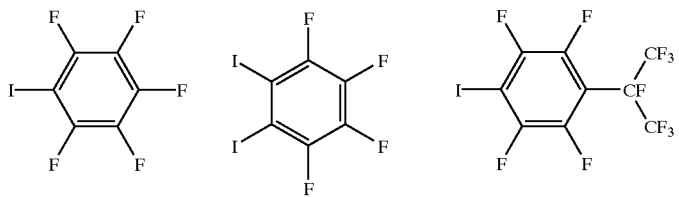

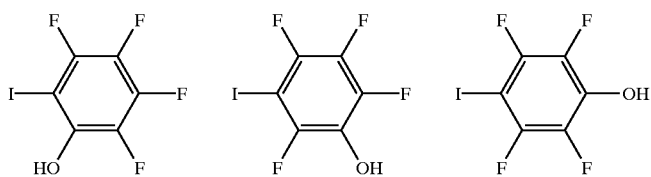

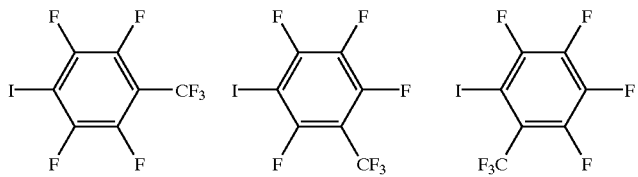

CFI$_3$
CF$_2$ClI
C$_3$F$_7$I
C$_6$F$_{13}$I
ICF$_2$COOH
ICF$_2$COOC$_4$F$_9$

CF$_3$I
C$_4$F$_9$I
C$_7$F$_{15}$I
ICF$_2$COOCF$_3$
I$_2$CFCOOH

C$_2$F$_5$I
C$_5$F$_{11}$I
C$_8$F$_{17}$I
ICF$_2$COOC$_2$F$_5$
I$_2$CFCOOCF$_3$

-continued
| | | |
|---|---|---|
| ICF$_2$CF$_2$I | I$_3$CCF$_3$ | I$_2$CFCOOC$_2$F$_5$ |
| I$_2$CF$_2$COOC$_4$F$_9$ | I$_3$CCOOH | I$_3$CCOOCF$_3$ |
| I$_3$CCOOC$_2$F$_5$ | I$_3$CCOOC$_4$H$_9$ | |
| ICF$_2$—CF=CF—CF$_2$I | | ICF$_2$—CF=CF$_2$ |
| I—CF=CF—I | | I—CF=CF$_2$ |
Compound Belonging to Group (2)
The specific examples of the compounds belonging to group (2) are shown below, but the present invention is not limited thereto.
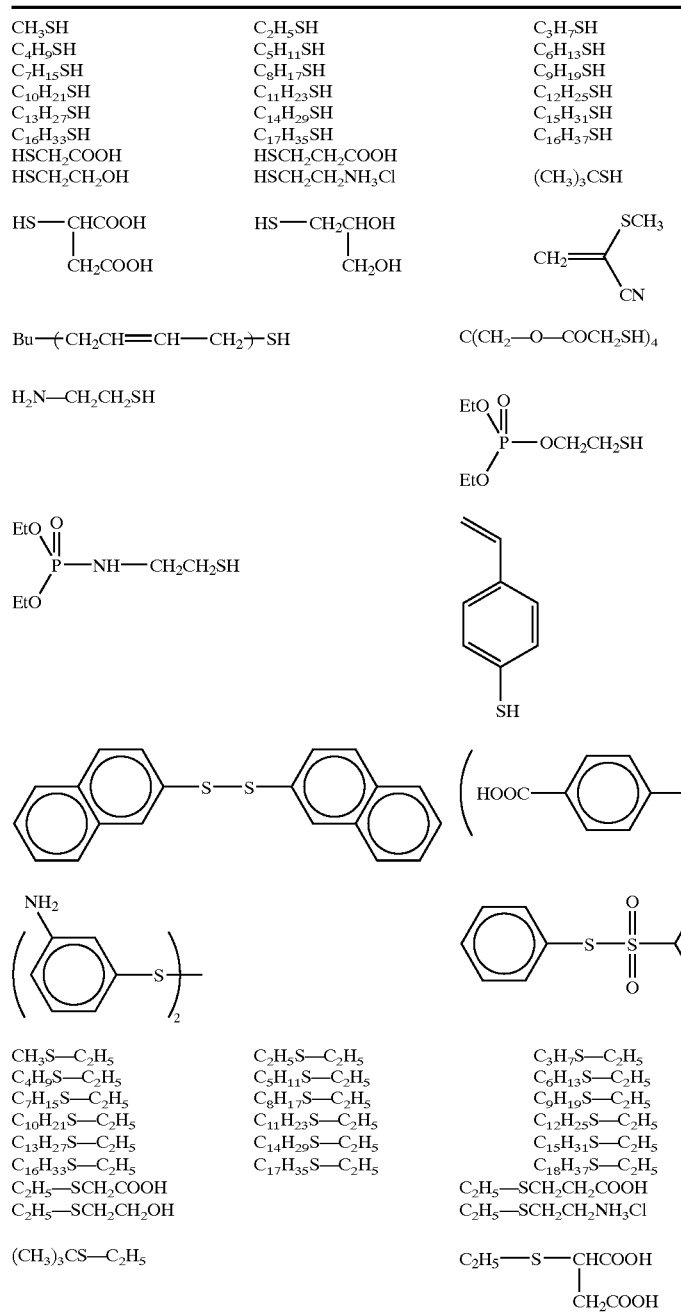

-continued
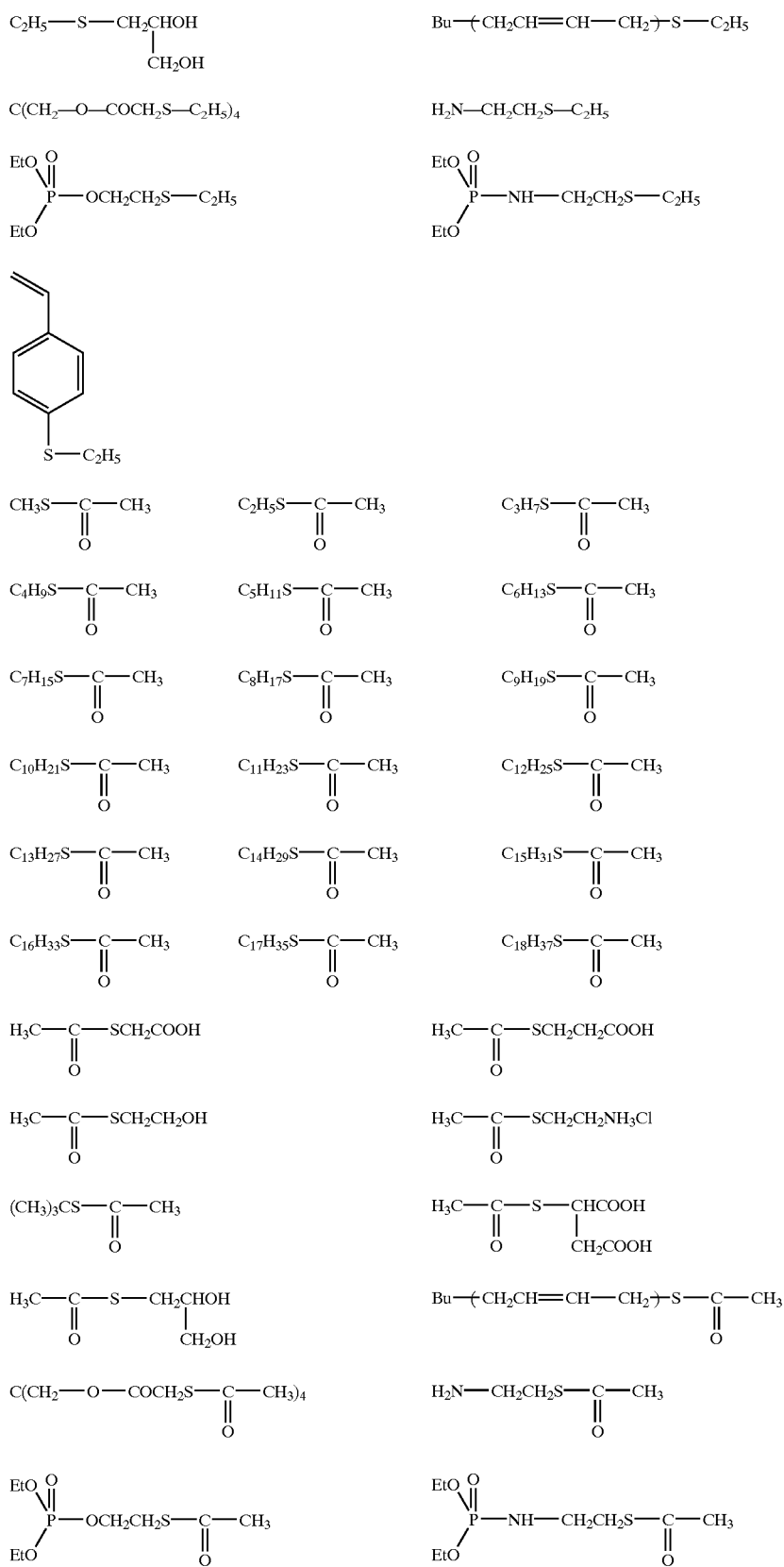

-continued
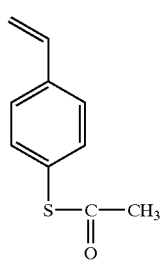
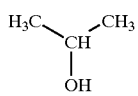 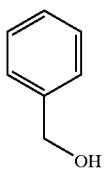 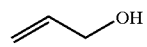
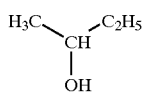 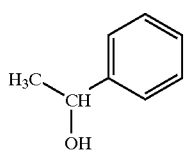
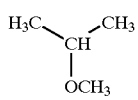 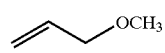
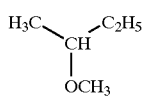 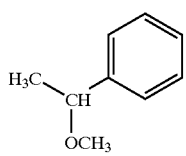
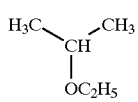 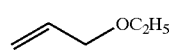
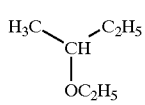 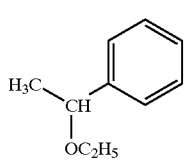
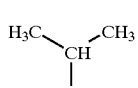 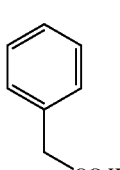 

-continued
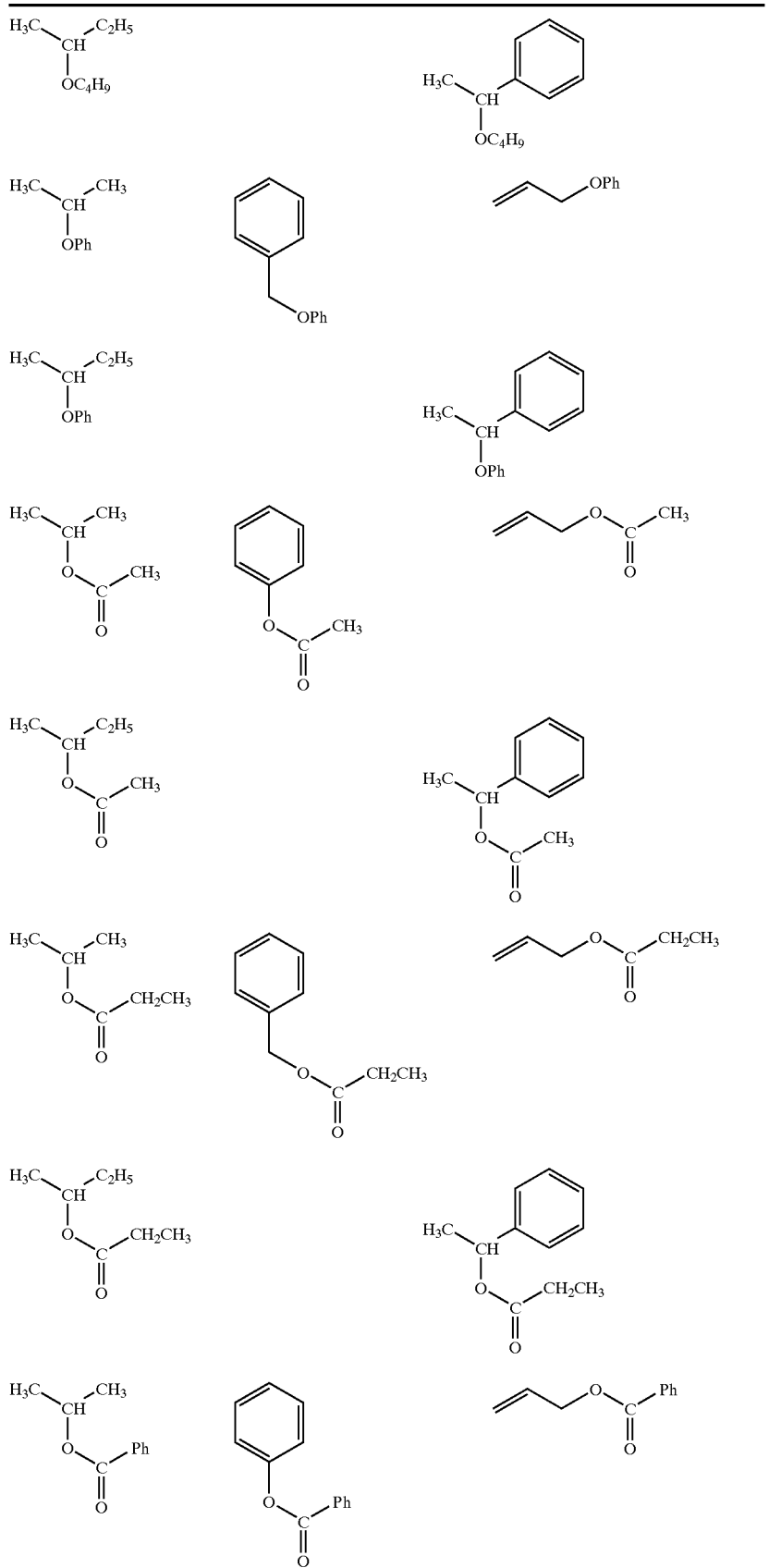

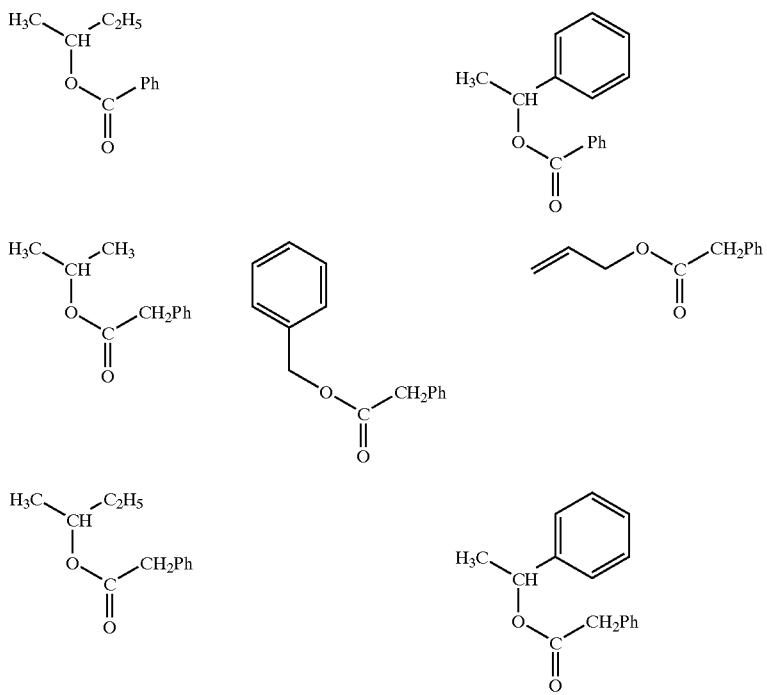

Compound Belonging to Group (3)

The specific examples of the compounds belonging to group (3) are shown below, but the present invention is not limited thereto.

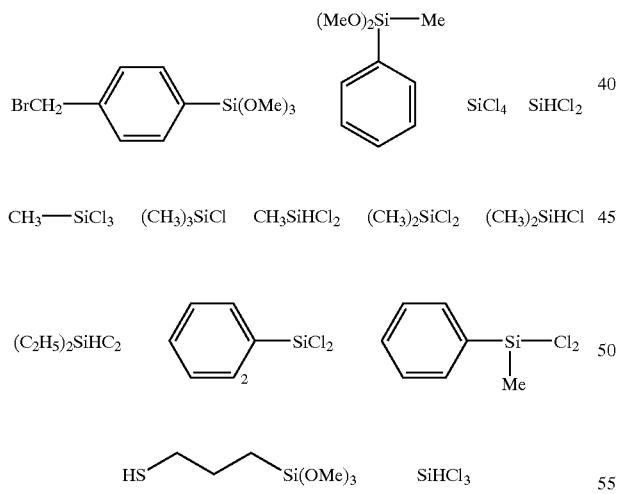

Compound Belonging to Group (4)

As the compounds belonging to group (4), the compounds having the structure represented by the following formula (V) or (U) are preferably used:

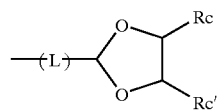

(V)

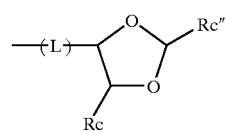

(U)

wherein $R_c$, $R_{c'}$ and $R_{c''}$, which may be the same or different, each represents a hydrogen atom, or an alkyl or aryl group which may have a substituent, and two of them maybe bonded to form a saturated or olefinic unsaturated ring; and L represents a divalent linking group.

In formulae (V) and (V), when $R_c$, $R_{c'}$ and $R_{c''}$ represent an aryl group, the aryl group generally has from 4 to 20 carbon atoms, and may be substituted with an alkyl group, an aryl group, an alkoxyl group, an aryloxy group, an acyl group, an acyloxy group, an alkylmercapto group, an aminoacyl group, a carboalkoxy group, a nitro group, a sulfonyl group, a cyano group, or a halogen atom.

As the aryl group having from 4 to 20 carbon atoms, e.g., a phenyl group, a tolyl group, a xylyl group, a biphenyl group, a naphthyl group, an anthryl group and a phenanthryl group can be exemplified.

When $R_c$, $R_{c'}$ and $R_{c''}$ represent an alkyl group, the alkyl group is a saturated or unsaturated, straight chain, branched or alicyclic alkyl group having from 1 to 20 carbon atoms, and may be substituted with a halogen atom, a cyano group, an ester group, an oxy group, an alkoxyl group, an aryloxy group or an aryl group.

As the saturated or unsaturated, straight chain, branched or alicyclic alkyl group having from 1 to 20 carbon atoms, a methyl group, an ethyl group, a propyl group, an isopropyl group, a butyl group, an isobutyl group, a t-butyl group, a pentyl group, an isopentyl group, a neopentyl group, a hexyl group, an isohexyl group, an octyl group, an isooctyl group, a nonyl group, a decyl group, a undecyl group, a dodecyl group, a tridecyl group, a tetradecyl group, a vinyl group, a propenyl group, a butenyl group, a 2-butenyl group, a 3-butenyl group, an isobutenyl group, a pentenyl group, a 2-pentenyl group, a hexenyl group, a heptenyl group, an octenyl group, a cyclopropyl group, a cyclobutyl group, a cyclopentyl group, a cyclohexyl group, a cycloheptyl group, a cyclooctyl group, a cyclopentenyl group, and a cyclohexenyl group can be exemplified.

The saturated or olefinic unsaturated ring formed by any two of $R_c$, $R_{c'}$ and $R_{c''}$ by bonding, specifically a cycloalkane or cycloalkene ring, is generally a 3 to 8-membered ring, preferably a 5- or 6-membered ring.

As the divalent linking group represented by L, a single bond, an alkylene, cycloalkylene or arylene group which may have a substituent, —O—, —O—CO—$R_{a1}$, —CO—O—$R_{a2}$—, and —CO—N($R_{a3}$)—$R_{a4}$— are exemplified.

$R_{a1}$, $R_{a2}$ and $R_{a4}$, which may be the same or different, each represents a single bond, an alkylene, cycloalkylene or arylene group, each of which may have an ether structure, an ester structure, an amide structure, a urethane structure or a ureido structure, and may have a substituent.

$R_{a3}$ represents a hydrogen atom or an alkyl, cycloalkyl or aryl group which may have a substituent.

In formulae (V) and (U), $R_c$, $R_{c'}$ and $R_{c''}$ preferably represent a hydrogen atom, or an alkyl group having from 1 to 4 carbon atoms.

The specific examples of the compounds having the partial structure represented by formula (V) or (U) are shown below but the present invention is not limited thereto.

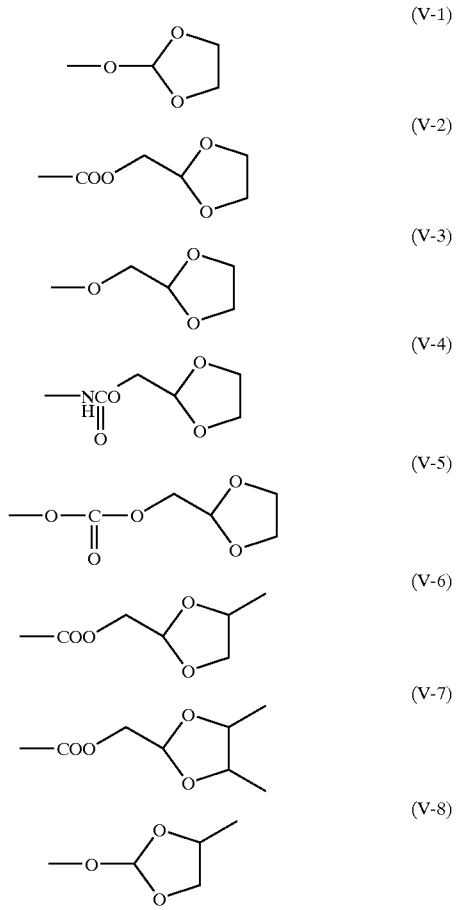

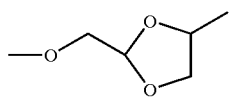

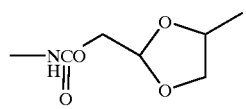

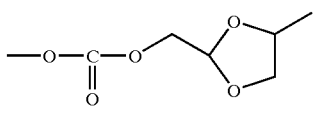

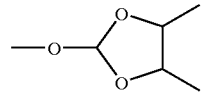

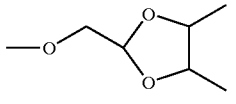

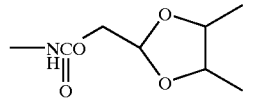

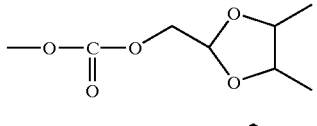

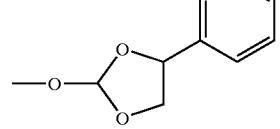

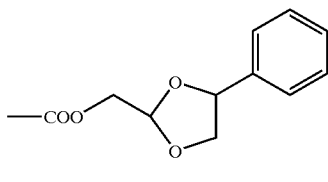

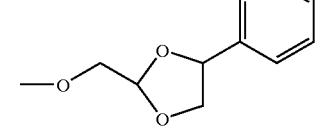

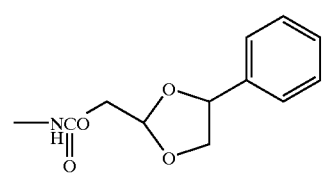

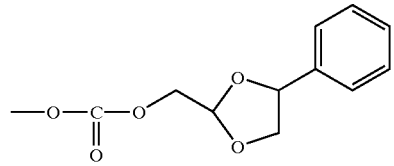

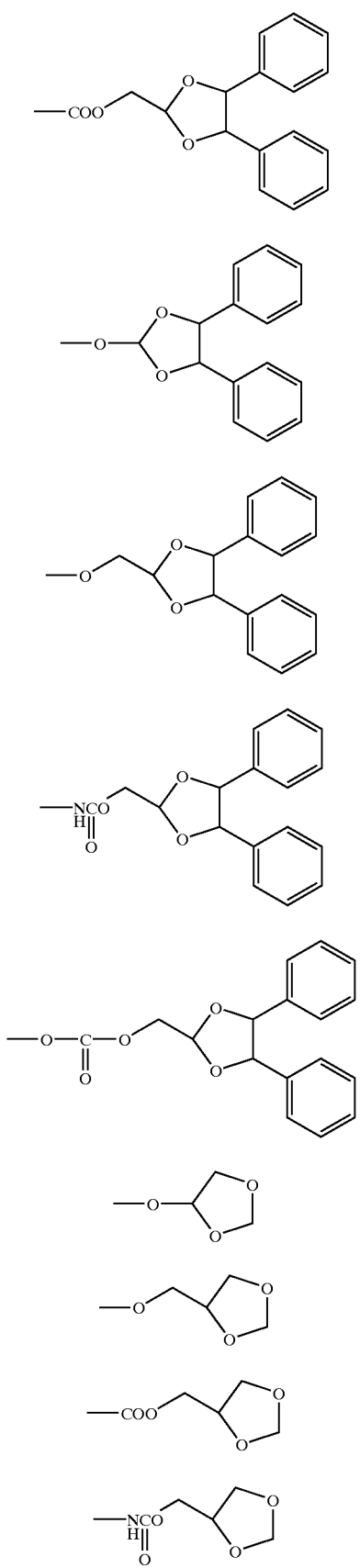

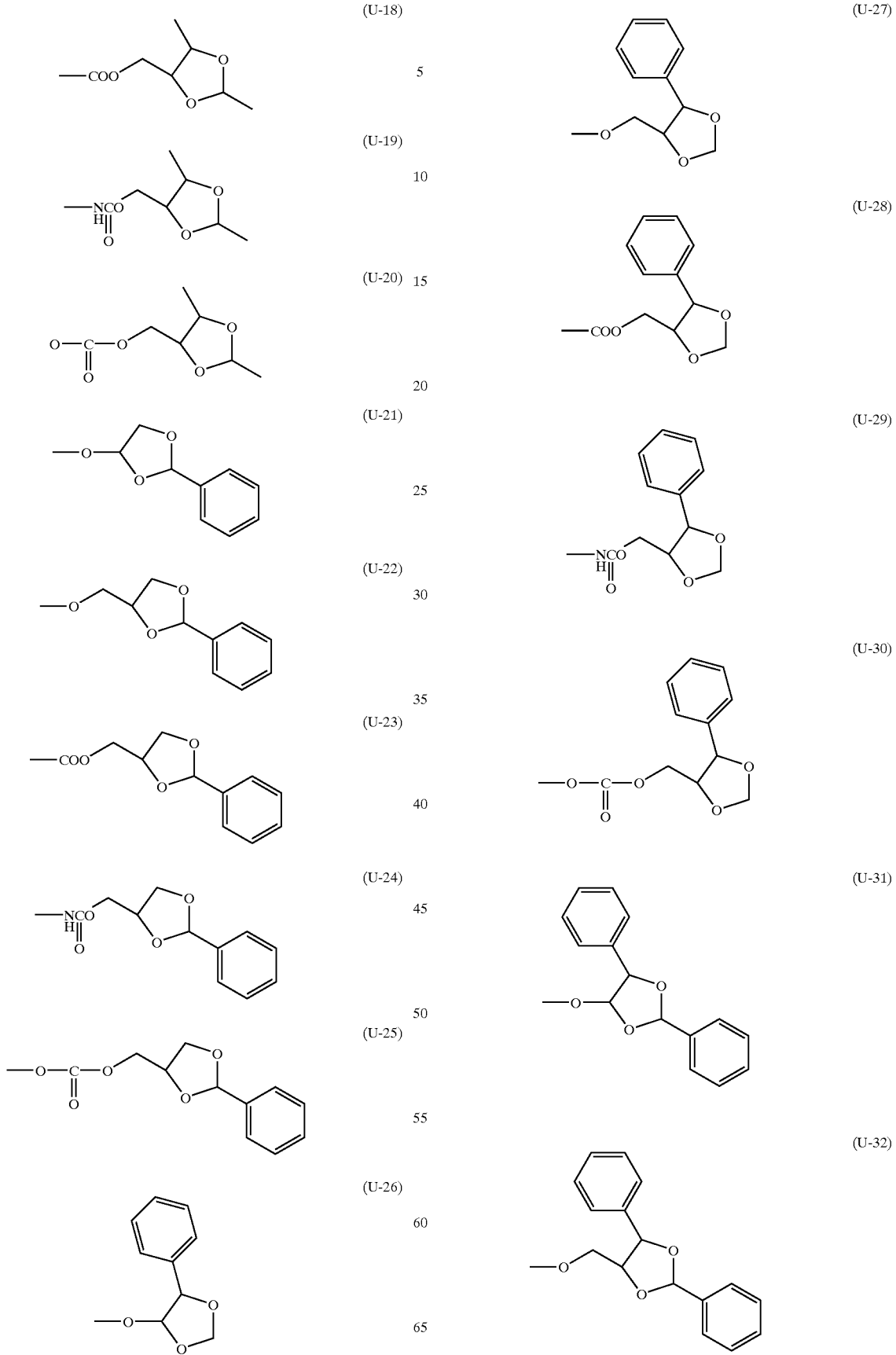

-continued

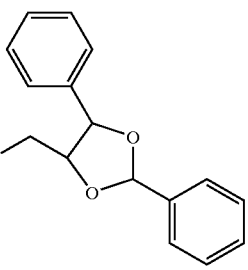
(U-33)

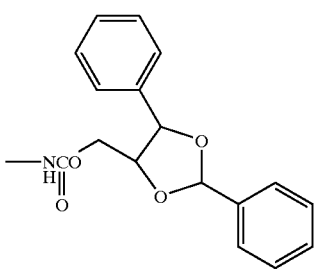
(U-34)

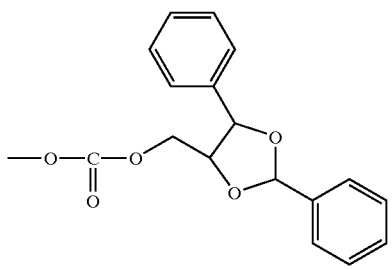
(U-35)

Compound Belonging to Group (5)

The specific examples of the compounds belonging to group (5) are shown below, but the present invention is not limited thereto.

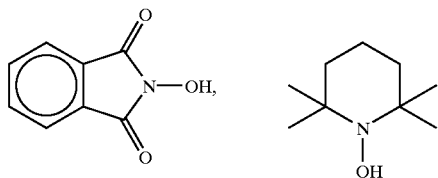

As compound (a), the compounds belonging to groups (1), (2) and (4) are preferred, and groups (1) and (4) are more preferred.

As compound (a), commercially available products can be arbitrarily used, and these compounds can be synthesized easily according to conventional methods.

Compound (a) has a molecular weight of 3,000 or less, preferably 2,500 or less, and more preferably 2,000 or less.

In the resist composition of the first embodiment of the present invention, the addition amount of compound (a) is preferably from 0.5 to 50 wt % of the total weight of the solid contents of the composition, more preferably from 3 to 30 wt %.

[II] (b) A Compound Capable of Generating an Acid on Irradiation with an Energy Ray (Hereinafter Also Referred to as "Component (b)"), and (b1) a Compound Capable of Generating an Acid on Irradiation with One of an Electron Beam and an X-Ray (Hereinafter Also Referred to as "Component (b1)")

The energy ray means a visible ray, an ultraviolet ray, an electron beam and an X-ray.

Any compound that generates an acid on irradiation with an energy ray can be used as component (b), but the compounds represented by the above formula (II) or (III) are preferably used.

Further, any compound that generates an acid on irradiation with one of an electron beam and an X-ray can be used as component (b1), but the compounds represented by the above formula (I), (II) or (III) are preferably used.

The compounds represented by formula (I), (II) or (III) are described in detail below.

In formulae (I), (II) and (III), as the straight chain or branched alkyl group represented by $R_1$ to $R_{38}$, an alkyl group having from 1 to 4 carbon atoms which may have a substituent (e.g., methyl, ethyl, propyl, n-butyl, sec-butyl and t-butyl) can be exemplified. As the cyclic alkyl group represented by $R_1$ to $R_{38}$, an alkyl group having from 3 to 8 carbon atoms which may have a substituent (e.g., cyclopropyl, cyclopentyl and cyclohexyl) can be exemplified.

As the straight chain or branched alkoxyl group represented by $R_1$ to $R_{37}$, an alkoxyl group having from 1 to 4 carbon atoms (e.g., methoxy, ethoxy, hydroxyethoxy, propoxy, n-butoxy, isobutoxy, sec-butoxy and t-butoxy) can be exemplified.

As the cyclic alkoxyl group represented by $R_1$ to $R_{37}$, a cyclopentyloxy group and a cyclohexyloxy group can be exemplified.

As the halogen atom represented by $R_1$ to $R_{37}$, fluorine, chlorine, bromine and iodine atoms can be exemplified.

As the aryl group represented by $R_{38}$, an aryl group having from 6 to 14 carbon atoms which may have a substituent (e.g., phenyl, tolyl, methoxy phenyl and naphthyl) can be exemplified.

The examples of the substituents include preferably an alkoxyl group having from 1 to 4 carbon atoms, a halogen atom (e.g., fluorine, chlorine and iodine), an aryl group having from 6 to 10 carbon atoms, an alkenyl group having from 2 to 6 carbon atoms, a cyano group, a hydroxyl group, a carboxyl group, an alkoxycarbonyl group and a nitro group.

The examples of the rings formed by bonding two or more of $R_1$ to $R_{15}$, $R_{16}$ to $R_{27}$, and $R_{28}$ to $R_{37}$ containing one or two or more selected from a single bond, carbon, oxygen, sulfur and nitrogen include a furan ring, a dihydrofuran ring, a pyran ring, a trihydropyran ring, a thiophene ring, and a pyrrole ring.

In formulae (I), (II) and (III), $X^-$ represents an anion of a sulfonic acid, preferably an anion of an alkylsulfonic acid, a benzenesulfonic acid, a naphthalenesulfonic acid or an anthracenesulfonic acid which may have a substituent. The substituent is preferably at least one kind selected from the following:

at least one fluorine atom, a straight chain, branched or cyclic alkyl group substituted with at least one fluorine atom, a straight chain, branched or cyclic alkoxyl group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom,
an aralkyl group substituted with at least one fluorine atom, and
an alkoxycarbonyl group substituted with at least one fluorine atom.

The above straight chain, branched or cyclic alkyl group is preferably an alkyl group having from 1 to 12 carbon atoms and substituted with from 1 to 25 fluorine atoms. The specific examples include a trifluoromethyl group, a pentafluoroethyl group, a 2,2,2-trifluoroethyl group, a heptafluoropropyl group, a heptafluoroisopropyl group, a perfluorobutyl group, a perfluorooctyl group, a perfluorododecyl group, and a perfluorocyclohexyl group. A perfluoroalkyl group having from 1 to 4 carbon atoms in which all the substituents are fluorine atoms is preferred above all.

The above straight chain, branched or cyclic alkoxyl group is preferably an alkoxyl group having from 1 to 12 carbon atoms and substituted with from 1 to 25 fluorine atoms. The specific examples include a trifluoromethoxy group, a pentafluoroethoxy group, a heptafluoroisopropyloxy group, a perfluorobutoxy group, a perfluorooctyloxy group, a perfluorododecyloxy group, and a perfluorocyclohexyloxy group. A perfluoroalkoxy group having from 1 to 4 carbon atoms in which all the substituents are fluorine atoms is preferred above all.

The above acyl group is preferably an acyl group having from 2 to 12 carbon atoms and substituted with from 1 to 23 fluorine atoms. The specific examples include a trifluoroacetyl group, a fluoroacetyl group, a pentafluoropropionyl group, and a pentafluorobenzoyl group.

The above acyloxy group is preferably an acyloxy group having from 2 to 12 carbon atoms and substituted with from 1 to 23 fluorine atoms. The specific examples include a trifluoroacetoxy group, a fluoroacetoxy group, a pentafluoropropionyloxy group, and a pentafluorobenzoyloxy group.

The above sulfonyl group is preferably a sulfonyl group having from 1 to 12 carbon atoms and substituted with from 1 to 25 fluorine atoms. The specific examples include a trifluoromethanesulfonyl group, a pentafluoroethanesulfonyl group, a perfluorobutanesulfonyl group, a perfluorooctanesulfonyl group, a pentafluorobenzenesulfonyl group, and a 4-trifluoromethylbenzenesulfonyl group.

The above sulfonyloxy group is preferably a sulfonyloxy group having from 1 to 12 carbon atoms and substituted with from 1 to 25 fluorine atoms. The specific examples include a trifluoromethanesulfonyloxy group, a perfluorobutanesulfonyloxy group, and a 4-trifluoromethylbenzenesulfonyloxy group.

The above sulfonylamino group is preferably a sulfonylamino group having from 1 to 12 carbon atoms and substituted with from 1 to 25 fluorine atoms. The specific examples include a trifluoromethanesulfonylamino group, a perfluorobutanesulfonylamino group, a perfluorooctanesulfonylamino group, and a pentafluorobenzenesulfonylamino group.

The above aryl group is preferably an aryl group having from 6 to 14 carbon atoms and substituted with from 1 to 9 fluorine atoms. The specific examples include a pentafluorophenyl group, a 4-trifluoromethylphenyl group, a heptafluoronaphthyl group, a nonafluoroanthranyl group, a 4-fluorophenyl group, and a 2,4-difluorophenyl group.

The above aralkyl group is preferably an aralkyl group having from 7 to 10 carbon atoms and substituted with from 1 to 15 fluorine atoms. The specific examples include a pentafluorophenylmethyl group, a pentafluorophenylethyl group, a perfluorobenzyl group, and a perfluorophenethyl group.

The above alkoxycarbonyl group is preferably an alkoxycarbonyl group having from 2 to 13 carbon atoms and substituted with from 1 to 25 fluorine atoms. The specific examples include a trifluoromethoxycarbonyl group, a pentafluoroethoxycarbonyl group, a pentafluorophenoxycarbonyl group, a perfluorobutoxycarbonyl group, and a perfluorooctyloxycarbonyl group.

$X^-$ most preferably represents a fluorine-substituted benzenesulfonic acid anion, and a pentafluorobenzenesulfonic acid anion is preferred above all.

The above alkylsulfonic acid, benzenesulfonic acid, naphthalenesulfonic acid or anthracenesulfonic acid each containing a fluorine-containing substituent may further be substituted with a straight chain, branched or cyclic alkoxyl group, an acyl group, an acyloxy group, a sulfonyl group, a sulfonyloxy group, a sulfonylamino group, an aryl group, an aralkyl group, an alkoxycarbonyl group (the ranges of carbon atoms of these groups are the same as those described above), a halogen atom (exclusive of a fluorine atom), a hydroxyl group, or a nitro group.

The specific examples of the compounds represented by formula (I) are shown below.

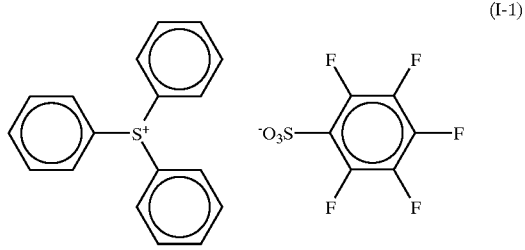

(I-1)

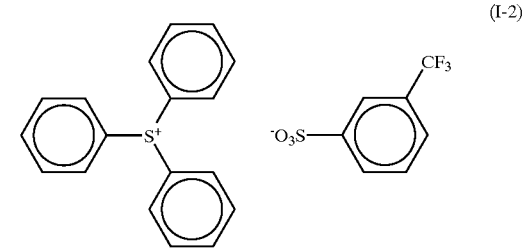

(I-2)

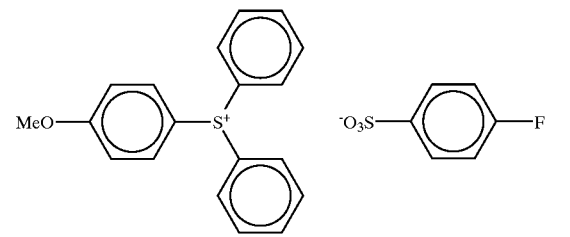

(I-3)

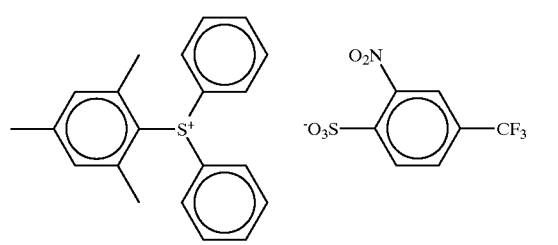

(I-4)

(I-5) 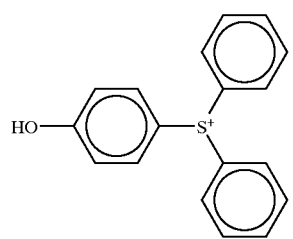 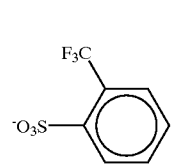
(I-6) 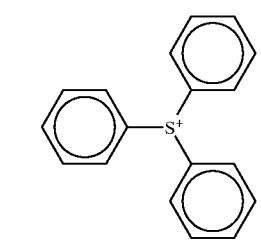 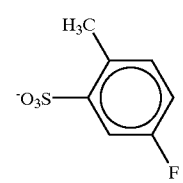
(I-7) 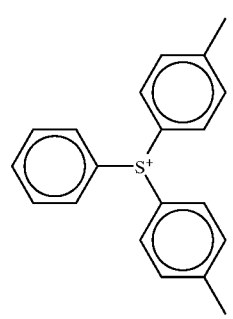 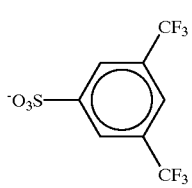
(I-8) 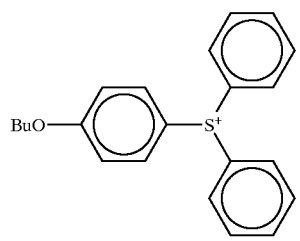 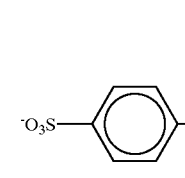
(I-9) 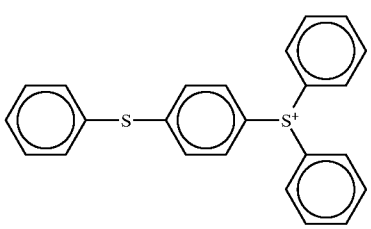 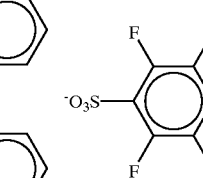
(I-10) 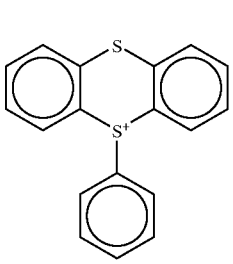 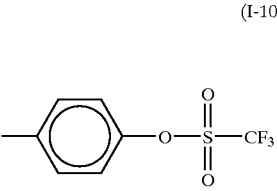
(I-11) 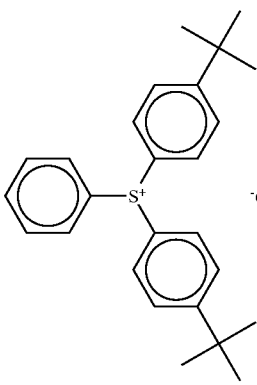
(I-12) 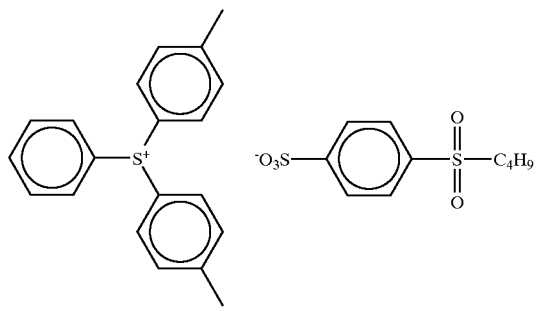
(I-13) 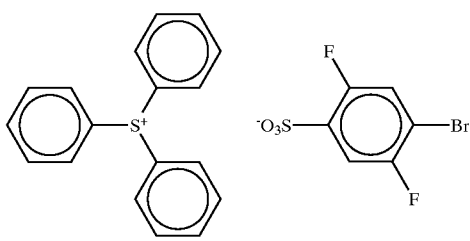
(I-14) 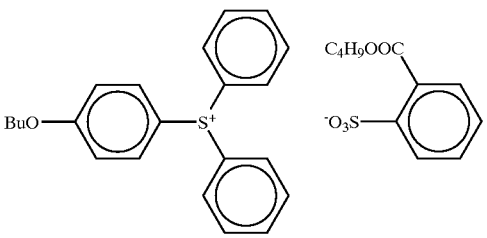
(I-15) 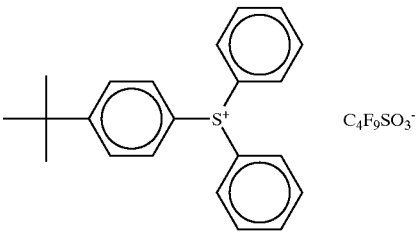

The specific examples of the compounds represented by formula (II) are shown below.
(II-1)
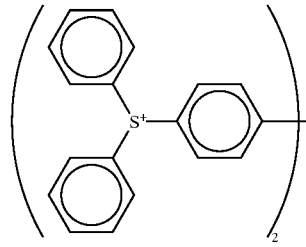 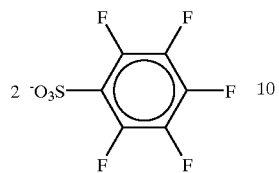
(II-2)
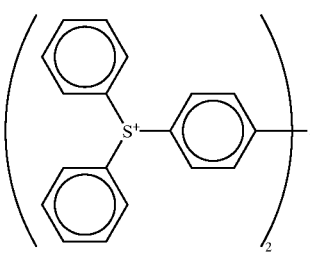 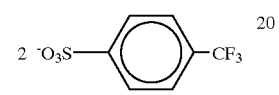
(II-3)
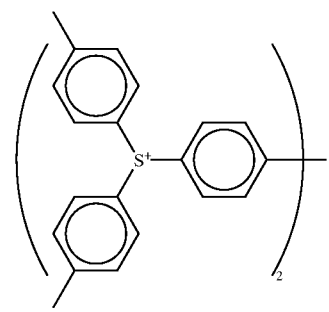 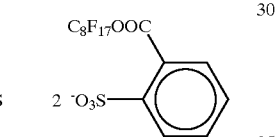
(II-4)
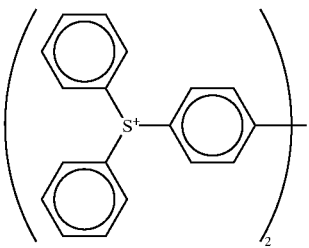 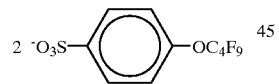
(II-5)
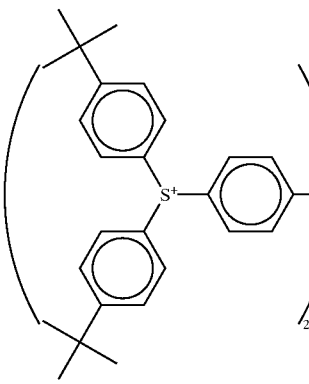 
(II-6)
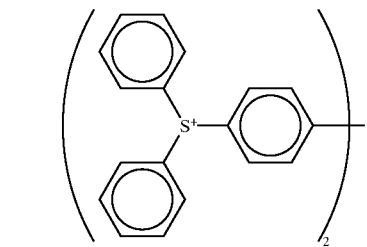
(II-7)
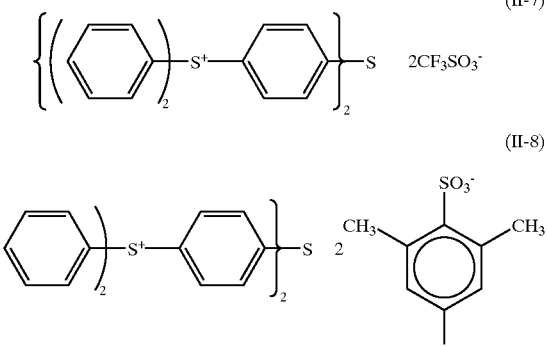
(II-8)
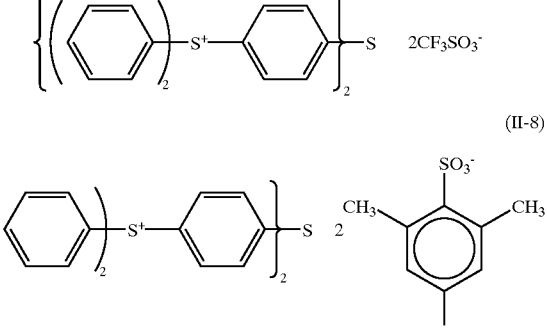
The specific examples of the compounds represented by formula (III) are shown below.
(III-1)
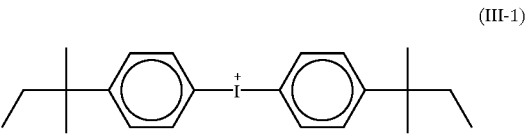
(III-2)
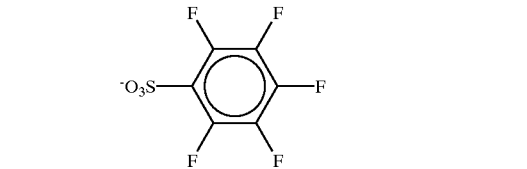
(III-3)
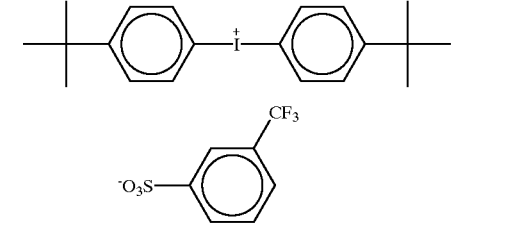
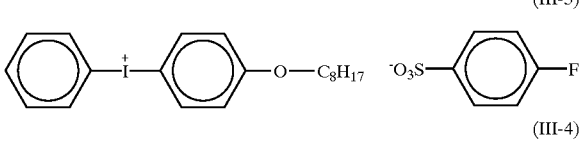
(III-4)
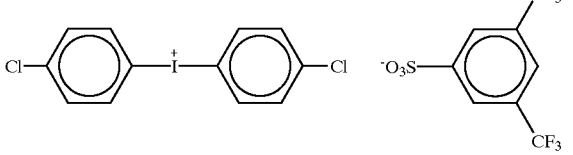

(III-5)
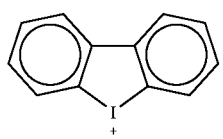
(III-6)
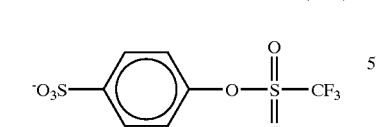
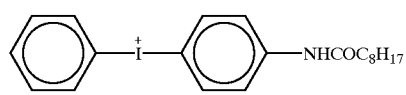
(III-7)
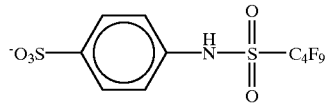
(III-8)
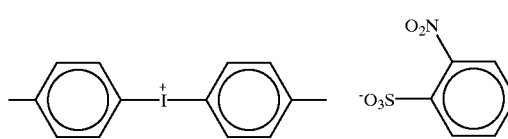
(III-9)
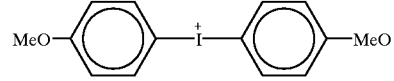
(III-10)
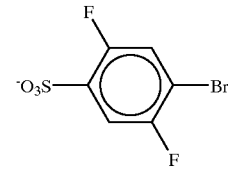 FSO$_3^-$
(III-11)
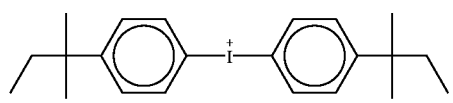 C$_4$F$_9$SO$_3^-$
(III-12)
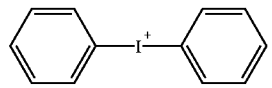 C$_8$F$_{17}$SO$_3^-$
(III-13)
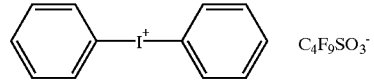 C$_{11}$F$_{23}$SO$_3^-$
(III-14)
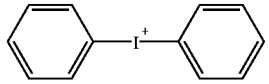 CF$_3$SO$_3^-$
(III-15)
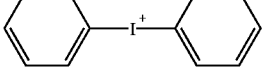 CF$_3$SO$_3^-$
(III-16)
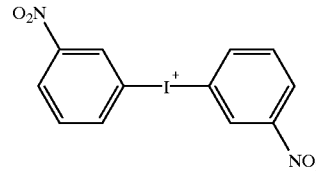 CF$_3$SO$_3^-$
(III-17)
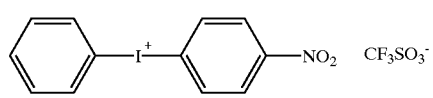 CF$_3$SO$_3^-$
(III-18)
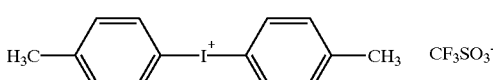 CF$_3$SO$_3^-$
(III-19)
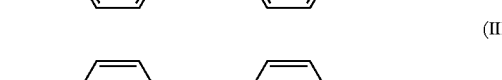 CF$_3$SO$_3^-$
(III-20)
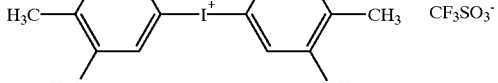 CF$_3$SO$_3^-$
(III-21)
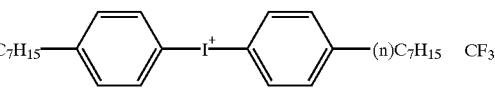 CF$_3$SO$_3^-$
(III-22)
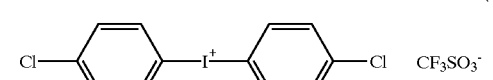 CF$_3$SO$_3^-$
(III-23)
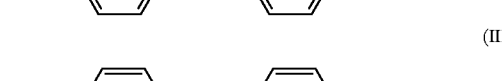 CF$_3$SO$_3^-$
(III-24)
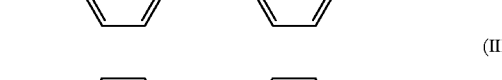 CF$_3$SO$_3^-$
(III-25)
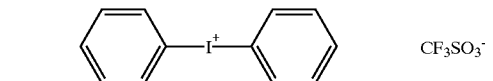 CF$_3$SO$_3^-$
(III-26)
 CF$_3$SO$_3^-$
(III-27)
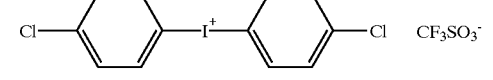 CF$_3$SO$_3^-$ -continued

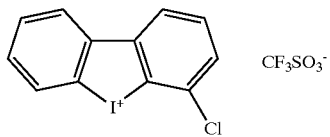
(III-28)

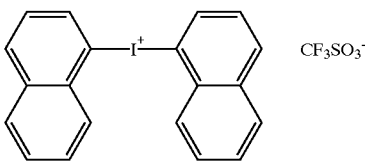
(III-29)

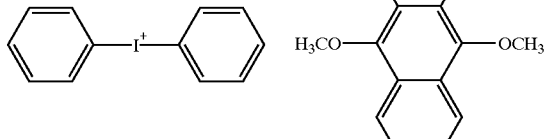
(III-30)

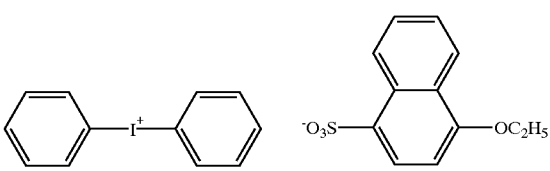
(III-31)

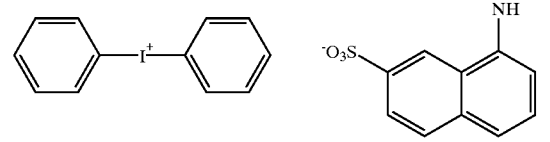
(III-32)

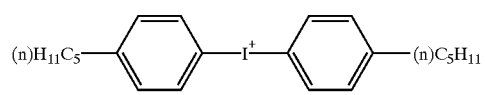
(III-33)

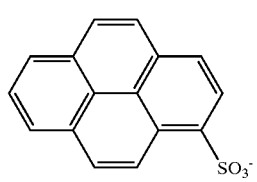

-continued

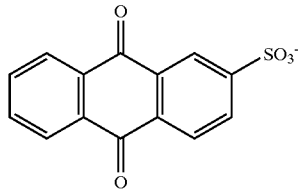
(III-34)

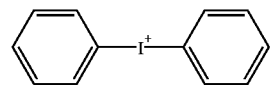

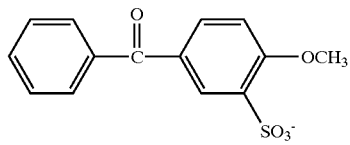
(III-35)

One or two or more of the compounds represented by formula (I), (II) or (III) may be used in combination.

The compounds represented by formulae (I) and (II) can be synthesized, for example, by a method of reacting an aryl Grignard reagent, e.g., aryl magnesium bromide, with a substituted or unsubstituted phenyl sulfoxide, and subjecting the obtained triarylsulfonium halide to salt exchanging with a corresponding sulfonic acid, a method of condensing and salt exchanging a substituted or unsubstituted phenyl sulfoxide with a corresponding aromatic compound using an acid catalyst, e.g., methanesulfonic acid/diphosphorus pentoxide or an aluminum chloride, or a method of condensing and salt exchanging a diaryliodonium salt and a diaryl sulfide using a catalyst, e.g., a copper acetate.

The compound represented by formula (III) can be synthesized by subjecting an aromatic compound to a reaction using a periodate.

The sulfonic acid or sulfonate for use in the salt exchange reaction can be obtained by a method of hydrolyzing a commercially available sulfonic acid chloride, a method of reacting an aromatic compound with a chlorosulfonic acid, or a method of reacting an aromatic compound with a sulfamic acid.

The methods for synthesizing the compounds represented by formulae (I), (II) and (III) are specifically described below.

Synthesis of Tetramethylammonium Pentafluorobenzenesulfonate

Under ice-cooling, 25 g of pentafluorobenzenesulfonyl and 66.8 g of concentrated sulfuric acid was gradually dropwise added to the mixture with ice-cooling. The mixture was stirred with ice-cooling for 2 hours and then at room temperature for 10 hours. With ice-cooling, 500 ml of water was added to the reaction solution, followed by extraction with dichloromethane. The organic phase was washed with sodium bicarbonate and water and then concentrated, thereby a di (4-t-amylphenyl) iodonium sulfate was obtained. The sulfate was added to a solution containing an excess amount of tetramethylammonium pentafluorobenzenesulfonate. Water (500 ml) was added to the solution, followed by extraction with dichloromethane. The organic phase was washed with a 5% aqueous solution of tetramethylammonium hydroxide and water, and then concentrated, thereby di (4-amylphenyl) iodonium pentafluorobenzenesulfonate was obtained.

Other compounds can also be synthesized according to similar methods.

Besides the compounds represented by formula (I), (II) or (III), compounds which are decomposed on irradiation with an electron beam or an x-ray and generate acid can also be used in the present invention as component (b) or component (b1).

Also in the present invention, other compounds which are decomposed on irradiation with an electron beam or an x-ray and generate acid can be used in combination with the compounds represented by formula (I), (II) or (III) as component (b) or chloride was dissolved in 100 ml of methanol and 100 g of a 25% tetramethylammonium hydroxide aqueous solution was gradually added thereto. After stirring the reaction mixture at room temperature for 3 hours, a solution of tetramethylammonium pentafluorobenzenesulfonate was obtained. This solution was used for the salt exchange with a sulfonium salt and an iodonium salt.

Synthesis of Triphenylsulfonium Pentafluorobenzenesulfonate Synthesis of Compound (I-1)

Diphenyl sulfoxide (50 g) was dissolved in 800 ml of benzene, 200 g of aluminum chloride was added thereto and the reaction solution was refluxed for 24 hours. The reaction solution was gradually poured into 2 liters of water, 400 ml of a concentrated hydrochloric acid was added thereto and the solution was heated at 70° C. for 10 minutes. The resulting aqueous solution was washed with 500 ml of ethyl acetate and filtered. Subsequently, 200 g of ammonium iodide dissolved in 400 ml of water was added to the filtrate.

The precipitated powder was filtered out, washed with water and then with ethyl acetate, and dried, thereby 70 g of triphenylsulfonium iodide was obtained.

The triphenylsulfonium iodide (30.5 g) was dissolved in 1,000 ml of methanol, 19.1 g of silver oxide was added to the resulting solution, followed by stirring at room temperature for 4 hours. The solution was filtered, and a solution containing an excess amount of the above-synthesized tetramethylammonium pentafluorobenzenesulfonate was added to the filtrate. The reaction solution was concentrated, dissolved in 500 ml of dichloromethane, and the resulting solution was washed with a 5% tetramethylammonium hydroxide aqueous solution and water. The organic phase was dried over anhydrous sodium sulfate and concentrated, thereby triphenylsulfonium pentafluorobenzenesulfonate was obtained.

Synthesis of Triarylsulfonium Pentafluorobenzenesulfonate Synthesis of Mixture of Compounds (I-9) and (II-1)

Triarylsulfonium chloride (50 g) (a 50% aqueous solution of triphenylsulfonium chloride, manufactured by Fluka Co.) was dissolved in 500 ml of water, and a solution containing an excess amount of tetramethylammonium pentafluorobenzenesulfonate was added to this solution, thereby an oily substance was precipitated. The supernatant was removed by decantation, and the obtained oily substance was washed with water and dried, thereby triarylsulfonium pentafluorobenzenesulfonate (containing exemplified Compounds (I-9) and (II-1) as main components) was obtained.

Synthesis of Di(4-t-amylphenyl)iodonium Pentafluorobenzenesulfonate Synthesis of Compound (III-1)

t-Amylbenzene (60 g), 39.5 g of potassium iodate, 81 g of acetic anhydride, and 170 ml of dichloromethane were mixed, component (b1). In the case of the resist composition in the first embodiment, the compound represented by formula (I) may be used in combination with the compound represented by formula (II) or (III).

The contents of the compound represented by formula (I), (II) or (III) and other acid generating agent which can be used in combination are generally from 100/0 to 20/80 in molar ratio of component (b) or (b1)/other acid generating agent, preferably from 100/0 to 40/60, and more preferably from 100/0 to 50/50.

The total content of component (b) or (b1) is in general from 0.1 to 20 wt % based on the solid contents of the entire composition of the positive resist composition (including the first and second embodiments) according to the present invention, preferably from 0.5 to 10 wt %, and more preferably from 1 to 7 wt %.

As such other acid-generating agents which can be used as component (b) or (b1) in the present invention, a photoinitiator for photocationic polymerization, a photoinitiator for photoradical polymerization, a photodecoloring agent for dyes, a photodiscoloring agent, well-known compounds used for a microresist or the like which generate an acid on irradiation with an electron beam and mixtures of these compounds can be arbitrarily selected.

For example, the following compounds can be used as other acid-generating agents in the present invention: diazonium salts described in S. I. Schlesinger, *Photogr. Sci. Eng.*, 18, 387 (1974), and T. S. Bal et al., *Polymer*, 21, 423 (1980); ammonium salts described in U.S. Pat. Nos. 4,069, 055, 4,069,056, Re 27,992, and Japanese Patent Application No. 3-140140; phosphonium salts described in D. C. Necker et al., *Macromolecules*, 17, 2468 (1984), C. S. Wen et al., *Teh, Proc. Conf. Rad. Curing ASIA*, p. 478, Tokyo, Oct. (1988), U.S. Pat. Nos. 4,069,055 and 4,069,056; iodonium salts described in J. V. Crivello et al., *Macromolecules*, 10 (6), 1307 (1977), *Chem. & Eng. News*, November 28, p. 31 (1988), EP No. 104143, U.S. Pat. Nos. 339,049, 410,201, JP-A-2-150848 (the term "JP-A" as used herein means an "unexamined published Japanese patent application"), and JP-A-2-296514; sulfonium salts described in J. V. Crivello et al., *Polymer, J.* 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1977), EP Nos. 370693, 3902114, 233567, 297443, 297442, U.S. Pat. Nos. 4,933,377, 161,811, 410,201, 339,049, 4,760,013, 4,734, 444, 2,833,827, German Patents 2,904,626, 3,604,580 and 3,604,581; selenonium salts described in J. V. Crivello et al., *Macromolecules*, 10 (6), 1307 (1977), and J. V. Crivello et al., *J. Polymer Sci.*, Polymer Chem. Ed., 17, 1047 (1979); onium salts, such as arsonium salts, etc., described in C. S. Wen et al., *Teh, Proc. Conf. Rad. Curing ASIA*, p. 478, Tokyo, Oct. (1988); organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metals/organic halogen compounds described in K. Meier et al., *J. Rad. Curing*, 13 (4), 26 (1986), T. P. Gill et al., *Inorg. Chem.*, 19, 3007 (1980), D. Astruc, *Acc. Chem.Res.*, 19(12), 377 (1896), and JP-A-2-161445; acid generating agents having an o-nitrobenzyl type protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), F. M. Houlihan et al., *Macromolecules*, 21, 2001 (1988), EP Nos. 0290750, 046083, 156535, 271851, 0388343, U.S. Pat. Nos. 3,901,710, 4,181,531, JP-A-60-198538, and JP-A-53-133022; compounds which generate a sulfonic acid by photodecomposition represented by iminosulfonate described in N. Tunooka et al., *Polymer Preprints, Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), EP Nos. 0199672, 84515, 199672, 044115, 0101122, U.S. Pat. Nos. 618,564, 4,371,605, 4,431,774, JP-A-64-18143, JP-A-2-245756, and Japanese Patent Application No. 3-140109; and disulfone compounds described in JP-A-61-166544.

Further, compounds having introduced these groups or compounds generating an acid on irradiation with an electron beam or an X-ray into the main chain or side chain of the polymer can be used in the present invention, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Further, the compounds which generate an acid as described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and EP No. 126712 can also be used in the present invention.

Of the above compounds which are decomposed on irradiation with an electron beam or an X-ray and generate an acid, those particularly effectively used in the present invention are described below.

(1) An oxazole derivative represented by the following formula (PAG1) and an S-triazine derivative represented by the following formula (PAG2), which are substituted with a trihalomethyl group

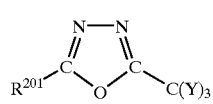
(PAG1)

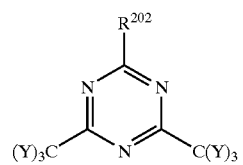
(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group, or —C(Y)$_3$; and Y represents a chlorine atom or a bromine atom.

The specific examples thereof include the following compounds but the present invention is not limited thereto.

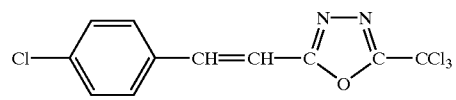
(PAG1-1)

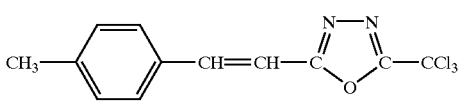
(PAG1-2)

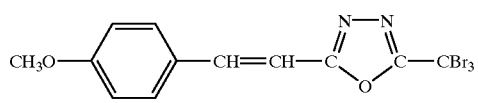
(PAG1-3)

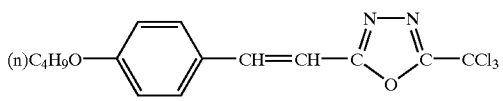
(PAG1-4)

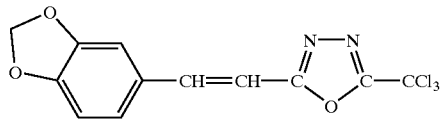
(PAG1-5)

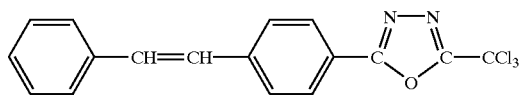
(PAG1-6)

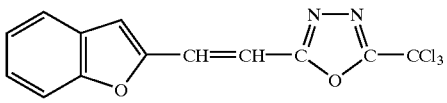
(PAG1-7)

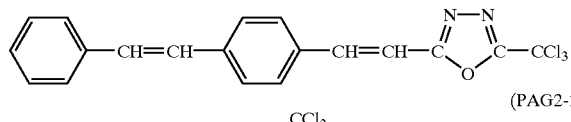
(PAG1-8)

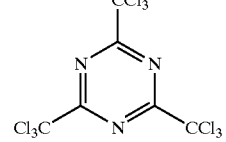
(PAG2-1)

(PAG2-2)
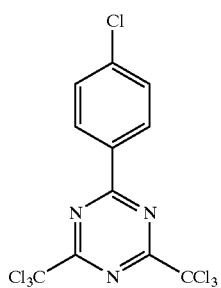
(PAG2-3)
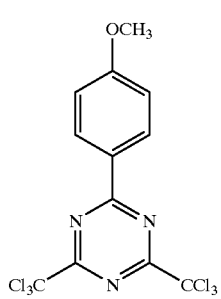
(PAG2-4)
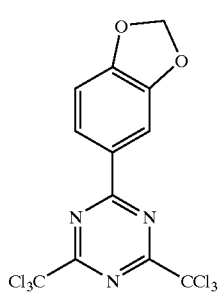
(PAG2-5)
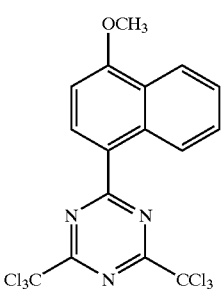
(PAG2-6)
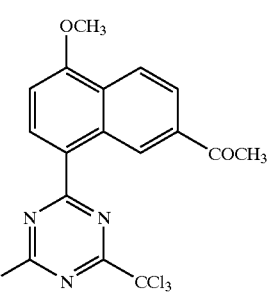
(PAG2-7)
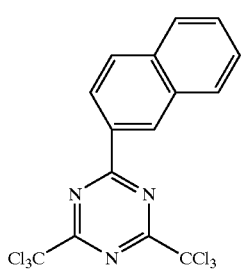
(PAG2-8)
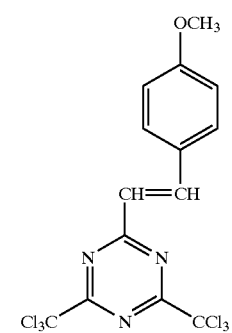
(PAG2-9)
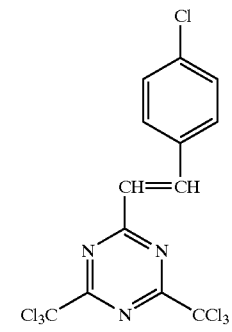
(PAG2-10)
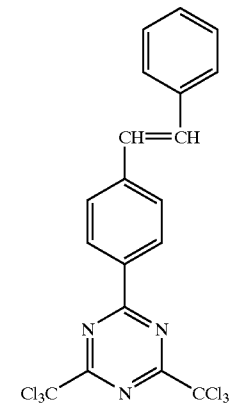
(2) An iodonium salt represented by the following formula (PAG3) or a sulfonium salt represented by the following formula (PAG4)
(PAG3)

(PAG4)

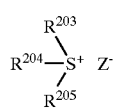

In formula (PAG3) Ar$^1$ and Ar$^2$ each represents a substituted or unsubstituted aryl group. The examples of the preferred substituents include an alkyl group, a haloalkyl group, a cycloalkyl group, an aryl group, an alkoxyl group, a nitro group, a carboxyl group, an alkoxycarbonyl group, a hydroxyl group, a mercapto group and a halogen atom.

In formula (PAG4), R$^{203}$, R$^{204}$ and R$^{205}$ each represents a substituted or unsubstituted alkyl group or a substituted or unsubstituted aryl group, and preferably an aryl group having from 6 to 14 carbon atoms, an alkyl group having from 1 to 8 carbon atoms, or s substituted derivative thereof. The substituent of the aryl group is preferably an alkoxyl group having from 1 to 8 carbon atoms, an alkyl group having from 1 to 8 carbon atoms, a nitro group, a carboxyl group, a hydroxyl group or a halogen atom, and the substituent of the alkyl group is preferably an alkoxyl group having from 1 to 8 carbon atoms, a carboxyl group, or an alkoxycarbonyl group.

In formulae (PAG3) and (PAG4), Z$^-$ represents a counter anion, and the examples thereof include, e.g., BF$_4^-$, an alkanesulfonate anion, a benzenesulfonate anion, a condensed polynuclear aromatic sulfonate anion such as a naphthalene-1-sulfonate anion, an anthraquinone sulfonate anion, and a sulfonic acid-containing dye, however, the present invention is not limited thereto.

Further, two of R$^{203}$, R$^{204}$ and R$^{205}$, and Ar$^1$ and Ar$^2$ may be bonded through respective single bonds or substituents.

The specific examples thereof include the following compounds but the present invention is not limited thereto.

(PAG3-1)

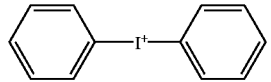 BF$_4^-$ (PAG3-2)

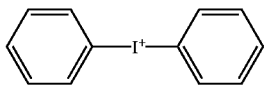 C$_{12}$H$_{25}$SO$_3^-$ (PAG3-3)

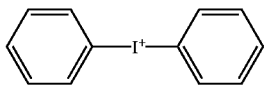

(PAG3-4)

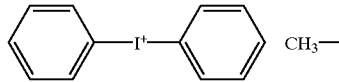

(PAG3-5)

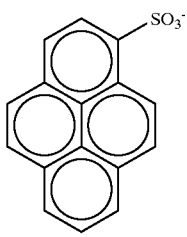

(PAG3-6)

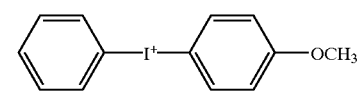 OCH$_3$ C$_{12}$H$_{25}$SO$_3^-$ (PAG3-7)

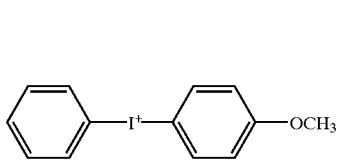

(PAG3-8)

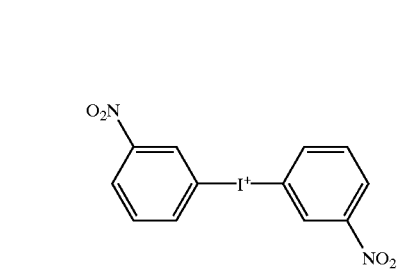 C$_{12}$H$_{25}$SO$_3^-$ (PAG3-9)

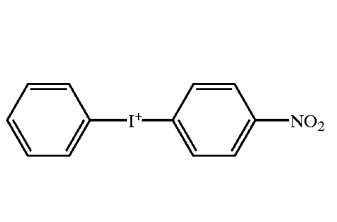

(PAG3-10)

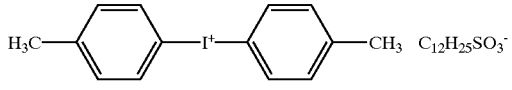 C$_{12}$H$_{25}$SO$_3^-$ (PAG3-11)

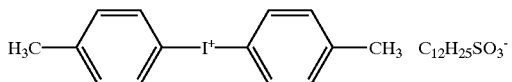 C$_{12}$H$_{25}$SO$_3^-$ (PAG3-12)

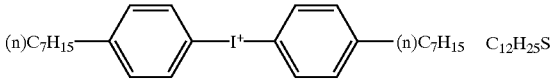 C$_{12}$H$_{25}$SO$_3^-$ (PAG3-13)

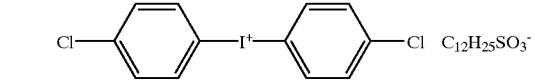 C$_{12}$H$_{25}$SO$_3^-$

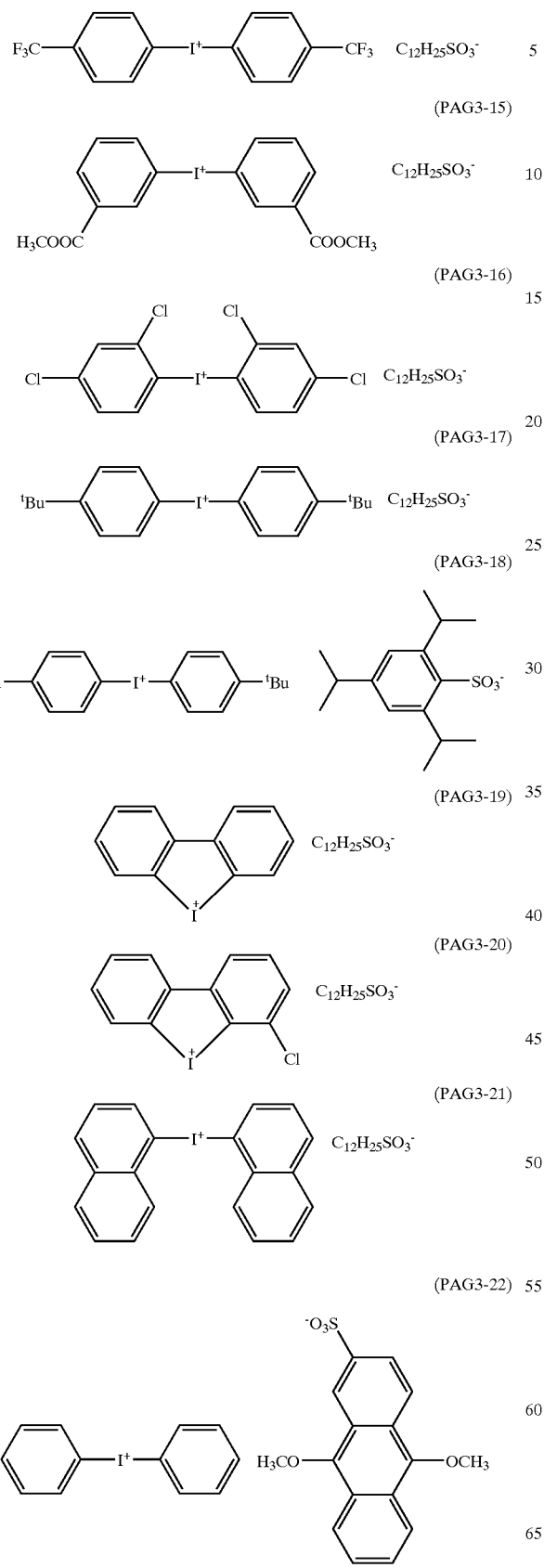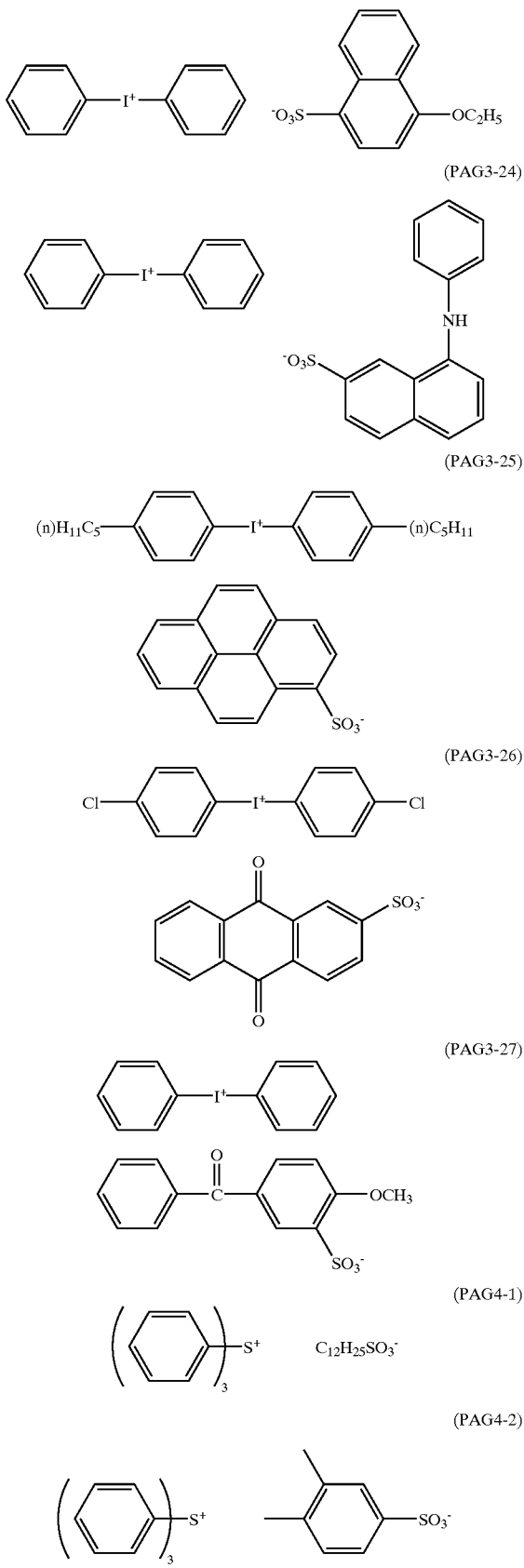

-continued
(PAG4-3)
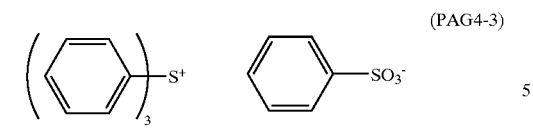
(PAG4-4)
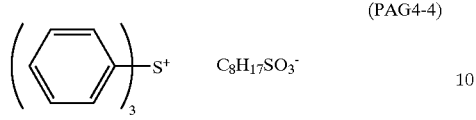
(PAG4-5)
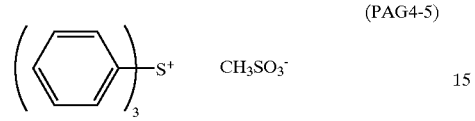
(PAG4-6)
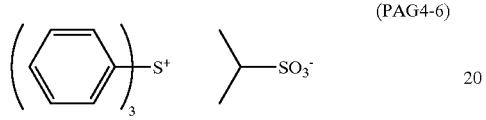
(PAG4-7)
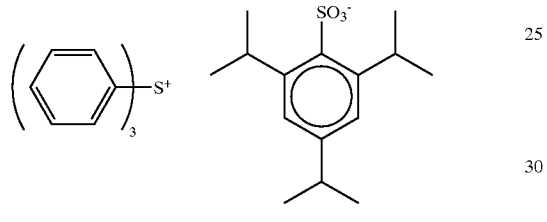
(PAG4-8)
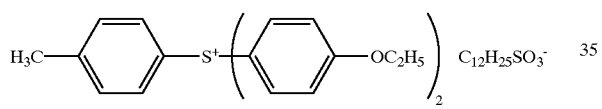
(PAG4-9)
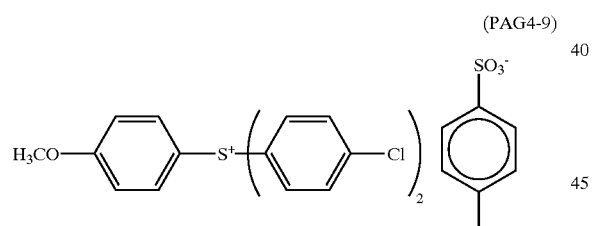
(PAG4-10)
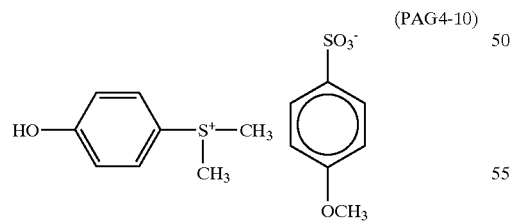
(PAG4-11)
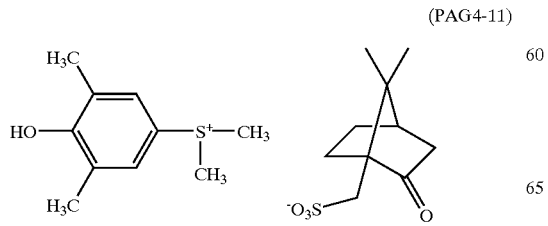
-continued
(PAG4-12)
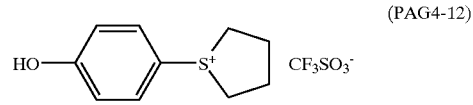
(PAG4-13)
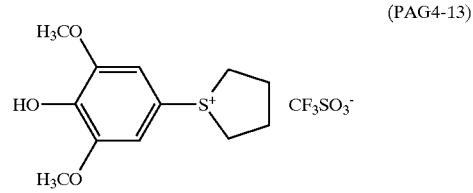
(PAG4-14)
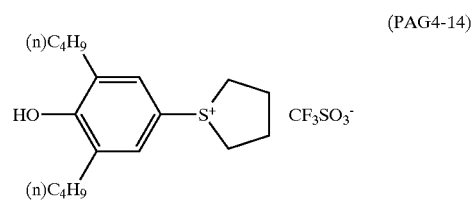
(PAG4-15)
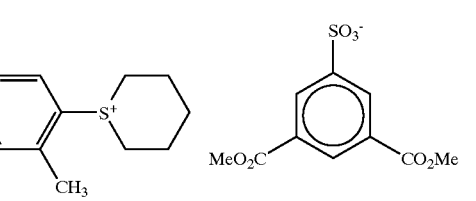
(PAG4-16)
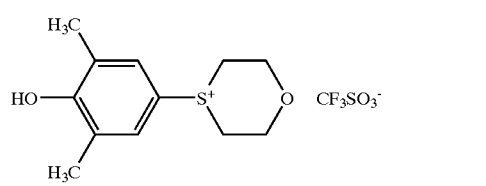
(PAG4-17)
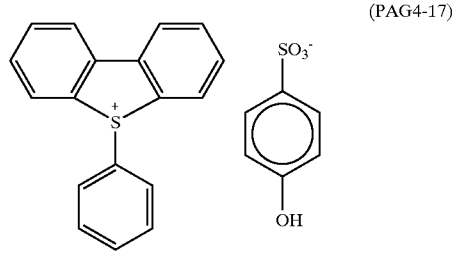
(PAG4-18)
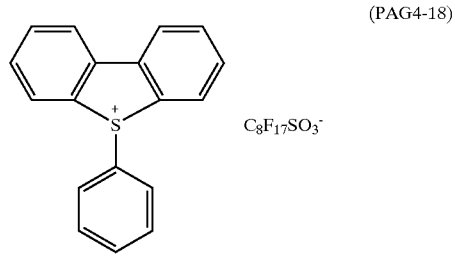

(PAG4-19)
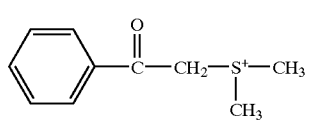 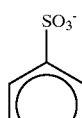
(PAG4-26)
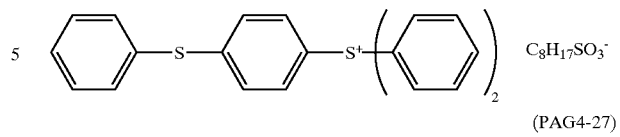
(PAG4-27)
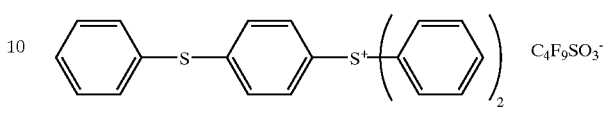
(PAG4-28)
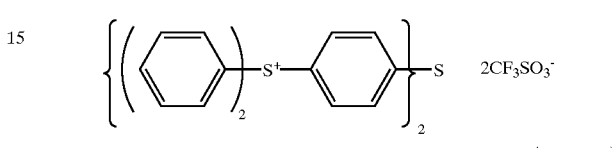
(PAG4-20)
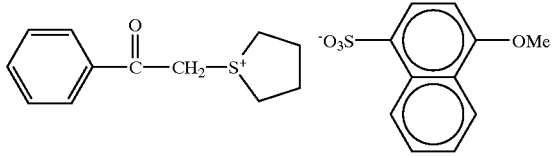
(PAG4-29)
(PAG4-21)
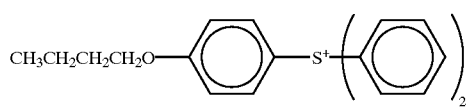
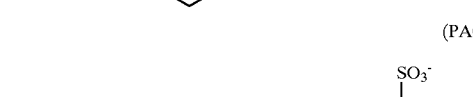
(PAG4-30)
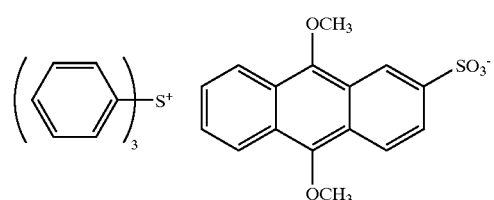
(PAG4-22)
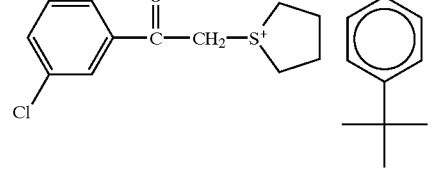
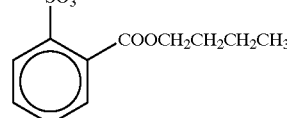
(PAG4-31)
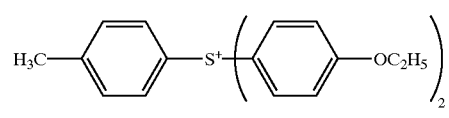
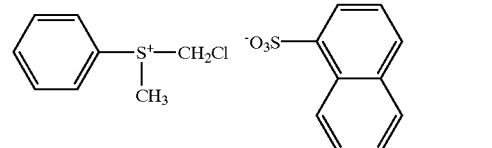
(PAG4-23)
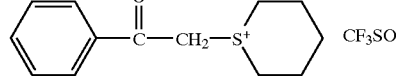
(PAG4-32)
(PAG4-24)
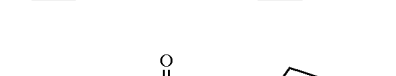
(PAG4-25)
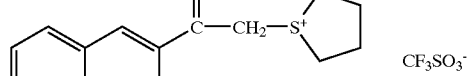
(PAG4-33)

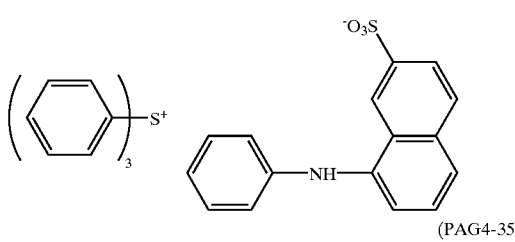
(PAG4-34)

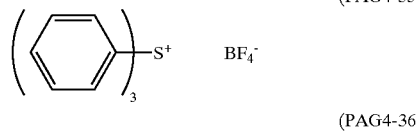
(PAG4-35)

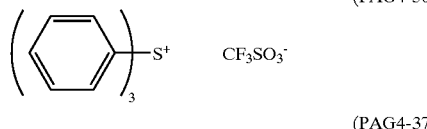
(PAG4-36)

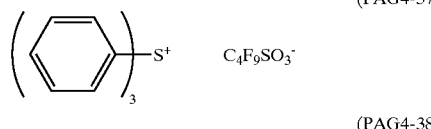
(PAG4-37)

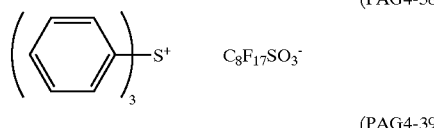
(PAG4-38)

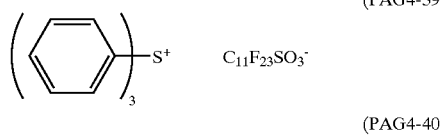
(PAG4-39)

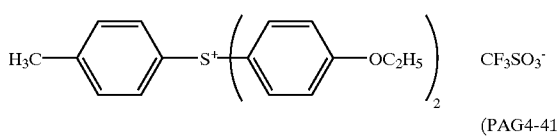
(PAG4-40)

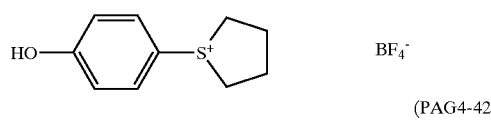
(PAG4-41)

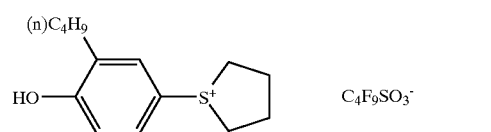
(PAG4-42)

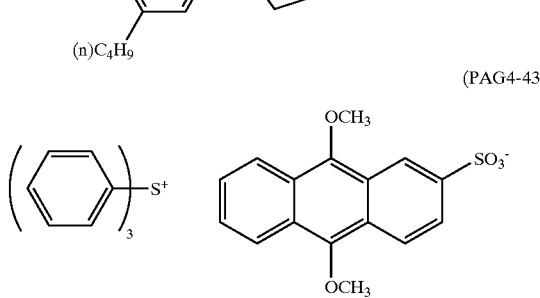
(PAG4-43)

The above-described onium salts represented by formulae (PAG3) and (PAG4) are well-known compounds and can be synthesized according to the methods described, e.g., in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polymer Sci.*, Polymer Chem. Ed., 18, 2677 (1980), U.S. Pat. Nos. 2,807,648, 4,247,473, and JP-A-53-101331.

(3) A disulfone derivative represented by the following formula (PAG5) or an iminosulfonate derivative represented by the following formula (PAG6)

$$Ar^3-SO_2-SO_2-Ar^4 \quad (PAG5)$$

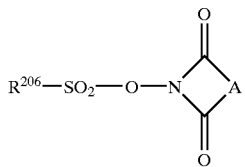
(PAG6)

wherein $Ar^3$ and $Ar^4$ each represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group, or a substituted or unsubstituted arylene group.

The specific examples thereof include the following compounds but the present invention is not limited thereto.

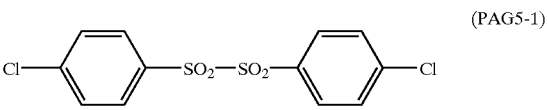
(PAG5-1)

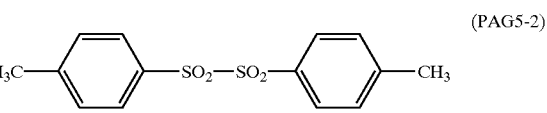
(PAG5-2)

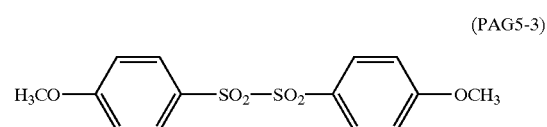
(PAG5-3)

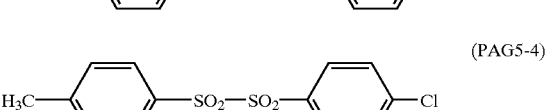
(PAG5-4)

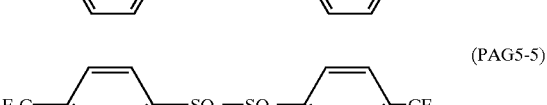
(PAG5-5)

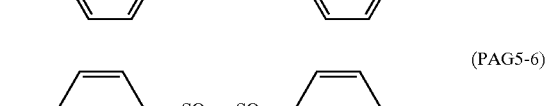
(PAG5-6)

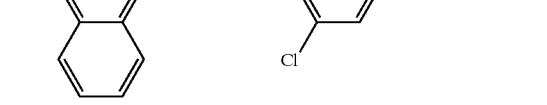
(PAG5-7)

-continued
(PAG5-8)
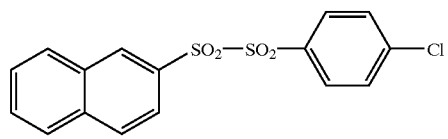
(PAG5-9)
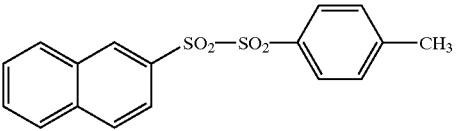
(PAG5-10)
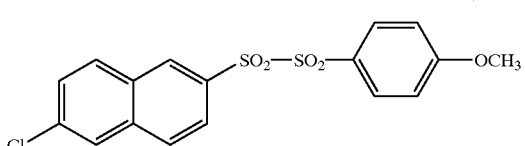
(PAG5-11)
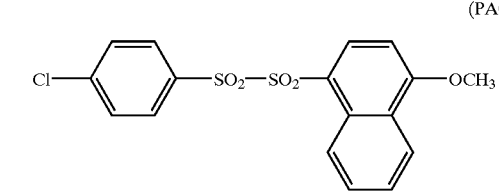
(PAG5-12)
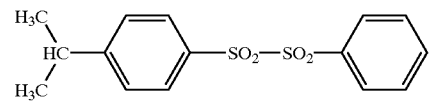
(PAG5-13)
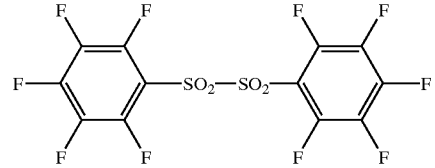
(PAG5-14)
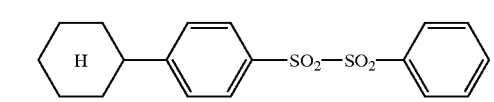
(PAG6-1)
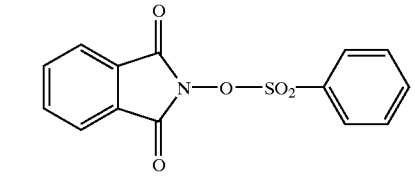
(PAG6-2)
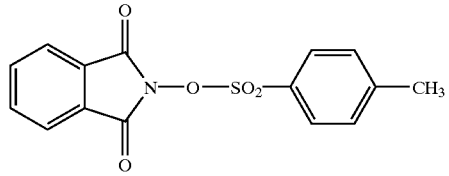
(PAG6-3)
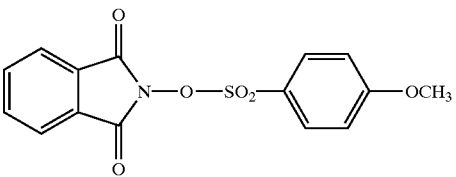
-continued
(PAG6-4)
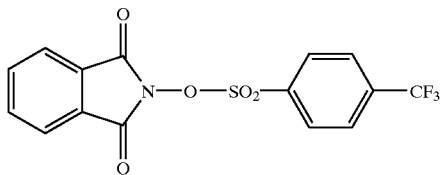
(PAG6-5)
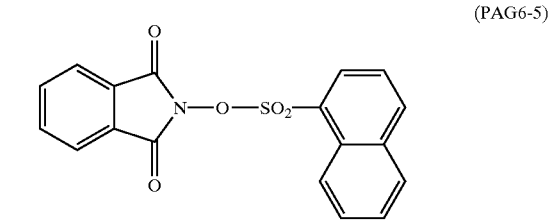
(PAG6-6)
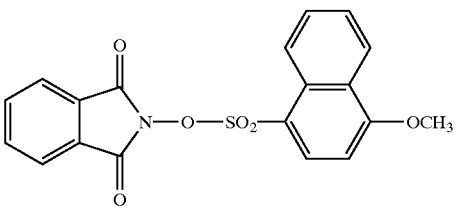
(PAG6-7)
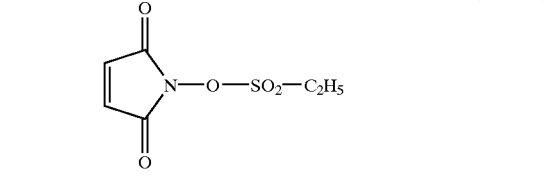
(PAG6-8)
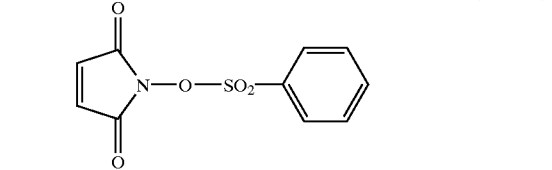
(PAG6-9)
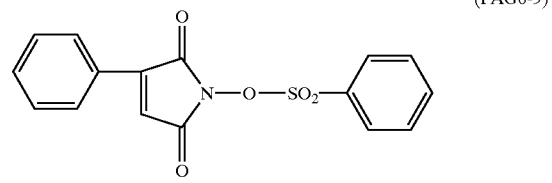
(PAG6-10)
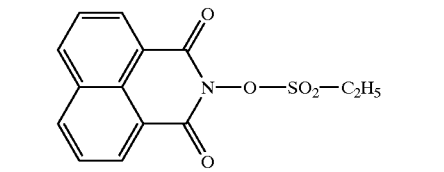
(PAG6-11)
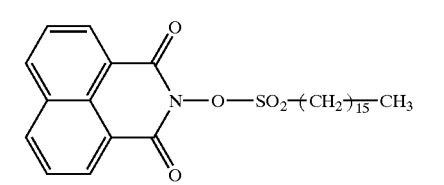

-continued

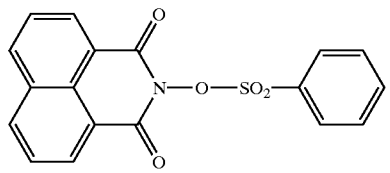
(PAG6-12)

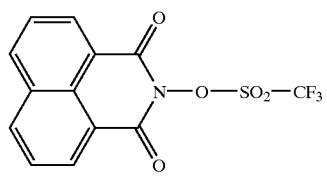
(PAG6-13)

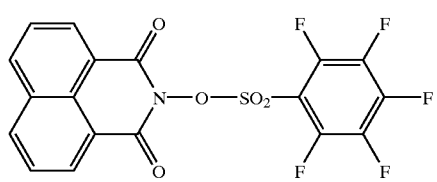
(PAG6-14)

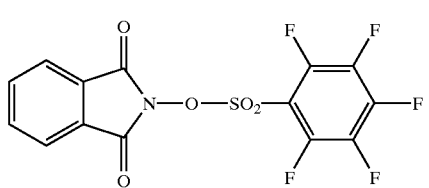
(PAG6-15)

In the present invention, any compound which generates an acid on irradiation with an energy ray can be used as component (b), but the reduction potential of the compound is preferably −0.5 V (vs SCE) or more.

For evaluating a reduction potential, the methods described in *Denki Kagaku Sokutei Ho* (*Electrochemical Measuring Method*), first and last volumes, Gihodo Publishing Co. (1984) can be used.

The positive resist composition according to the present invention preferably comprises at least either (e) a resin having a group capable of decomposing by an acid to increase the solubility in an alkali developer by the action of an acid (hereinafter also referred to as "component (e)"), or (f) a low molecular weight dissolution-inhibiting compound having a molecular weight of 3,000 or less which contains a group capable of decomposing by an acid and can increase the solubility in an alkali developer by the action of an acid (hereinafter also referred to as "component (f)").

(e) A Resin Containing an Acid-decomposable Group and Being Capable of Increasing the Solubility in an Alkali Developer by the Action of an Acid (Component (e))

Component (e) for use in the positive resist composition according to the present invention includes resins having a group capable of decomposing by an acid on either the main chain or the side chain of the resins, or on both of the polymer main chain and the side chain. Of these resins, those having a group capable of decomposing by an acid on the side chain are more preferred.

The group capable of decomposing by an acid is preferably a —COO—$A^0$ group and an —O—$B^0$ group. Further, an —$R^0$—COO—$A^0$ group and an —Ar—O—$B^0$ group can be exemplified as the groups containing these groups.

Here, $A^0$ represents a —C($R^{01}$)($R^{02}$)($R^{03}$) group, an —Si($R^{01}$)($R^{02}$)($R^{03}$) group, or —C($R^{04}$)($R^{05}$)—O—$R^{06}$ group; $B^0$ represents $A^0$ or a —CO—O—$A^0$ group (wherein $R^0$, $R^{01}$, $R^{02}$, $R^{03}$, $R^{40}$, $R^{05}$, $R^{06}$, and Ar are the same as those described later).

The acid-decomposable group is preferably a silyl ether group, a cumyl ester group, an acetal group, a tetrahydropyranyl ether group, an enol ether group, an enol ester group, a tertiary alkyl ether group, a tertiary alkyl ester group, or a tertiary alkyl carbonate group, more preferably a tertiary alkyl ester group, a tertiary alkyl carbonate group, a cumyl ester group, an acetal group, or a tetrahydropyranyl ether group.

In the case where the group capable of decomposing by an acid is bonded as a side chain, the matrix resin is an alkali-soluble resin having an —OH group or a —COOH group on a side chain, preferably an —$R^0$—COOH group or an —Ar—OH group. The alkali-soluble resins described below can be exemplified as such matrix resins, for instance.

The alkali-soluble resin preferably has an alkali-solubility rate of 170 Å/sec or more, particularly preferably 330 Å/sec or more, when measured with 0.261 N tetramethylammonium hydroxide (TMAH) at 23° C.

From this point of view, the examples of preferred alkali-soluble resins include o-, m-, p-poly(hydroxystyrene), and copolymers of them, hydrogenated poly(hydroxystyrene), halogen- or alkyl-substituted poly(hydroxystyrene), a partially O-alkylated or O-acylated product of poly(hydroxystyrene), a styrene-hydroxystyrene copolymer, an α-methylstyrene-hydroxystyrene copolymer, and a hydrogenated novolak resin.

Component (e) for use in the present invention can be obtained by reacting an alkali-soluble resin with the precursor of a group capable of decomposing with an acid, or by copolymerizing the alkali-soluble resin monomer having bonded thereto an acid-decomposable group with various monomers as disclosed in EP 254853, JP-A-2-25850, JP-A-3-223860 and JP-A-4-251259.

The specific examples of component (e) for use in the present invention are shown below, but it should not be construed as the present invention is limited thereto.

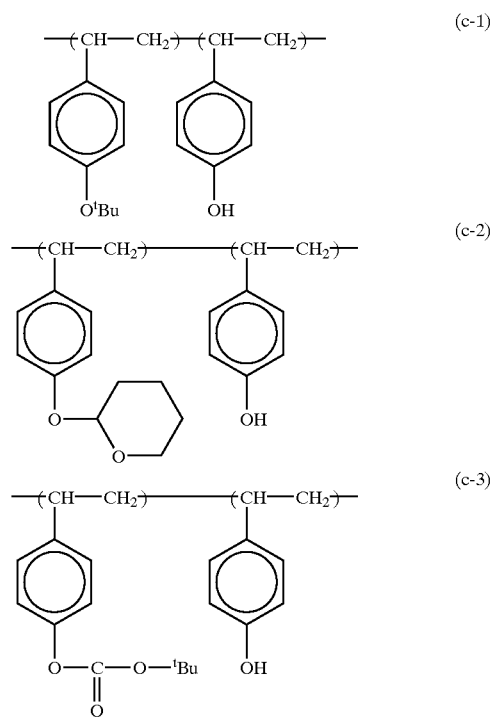

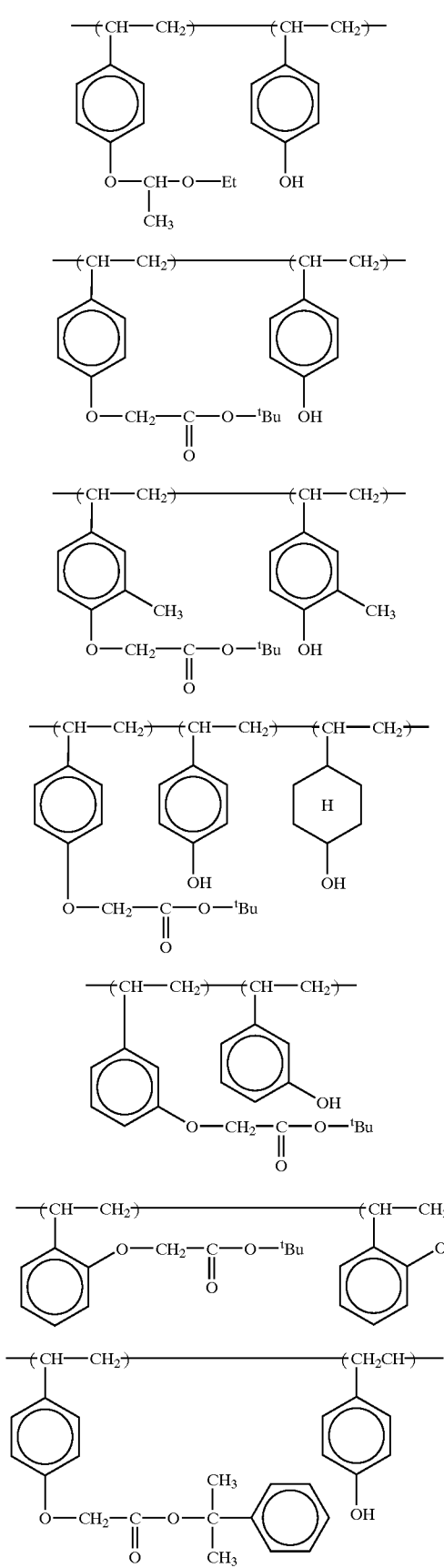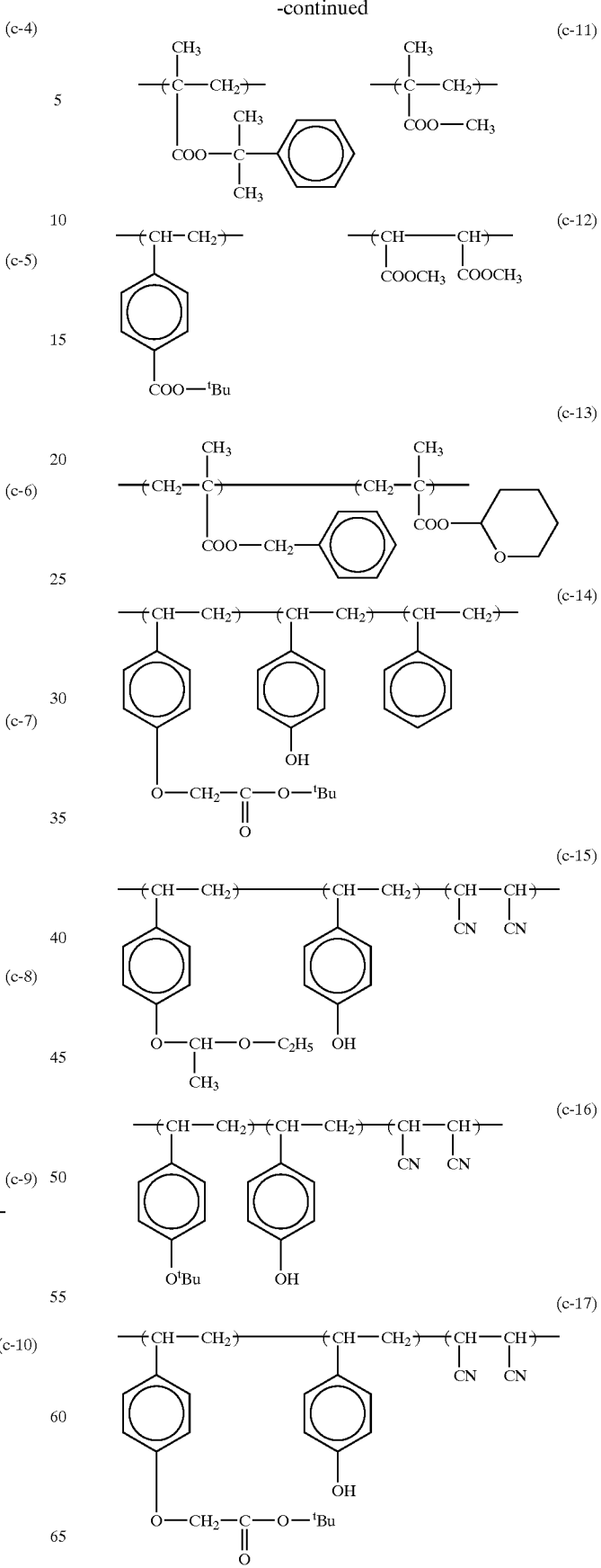

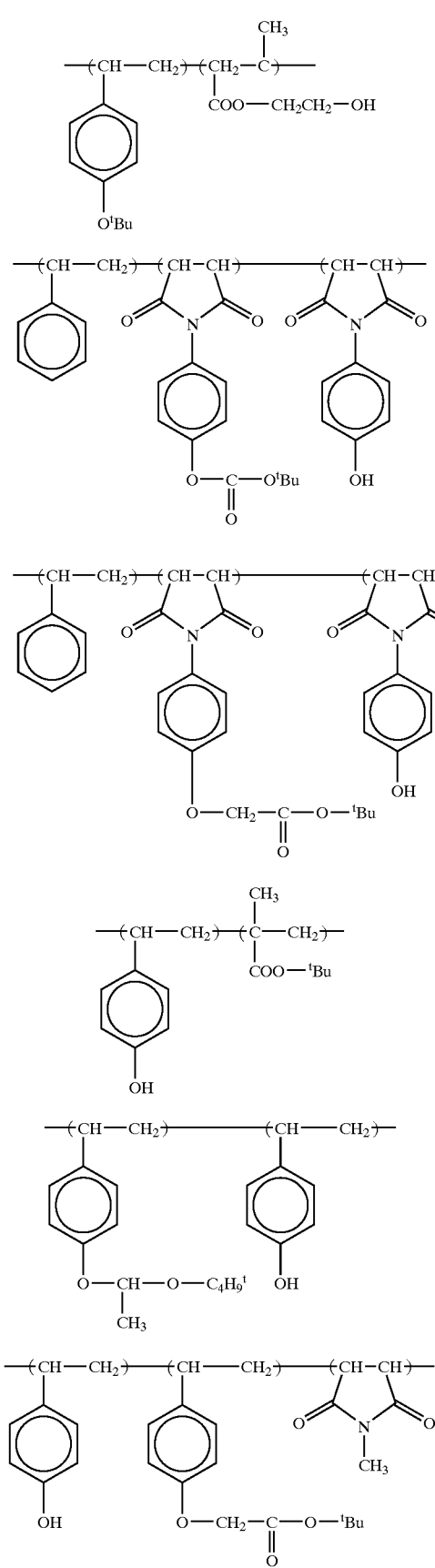
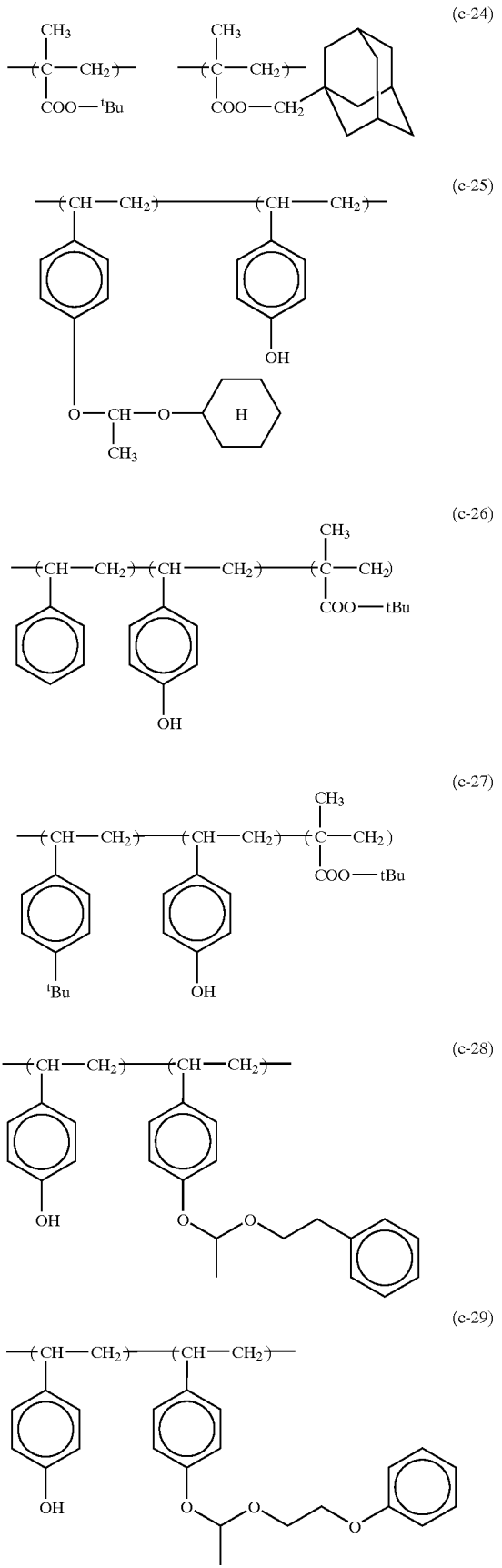

(c-30)
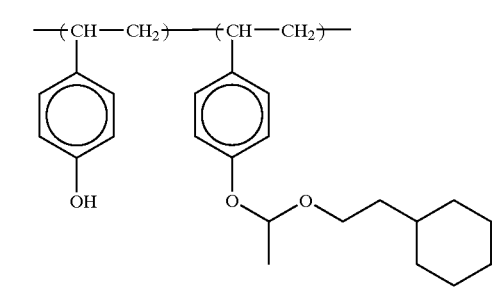

(c-31)
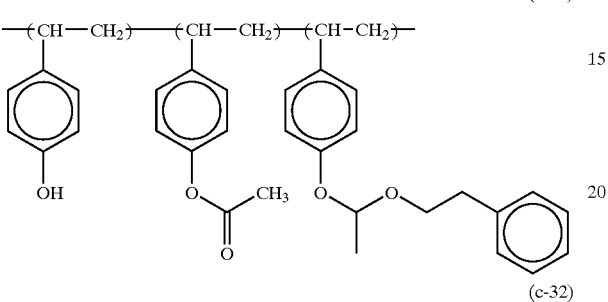

(c-32)
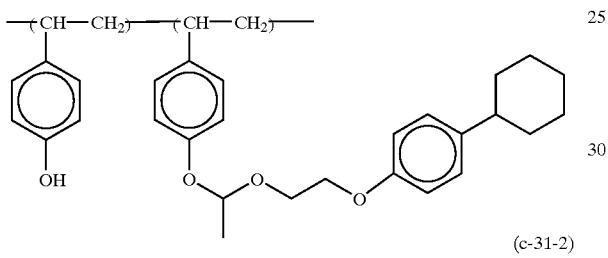

(c-31-2)
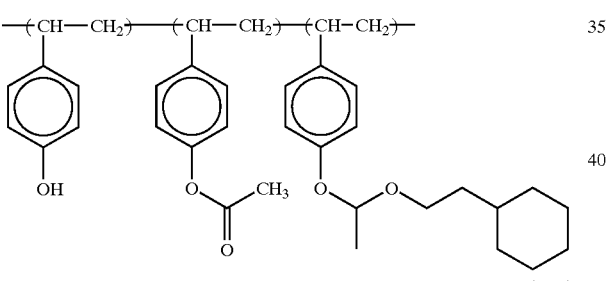

(c-33)
(c-34)
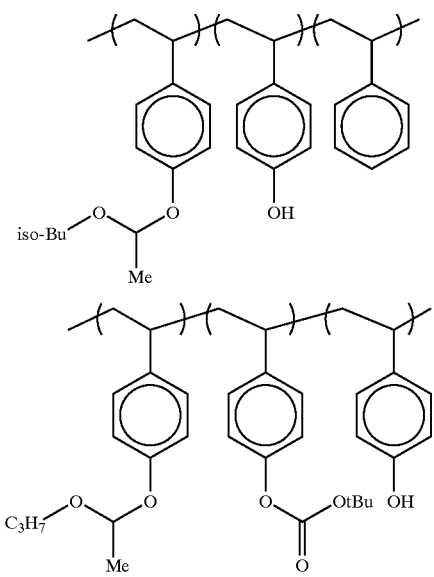

(c-35)
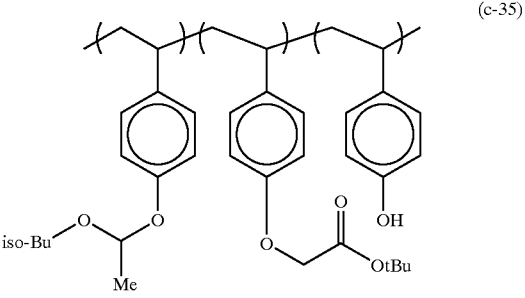

(c-36)
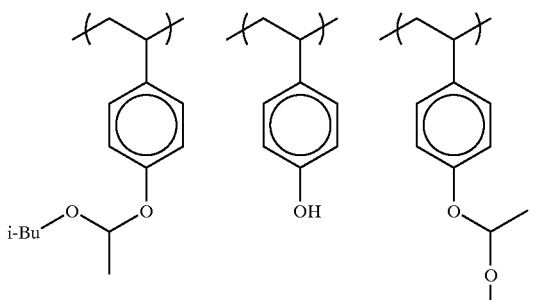

(c-37)
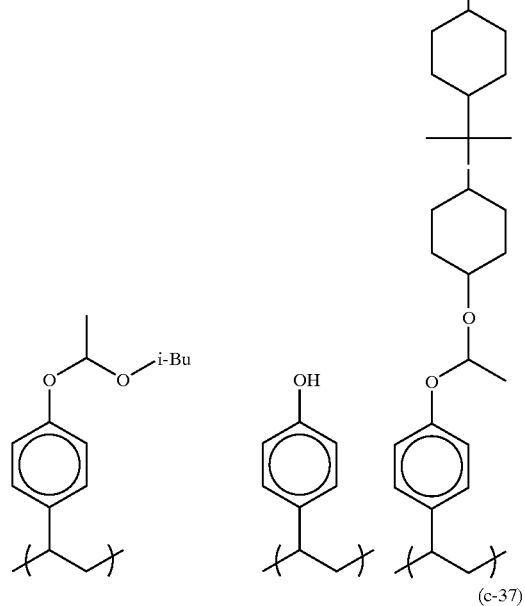

The content of the group decomposable with an acid is expressed by B/(B+S) taking the number of groups capable of decomposing with an acid in the resin as (B), and the number of alkali-soluble groups which are not protected with a group decomposable with an acid as (S). The content is preferably from 0.01 to 0.7, more preferably from 0.05 to 0.50, and still more preferably from 0.05 to 0.40. If B/(B+S)

is greater than 0.7, film shrinkage after PEB, adhesion failure of the film to the substrate and scumming disadvantageously occur. While when B/(B+S) is smaller than 0.01, sometimes conspicuous standing waves remain on the side wall of the pattern, which is also not advantageous.

The weight average molecular weight (Mw) of component (e) is preferably from 2,000 to 200,000. If the weight average molecular weight is less than 2,000, great reduction in the resist film thickness is caused in the unexposed area by development and, on the contrary, when it exceeds 200,000, the alkali-soluble resin itself decreases in the dissolution rate in an alkali, which causes a decrease in developing speed. The weight average molecular weight is more preferably from 5,000 to 100,000, and still more preferably from 8,000 to 50,000.

The molecular weight distribution (Mw/Mn) is preferably from 1.0 to 4.0, more preferably from 1.0 to 2.0, and particularly preferably from 1.0 to 1.6. The smaller the degree of dispersion, the higher are the heat resistance and image-forming property (pattern profile, defocus latitude).

The weight average molecular weight as used herein is defined as a value calculated in terms of polystyrene by gel permeation chromatography.

Component (e) can be used in combination of two or more.

(f) A Low Molecular Weight Acid-decomposable Dissolution-inhibiting Compound (Component (f))

Component (f) may be used in the present invention. Component (f) is a low molecular weight dissolution-inhibiting compound having a molecular weight of 3,000 or less which contains a group capable of decomposing by an acid and can increase the solubility in an alkali developer by the action of an acid.

Component (f) preferably compounded into the resist composition according to the present invention is a compound having at least two acid-decomposing groups in the structure, and the contiguous acid-decomposing groups are separated from each other at the remotest site via at least 8 bonding atoms exclusive of the acid-decomposing groups.

Component (d) is more preferably a compound having at least two acid-decomposing groups in the structure, where the contiguous acid-decomposing groups are separated from each other at the remotest site via at least 10 bonding atoms, preferably at least 11, and more preferably at least 12, exclusive of the acid-decomposing groups, alternatively a compound containing at least three acid-decomposing groups in the structure, where the contiguous acid-decomposing groups are separated from each other at the remotest site via at least 9 bonding atoms, preferably at least 10, and more preferably at least 11, and the remotest distance among these three acid-decomposing groups goes via at least 9 bonding atoms, exclusive of the acid-decomposing groups. The upper limit of the number of bonding atoms is preferably 50 and more preferably 30.

When an acid-decomposing dissolution inhibiting compound as component (f) has three or more, preferably four or more acid-decomposing groups, or even when the compound has two or more acid-decomposing groups, the dissolution inhibiting property of component (f) to an alkali-soluble resin is remarkably increased insofar as the contiguous acid-decomposing groups are separated from each other via a certain distance or more.

The distance between contiguous acid-decomposing groups is indicated by the number of bonding atoms present en route exclusive of the acid-decomposing groups. For example, in the cases of the following compounds (1) and (2), the distances between contiguous acid-decomposing groups are respectively 4 bonding atoms, and in the case of compound (3), the distance is 12 bonding atoms.

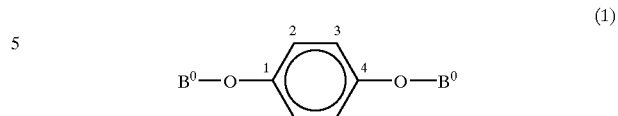

(1)

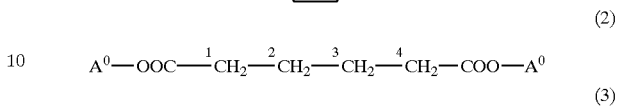

(2)

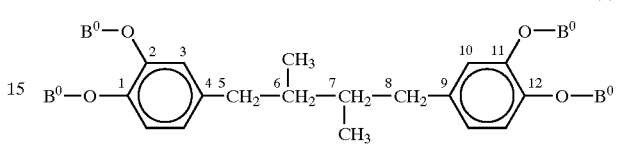

(3)

Acid-decomposing groups: —COO—A$^0$, —O—B$^0$.

Further, an acid-decomposing dissolution inhibiting compound as component (f) may have a plurality of acid-decomposing groups on one benzene ring, but a compound constructed by a skeleton having one acid-decomposing group on one benzene ring is preferred. The molecular weight of the acid-decomposing dissolution inhibiting compound for use in the present invention is 3,000 or less, preferably from 300 to 3,000 and more preferably from 500 to 2,500.

In a preferred embodiment of the present invention, the group containing a group decomposing by an acid, i.e., a —COO—A$^0$ group and an —O—B$^0$ group, includes an —R$^0$—COO—A$^0$ group and an —Ar—O—B$^0$ group.

Here, A$^0$ represents a —C(R$^{01}$)(R$^{02}$)(R$^{03}$) group, an —Si (R$^{01}$)(R$^{02}$)(R$^{03}$) group, or —C(R$^{04}$)(R$^{05}$)—O—R$^{06}$ group; B$^0$ represents A$^0$ or a —CO—O—A$^0$ group.

R$^{01}$, R$^{02}$, R$^{03}$, R$^{04}$ and R$^{05}$, which may be the same or different, each represents a hydrogen atom, an alkyl group, a cycloalkyl group, an alkenyl group, or an aryl group; and R$^{06}$ represents an alkyl group or an aryl group; provided that at least two of R$^{01}$, R$^{02}$ and R$^{03}$ are groups other than a hydrogen atom, and that two of respective groups R$^{01}$ to R$^{03}$, and R$^{04}$ to R$^{06}$ may be bonded to form a ring. R$^0$ represents a divalent or greater valent aliphatic or aromatic hydrocarbon group which may have a substituent, and —Ar— represents a divalent or greater valent aromatic group which may have a monocyclic or polycyclic substituent.

The alkyl group is preferably an alkyl group having from 1 to 4 carbon atoms (e.g., methyl, ethyl, propyl, n-butyl, sec-butyl, t-butyl), the cycloalkyl group is preferably a cycloalkyl group having from 3 to 10 carbon atoms (e.g., cyclopropyl, cyclobutyl, cyclohexyl, adamantyl), the alkenyl group is preferably an alkenyl group having from 2 to 4 carbon atoms (e.g., vinyl, propenyl, allyl, butenyl), the aryl group is preferably an aryl group having from 6 to 14 carbon atoms (e.g., phenyl, xylyl, toluyl, cumenyl, naphthyl, anthracenyl).

Further, the examples of the substituents include a hydroxyl group, a halogen atom (e.g., fluorine, chlorine, bromine, iodine), a nitro group, a cyano group, the above-described alkyl group, an alkoxyl group (e.g., methoxy, ethoxy, hydroxyethoxy, propoxy, hydroxypropoxy, n-butoxy, isobutoxy, sec-butoxy, t-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cyanamyl, valeryl), an acyloxy group (e.g., butyryloxy), the above-described alkenyl group, an alkenyloxy group (e.g., vinyloxy, propenyloxy, allyloxy, butenyloxy), the above-described aryl group, an aryloxy group (e.g., phenoxy), and an aryloxycarbonyl group (e.g., benzoyloxy).

The examples of preferred acid-decomposable groups are a silyl ether group, a cumyl ester group, an acetal group, a tetrahydropyranyl ether group, an enol ether group, an enol ester group, a tertiary alkyl ether group, a tertiary alkyl ester group, and a tertiary alkylcarbonate group, and the more preferred groups are a tertiary alkyl ester group, a tertiary alkyl carbonate group, a cumyl ester group, and a tetrahydropyranyl ether group.

The preferred examples of component (f) include the compounds obtained by bonding and protecting a part or all of the phenolic OH group contained in the polyhydroxy compounds as disclosed in the following patents with an —R⁰—COO—A⁰ group or a B⁰ group. The foregoing polyhydroxy compounds are disclosed in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, Japanese Patent Application Nos. 3-33229, 3-230790, 3-320438, 4-25157, 4-52732, 4-103215, 4-104542, 4-107885, 4-107889, and 4-152195.

Of these compounds, the compounds prepared using the polyhydroxy compounds disclosed in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Application Nos. 4-25157, 4-103215, 4-104542, 4-107885, 4-107889 and 4-152195 are more preferred.

More specifically, the compounds represented by formulae (I) to (XVI) shown below are exemplified.

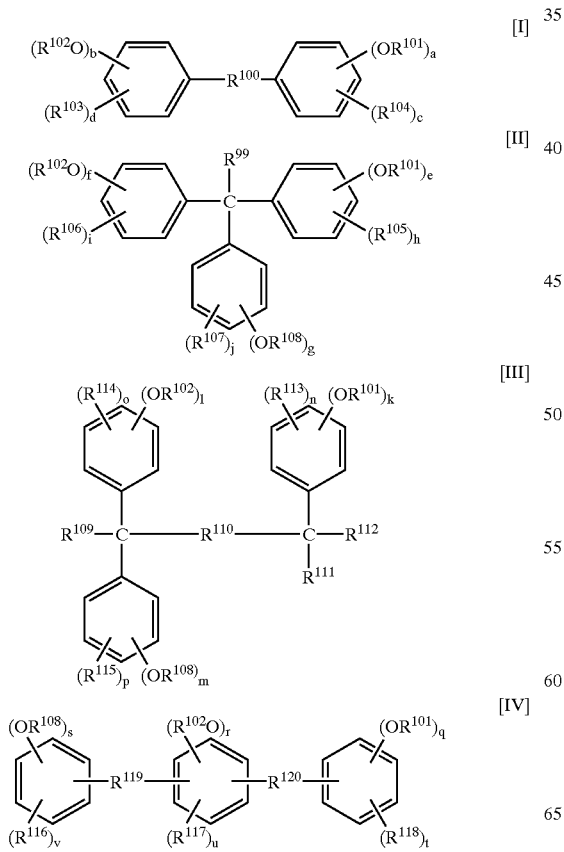

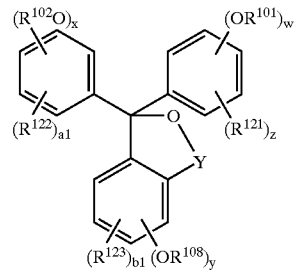

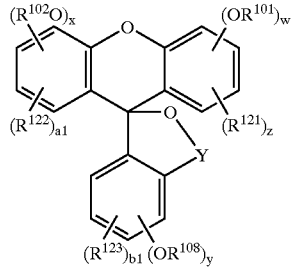

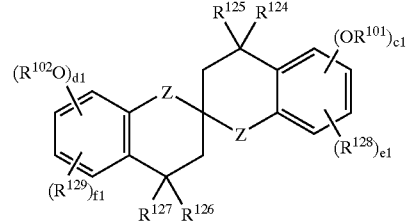

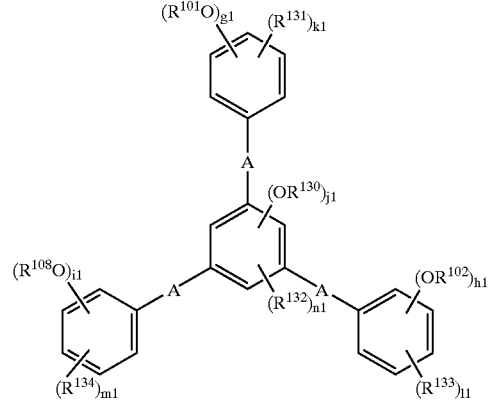

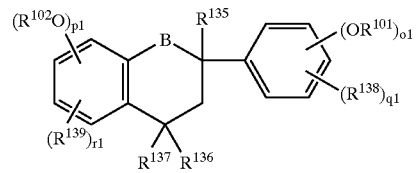

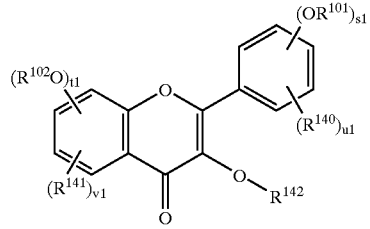

-continued

[XI]

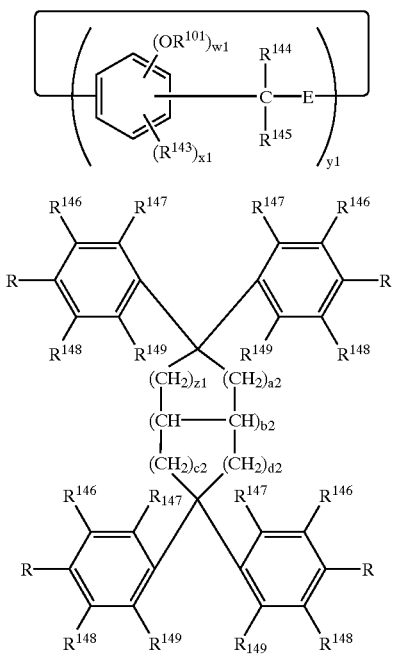

[XII]

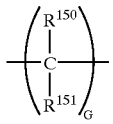

wherein $R^{101}$, $R^{102}$, $R^{108}$ and $R^{130}$, which may be the same or different, each represents a hydrogen atom, $-R^0-COO-C(R^{01})(R^{02})(R^{03})$ or $-CO-O-C(R^{01})(R^{02})(R^{03})$, provided that $R^0$, $R^{01}$, $R^{02}$ and $R^{03}$ each has the same meaning as defined above;

$R^{100}$ represents $-CO-$, $-COO-$, $-NHCONH-$, $-NHCOO-$, $-O-$, $-S-$, $-SO-$, $-SO_2-$, $-SO_3-$, or

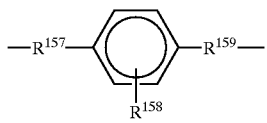

(wherein G represents an integer of from 2 to 6, provided that when G is 2, at least either $R^{150}$ or $R^{151}$ represents an alkyl group;

$R^{150}$ and $R^{151}$, which may be the same or different, each represents a hydrogen atom, an alkyl group, an alkoxyl group, $-OH$, $-COOH$, $-CN$, a halogen atom, $-R^{152}-COOR^{153}$ or $-R^{154}-OH$);

$R^{152}$ and $R^{154}$ each represents an alkylene group;

$R^{153}$ represents a hydrogen atom, an alkyl group, an aryl group, or an aralkyl group;

$R^{99}$, $R^{103}$, $R^{104}$, $R^{105}$, $R^{106}$, $R^{107}$, $R^{109}$, $R^{111}$, $R^{112}$, $R^{113}$, $R^{114}$, $R^{115}$, $R^{116}$, $R^{117}$, $R^{119}$, $R^{121}$, $R^{122}$, $R^{123}$, $R^{128}$, $R^{129}$, $R^{131}$, $R^{132}$, $R^{133}$, $R^{134}$, $R^{138}$, $R^{139}$, $R^{140}$, $R^{141}$, and $R^{143}$, which may be the same or different, each represents a hydrogen atom, a hydroxyl group, an alkyl group, an alkoxyl group, an acyl group, an acyloxy group, an aryl group, an aryloxy group, an aralkyl group, an aralkyloxy group, a halogen atom, a nitro group, a carboxyl group, a cyano group, or $-N(R^{155})(R^{156})$ (wherein $R^{155}$ and $R^{156}$ each represents H, an alkyl group, or an aryl group);

$R^{110}$ represents a single bond, an alkylene group, or

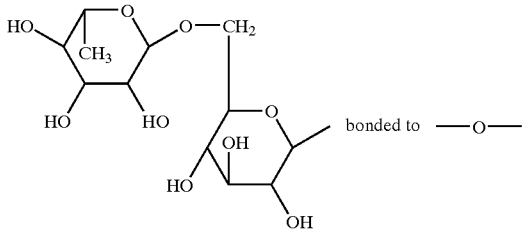

($R^{157}$ and $R^{159}$, which may be the same or different, each represents a single bond, an alkylene group, $-O-$, $-S-$, $-CO-$, or a carboxyl group; $R^{158}$ represents a hydrogen atom, an alkyl group, an alkoxyl group, an acyl group, an acyloxy group, an aryl group, a nitro group, a hydroxyl group, a cyano group, or a carboxyl group, provided that the hydroxyl group may be replaced with an acid-decomposing group (e.g., a t-butyoxycarbonylmethyl group, a tetrahydropyranyl group, a 1-ethoxy-1-ethyl group, a 1-t-butoxy-1-ethyl group);

$R^{119}$ and $R^{120}$, which may be the same or different, each represents a methylene group, a methylene group substituted with a lower alkyl group, a halomethylene group, or a haloalkyl group, provided that the lower alkyl group as used in the present invention means an alkyl group having from 1 to 4 carbon atoms;

$R^{124}$, $R^{125}$, $R^{126}$ and $R^{127}$, which may be the same or different, each represents a hydrogen atom or an alkyl group;

$R^{135}$, $R^{136}$ and $R^{137}$, which may be the same or different, each represents a hydrogen atom, an alkyl group, an alkoxyl group, an acyl group, or an acyloxy group;

$R^{142}$ represents a hydrogen atom, $-R^0-COO-C(R^{01})(R^{02})(R^{03})$, $-CO-O-C(R^{01})(R^{02})(R^{03})$ or bonded to $-O-$ $R^{144}$ and $R^{145}$, which may be the same or different, each represents a hydrogen atom, a lower alkyl group, a lower haloalkyl group, or an aryl group;

$R^{146}$, $R^{147}$, $R^{148}$ and $R^{149}$, which may be the same or different, each represents a hydrogen atom, a hydroxyl group, a halogen atom, a nitro group, a cyano group, a carbonyl group, an alkyl group, an alkoxyl group, an alkoxycarbonyl group, an aralkyl group, an aralkyloxy group, an acyl group, an acyloxy group, an alkenyl group, an alkenyloxy group, an aryl group, an aryloxy group, or an aryloxycarbonyl group, provided that the four substituents under the same symbol may not be the same group;

Y represents $-CO-$ or $-SO_2-$;

Z and B each represents a single bond or $-O-$;

A represents a methylene group, a methylene group substituted with a lower alkyl group, a halomethylene group, or a haloalkyl group;

E represents a single bond or an oxymethylene group;

when a to z and a1 to y1 each represents a plural number, the group in the parenthesis may be the same or different;

a to q, s, t, v, g1 to i1, k1 to m1, o1, q1, s1, and u1 each represents 0 or an integer of from 1 to 5;

r, u, w, x, y, z, a1 to f1, p1, r1, t1, v1 to x1 each represents 0 or an integer of from 1 to 4;

j1, n1, z1, a2, b2, c2 and d2 each represents 0 or an integer of from 1 to 3;

at least one of z1, a2, c2 and d2 represents 1 or more;

y1 represents an integer of from 3 to 8;

(a+b), (e+f+g), (k+l+m), (q+r+s), (w+x+y), (c1+d1), (g1+h1+i1+j1), (o1+p1), (s1+t1)$\geq$2;

(j1+n1)$\leq$3;

(r+u), (w+z), (x+a1), (y+b1), (c1+e1), (d1+f1), (p1+r1), (t1+v1), (x1+w1)$\leq$4, provided that in the case of formula (V), (w+z), (x+a1)$\leq$5; and (a+c), (b+d), (e+h), (f+i), (g+j), (k+n), (l+o), (m+p), (q+t), (s+v), (g1+k1), (h1+l1), (i1+m1), (o1+q1), (s1+u1)$\leq$5.

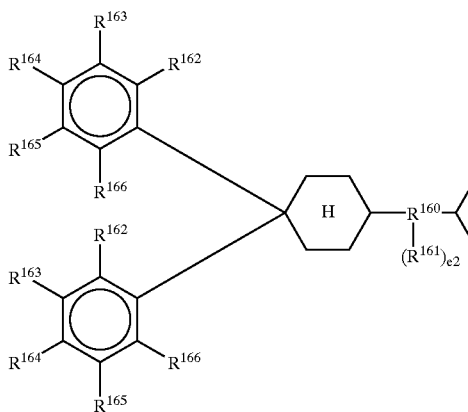

(XIII)

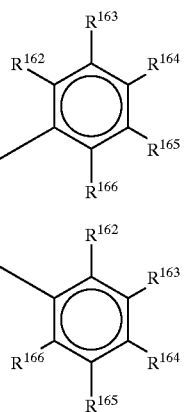

wherein $R^{160}$ represents an organic group, a single bond,

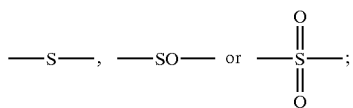

$R^{161}$ resents a hydrogen atom, a monovalent organic group or

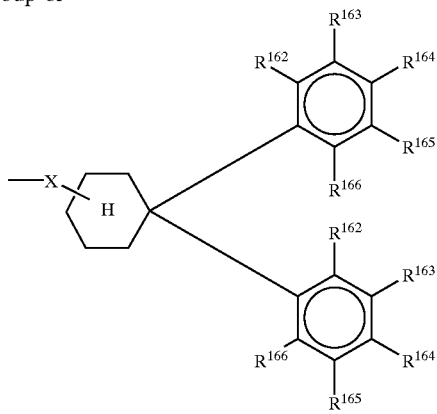

$R^{162}$, $R^{163}$, $R^{164}$, $R^{165}$ and $R^{166}$, which may be the same or different, each represents a hydrogen atom, a hydroxyl group, a halogen atom, an alkyl group, an alkoxyl group, an alkenyl group, —O—$R^0$—COO—C($R^{01}$)($R^{02}$)($R^{03}$) or —O—CO—O—C($R^{01}$)($R^{02}$)($R^{03}$), provided that at least two of $R^{162}$, $R^{163}$, $R^{164}$, $R^{165}$ and $R^{166}$ represent —O—$R^0$—COO—C($R^{01}$)($R^{02}$)($R^{03}$) or —O—CO—O—C($R^{01}$)($R^{02}$) ($R^{03}$), and that four or six substituents under the same symbol may not be the same group;

X represents a divalent organic group; and e2 represents 0 or 1.

(XIV)

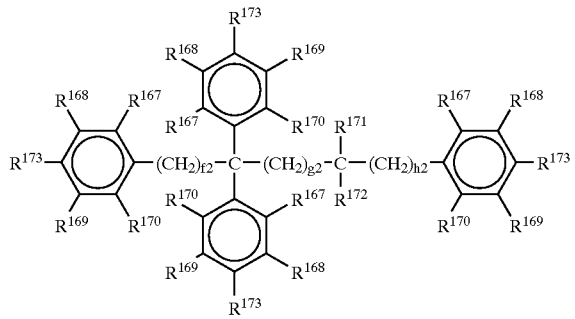

wherein $R^{167}$, $R_{168}$, $R^{169}$, $R^{170}$, which may be the same or different, each represents a hydrogen atom, a hydroxyl group, a halogen atom, an alkyl group, an alkoxyl group, or an alkenyl group, provided that four, five or six substituents under the same symbol may not be the same group;

$R^{171}$ and $R^{172}$ each represents a hydrogen atom, an alkyl group, or

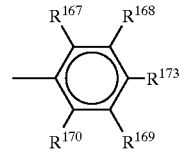

at least two of $R^{173}$ represent an —O—$R^0$—COO—C ($R^{01}$)($R^{02}$)($R^{03}$) group or an —O—CO—O—C($R^{01}$) ($R^{02}$)($R^{03}$) group, and the other represent a hydroxyl group;

f2 and h2 each represents 0 or 1; and g2 represents 0 or an integer of from 1 to 4.

(XV)

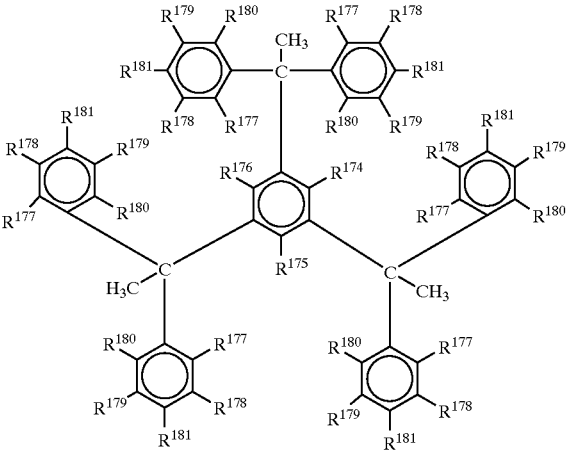

wherein $R^{174}$, $R^{175}$, $R^{176}$, $R^{177}$, $R^{178}$, $R^{179}$, $R^{180}$, which may be the same or different, each represents a hydrogen atom, a hydroxyl group, a halogen atom, an alkyl group, an alkoxyl group, a nitro group, an alkenyl group, an aryl group, an aralkyl group, an alkoxycarbonyl group, an arylcarbonyl group, an acyloxy group, an acyl group, an aralkyloxy group or an aryloxy group, provided that six substituents under the same symbol may not be the same group; and at least two of $R^{181}$ represent an —O—$R^0$—COO—C($R^{01}$)($R^{02}$)($R^{03}$) group or an —O—CO—O—C($R^{01}$)($R^{02}$)($R^{03}$) group, and the other represent a hydroxyl group.

(XVI)

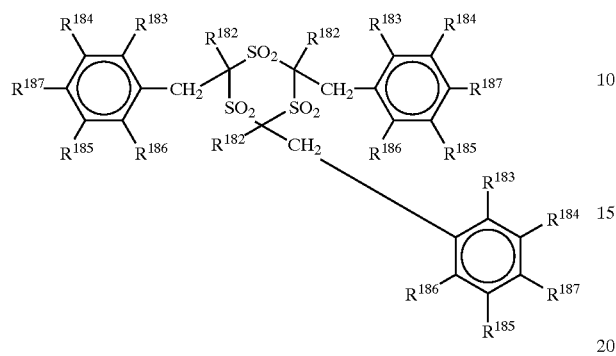

wherein $R^{182}$ represents a hydrogen atom or an alkyl group, provided that all of $R^{182}$ may not be the same;

$R^{183}$, $R^{184}$, $R^{185}$ and $R^{186}$ each represents a hydroxyl group, a hydrogen atom, a halogen atom, an alkyl group, or an alkoxyl group, provided that three substituents under the same symbol may not be the same group; and at least two of $R^{187}$ represent an —O—$R^0$—COO—C($R^{01}$)($R^{02}$)($R^{03}$) group or an —O—CO—O—C($R^{01}$)($R^{02}$)($R^{03}$) group, and the other represent a hydroxyl group.

The specific examples of preferred compound skeletons are shown below.

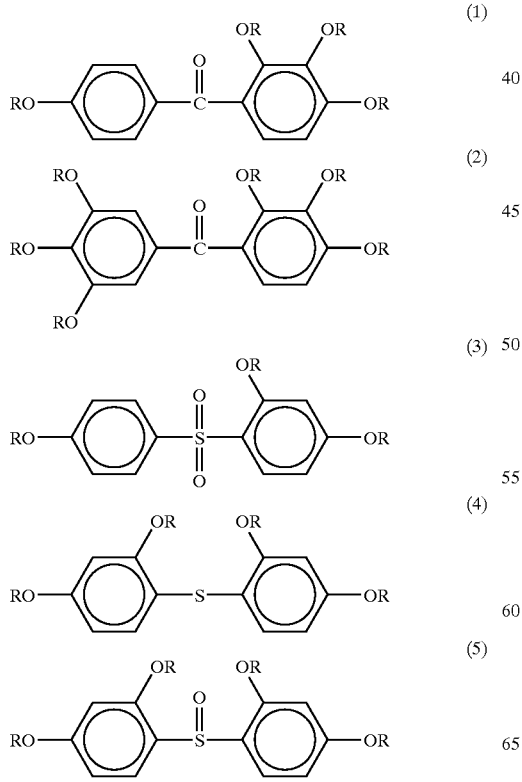

(6)

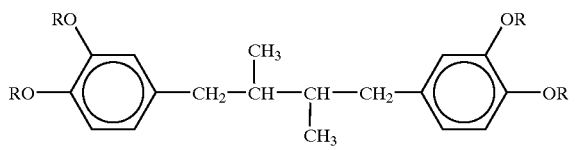

(7)

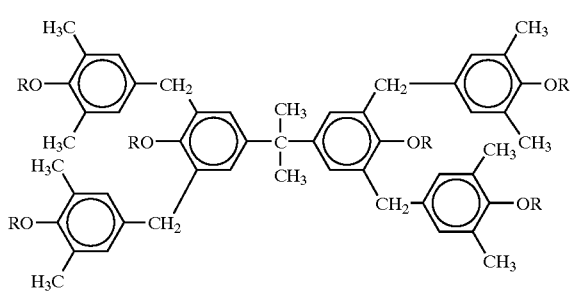

(8)

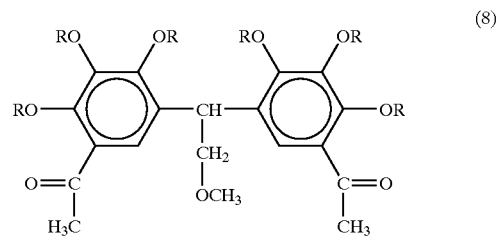

(9)

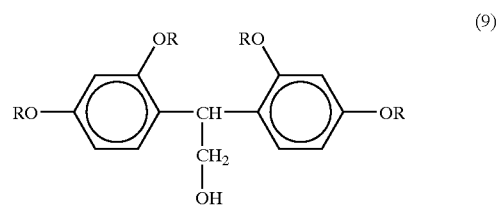

(10)

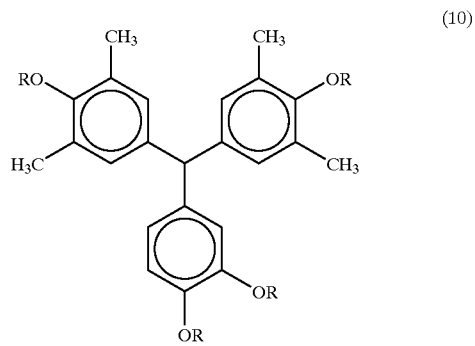

(11)

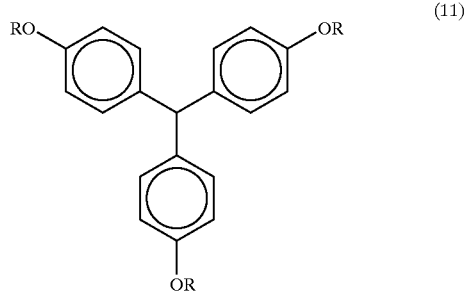

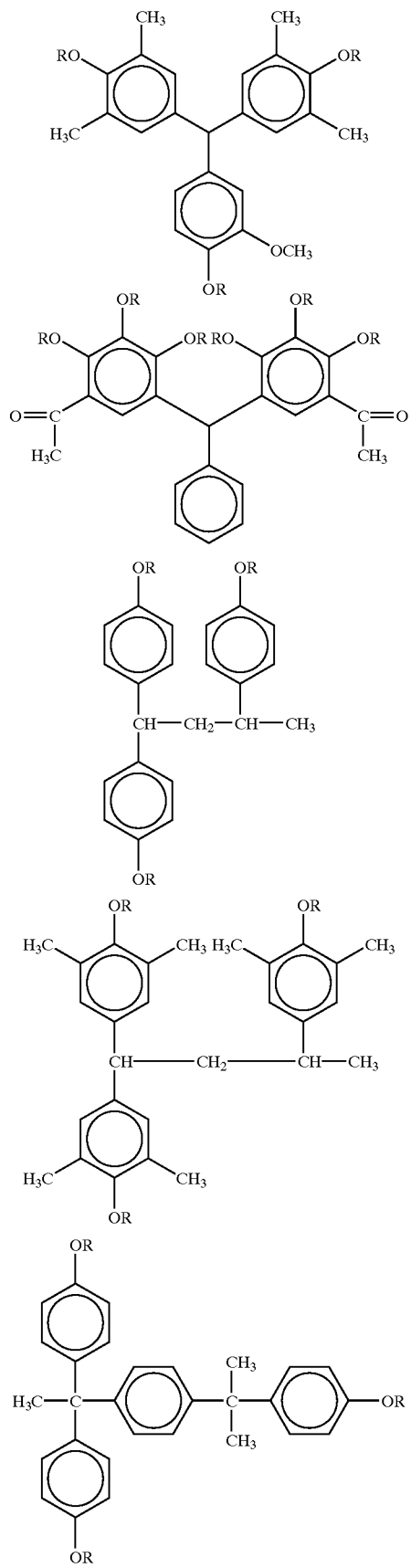
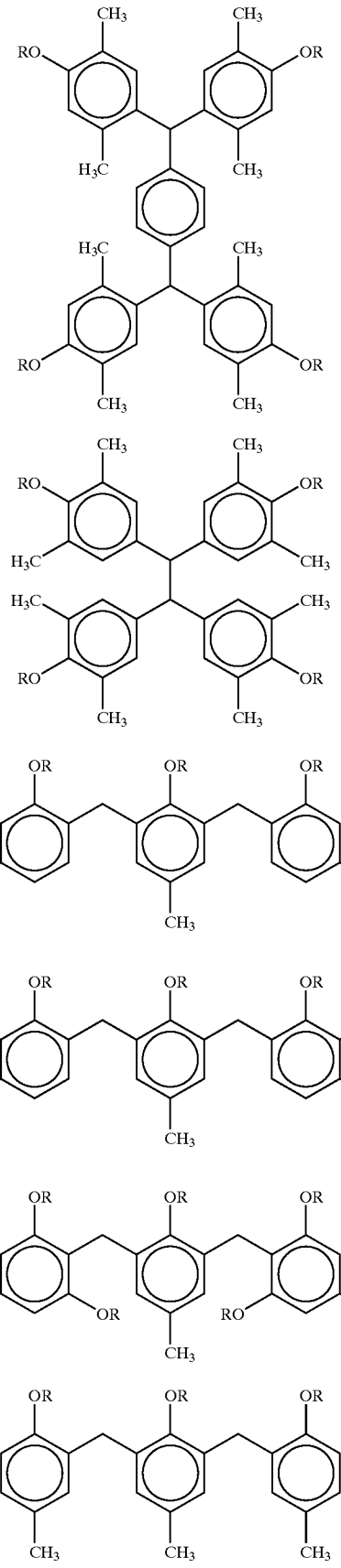

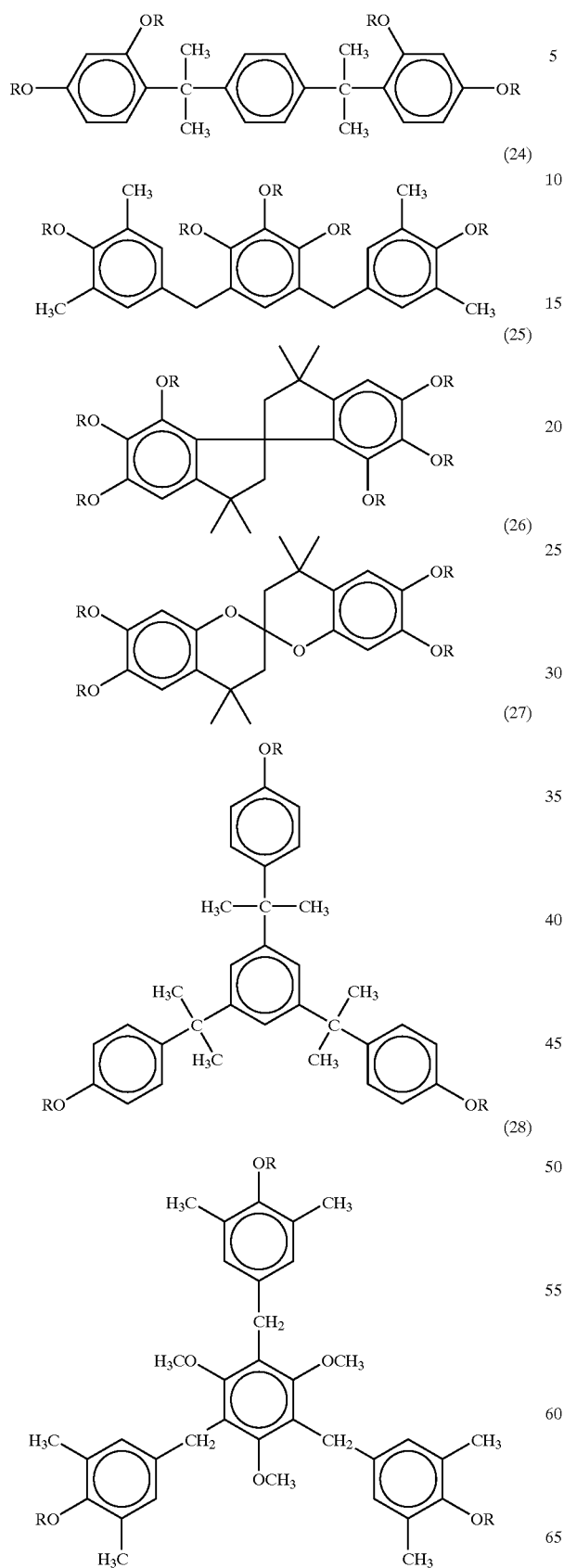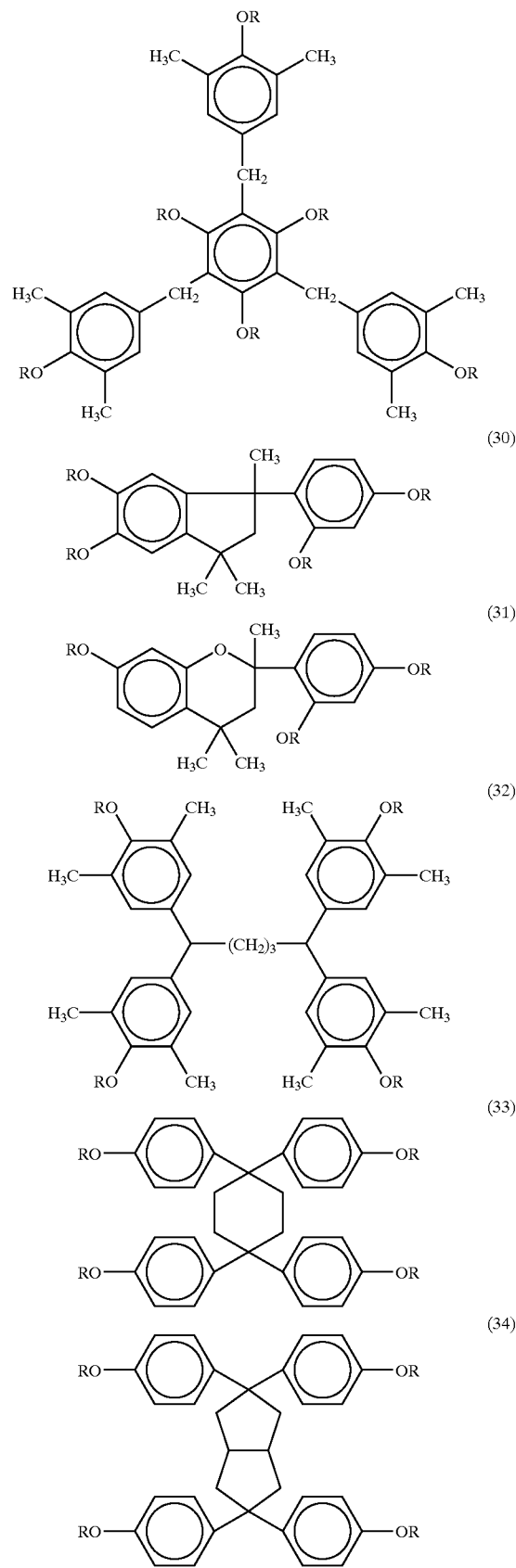

(35)
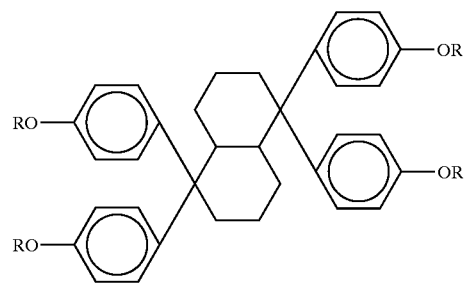
(36)
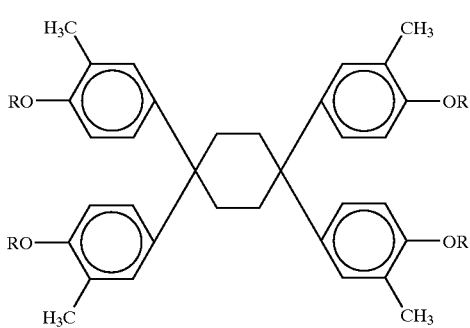
(37)
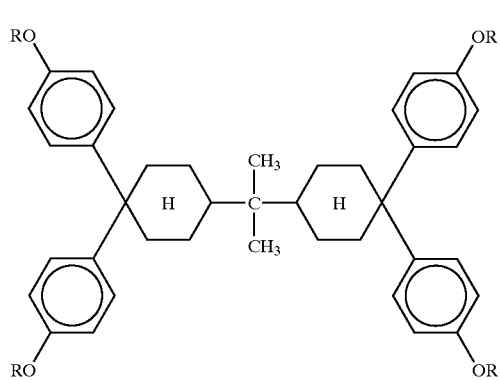
(38)
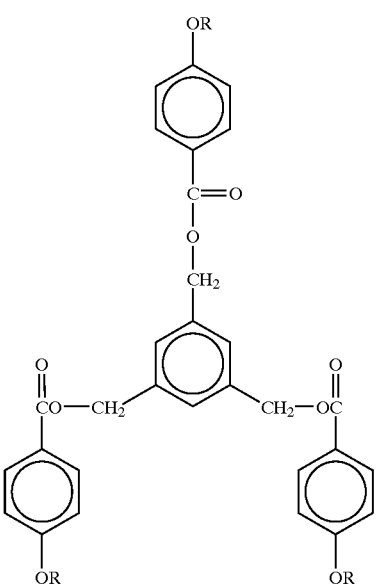
(39)
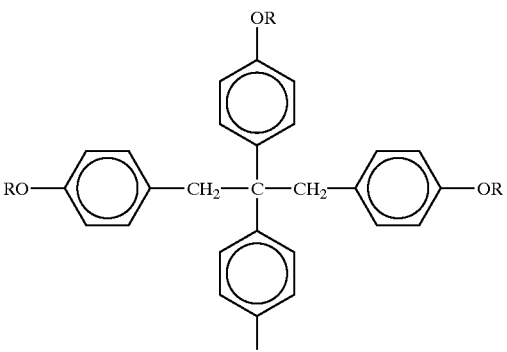
(40)
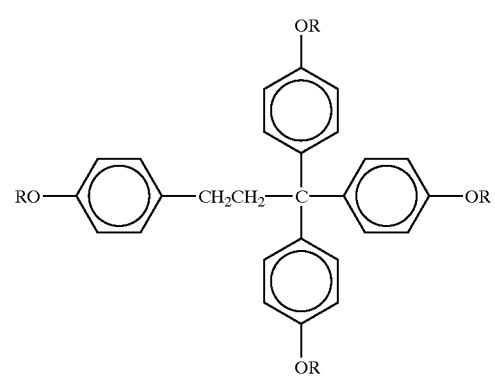
(41)
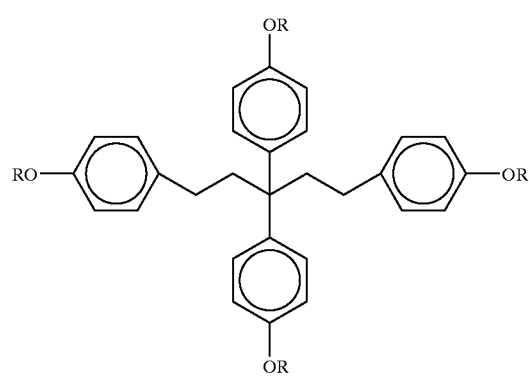
(42)
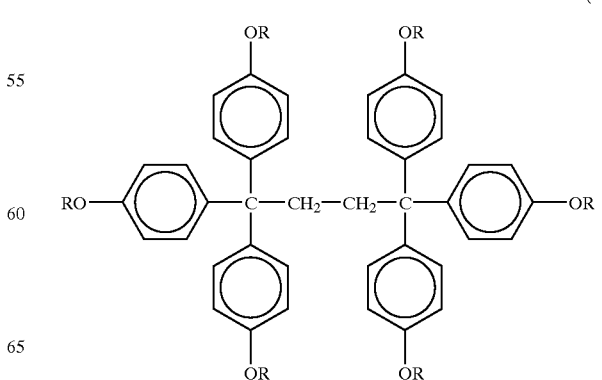

-continued

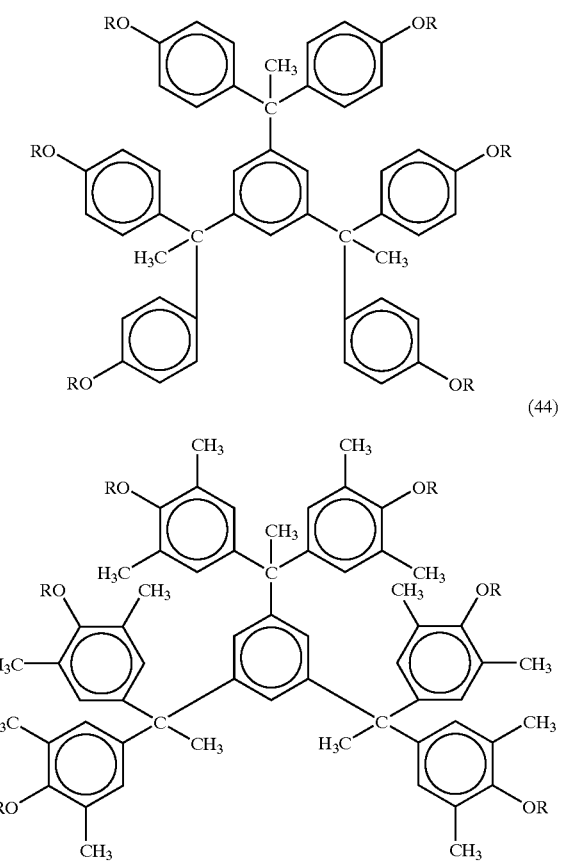

In formulae (1) to (44), R represents a hydrogen atom,

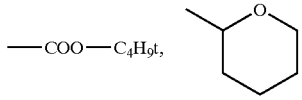

provided that at least two R groups, or three according to the structure, represent a group other than a hydrogen atom, and that each substituent R may not be the same group.

(g) A Resin Insoluble in Water and Soluble in an Alkali Developer (Hereinafter Also Referred to as "Component (g)" or "Alkali-soluble Resin (g)")

A resin which is insoluble in water and soluble in an alkali aqueous solution can be used as component (g) in the positive resist composition of the present invention. When component (g) is used, component (e) a resin having a group capable of decomposing by an acid to increase the solubility in an alkali developer by the action of an acid is not always necessary. Of course component (e) can be used in combination with component (g).

The examples of alkali-soluble resin (g) for use in the present invention include novolak resin, hydrogenated novolak resin, acetone-pyrogallol resin, poly(o-hydroxystyrene), poly(m-hydroxystyrene), poly(p-hydroxystyrene), hydrogenated poly(hydroxystyrene), halogen- or alkyl-substituted poly(hydroxystyrene), copolymer of hydroxystyrene and N-substituted maleimide, copolymer of o/p-hydroxystyrene and m/p-hydroxystyrene, poly(hydroxystyrene) whose hydroxyl groups are partially O-alkylated (e.g., O-methylated, O-(1-methoxy)ethylated, O-(1-ethoxy)ethylated, O-2-tetrahydropyranylated, and O-(t-butoxycarbonyl)methylated in a proportion of from 5 to 30 mol %), or O-acylated (e.g., O-acetylated, O-(t-butoxy) carbonylated in a proportion of from 5 to 30 mol %), styrene-maleic anhydride copolymer, styrene-hydroxystyrene copolymer, α-methylstyrene-hydroxystyrene copolymer, carboxyl group-containing methacrylate resin and derivatives thereof, and polyvinyl alcohol derivatives. However, these examples should not be construed as limiting the scope of the present invention.

Of these alkali-soluble resins as component (g), novolak resin, poly(o-hydroxystyrene), poly(m-hydroxystyrene), poly(p-hydroxystyrene), and copolymers of o-, m- and p-hydroxystyrenes, alkyl-substituted poly(hydroxystyrene), partially O-alkylated or O-acylated poly(hydroxystyrene), styrene-hydroxystyrene copolymer, and α-methyl-styrene-hydroxystyrene copolymer are more preferred. The novolak resin can be obtained by subjecting the prescribed monomers as main components and aldehyde to addition condensation in the presence of an acid catalyst.

The examples of the prescribed monomers include phenol; cresols, e.g., m-cresol, p-cresol, and o-cresol; xylenols, e.g., 2,5-xylenol, 3,5-xylenol, 3,4-xylenol, and 2,3-xylenol; alkylphenols, e.g., m-ethylphenol, p-ethylphenol, o-ethylphenol, p-t-butylphenol, p-octylphenol, and 2,3,5-trimethylphenol; alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol; bisalkylphenols, e.g., 2-methyl-4-isopropylphenol; and aromatic hydroxy compounds, e.g., m-chlorophenol, p-chlorophenol, o-chlorophenol, dihydroxybiphenyl, bisphenol A, phenylphenol, resorcinol and naphthol. These monomers can be used alone or in combinations of two or more, but the monomers are not limited to these examples.

The examples of the aldehydes for use in the present invention include formaldehyde, paraformaldehyde, acetaldehyde, propionaldehyde, benzaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetal forms thereof, e.g., chloroacetaldehyde diethylacetal. Of these aldehydes, formaldehyde is preferably used.

These aldehydes may be used alone or in combination of two or more. The useful acid catalysts which can be used include hydrochloric acid, sulfuric acid, formic acid, acetic acid, and oxalic acid.

The preferred weight average molecular weight of the novolak resin is from 1,000 to 30,000. When the weight average molecular weight is less than 1,000, great reduction in the resist film thickness is caused in the unexposed area by development, while when the weight average molecular weight exceeds 30,000, the developing speed is reduced. The especially preferred range is from 2,000 to 20,000.

Further, the weight average molecular weight of resins other than novolak resin, such as the above-described polyhydroxystyrene, derivatives thereof, and copolymers is 2,000 or more, preferably from 5,000 to 20,000, and more preferably from 5,000 to 10,000.

The weight average molecular weight used herein is defined as the value measured by gel permeation chromatography and calculated in terms of polystyrene.

In the present invention, alkali-soluble resin (g) may be used in combination of two or more.

(h) A cyclic ether compound for use in the resist composition in the second embodiment of the present invention are described in detail below.

As cyclic ether compounds (h), dioxanes such as 4-phenyl-1-3-dioxane, and oxetanes such as 3,3-bischloromethyloxetane can be used in the present invention.

Further, glycidyl ethers such as allyl glycidyl ether and phenyl glycidyl ether, glycidyl esters such as glycidyl acrylate and glycidyl methacrylate, bisphenol A type epoxy resin such as commercially available product as trade name of Epicote, tetrabromobisphenol A type epoxy resin, bisphenol F type epoxy resin, phenol novolak type epoxy resin, and cresol novolak type epoxy resin can also be used.

A compound having a partial structure represented by the following formula (X) or (Y) is more preferably used as cyclic ether compound (h) for exhibiting the effect of the present invention more conspicuously.

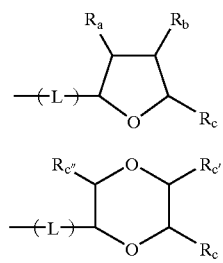

wherein $R_a$, $R_b$, $R_c$, $R_{c'}$ and $R_{c''}$, which may be the same or different, each represents a hydrogen atom, a substituted or unsubstituted alkyl group or a substituted or unsubstituted aryl group, and two of them may be bonded to form a saturated or olefinic unsaturated ring; and L represents a divalent linking group.

In formulae (X) and (Y), when $R_a$, $R_b$, $R_c$, $R_{c'}$ and $R_{c''}$ represent an aryl group, the aryl group generally has from 4 to 20 carbon atoms, and may be substituted with an alkyl group, an aryl group, an alkoxyl group, an aryloxy group, an acyl group, an acyloxy group, an alkylmercapto group, an aminoacyl group, a carboalkoxy group, a nitro group, a sulfonyl group, a cyano group, or a halogen atom.

As the aryl group having from 4 to 20 carbon atoms, e.g., a phenyl group, a tolyl group, a xylyl group, a biphenyl group, a naphthyl group, an anthryl group and a phenanthryl group can be exemplified.

When $R_a$, $R_b$, $R_c$, $R_{c'}$ and $R_{c''}$ represent an alkyl group, the alkyl group is a saturated or unsaturated, straight chain, branched or alicyclic alkyl group having from 1 to 20 carbon atoms, and may be substituted with a halogen atom, a cyano group, an ester group, an oxy group, an alkoxyl group, an aryloxy group or an aryl group.

As the saturated or unsaturated, straight chain, branched or alicyclic alkyl group having from 1 to 20 carbon atoms, a methyl group, an ethyl group, a propyl group, an isopropyl group, a butyl group, an isobutyl group, a t-butyl group, a pentyl group, an isopentyl group, a neopentyl group, a hexyl group, an isohexyl group, an octyl group, an isooctyl group, a nonyl group, a decyl group, an undecyl group, a dodecyl group, a tridecyl group, a tetradecyl group, a vinyl group, a propenyl group, a butenyl group, a 2-butenyl group, a 3-butenyl group, an isobutenyl group, a pentenyl group, a 2-pentenyl group, a hexenyl group, a heptenyl group, an octenyl group, a cyclopropyl group, a cyclobutyl group, a cyclopentyl group, a cyclohexyl group, a cycloheptyl group, a cyclooctyl group, a cyclopentenyl group, and a cyclohexenyl group can be exemplified.

The saturated or olefinic unsaturated ring formed by any two of $R_a$, $R_b$, $R_c$, $R_{c'}$ and $R_{c''}$ by bonding, specifically a cycloalkane or cycloalkene ring, is generally a 3 to 8-membered ring, preferably a 5- or 6-membered ring.

As the divalent linking group represented by L, a single bond, an alkylene, cycloalkylene or arylene group which may have a substituent, $-O-$, $-O-CO-R_{a1}-$, $-CO-O-R_{a2}-$, and $-CO-N(R_{a3})-R_{a4}-$ are exemplified.

$R_{a1}$, $R_{a2}$ and $R_{a4}$, which may be the same or different, each represents a single bond, an alkylene, cycloalkylene or arylene group which may have an ether structure, an ester structure, an amide structure, a urethane structure or a ureido structure, and may have a substituent.

$R_{a3}$ represents a hydrogen atom or an alkyl, cycloalkyl or aryl group, which may have a substituent.

In formulae (X) and (Y), $R_a$, $R_b$, $R_c$, $R_{c'}$ and $R_{c''}$ preferably each represents a hydrogen atom, or an alkyl group having from to 4 carbon atoms.

The specific examples of the compounds having the partial structure represented by formula (X) or (Y) are shown below but the present invention is not limited thereto.

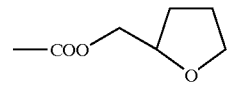

(X-1)

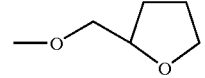

(X-2)

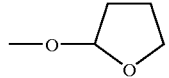

(X-3)

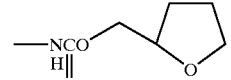

(X-4)

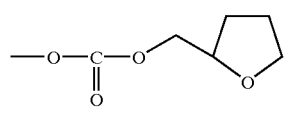

(X-5)

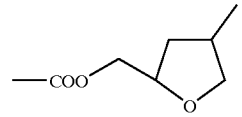

(X-6)

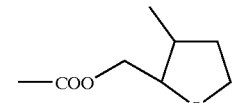

(X-7)

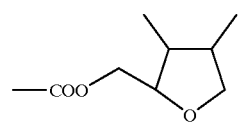

(X-8)

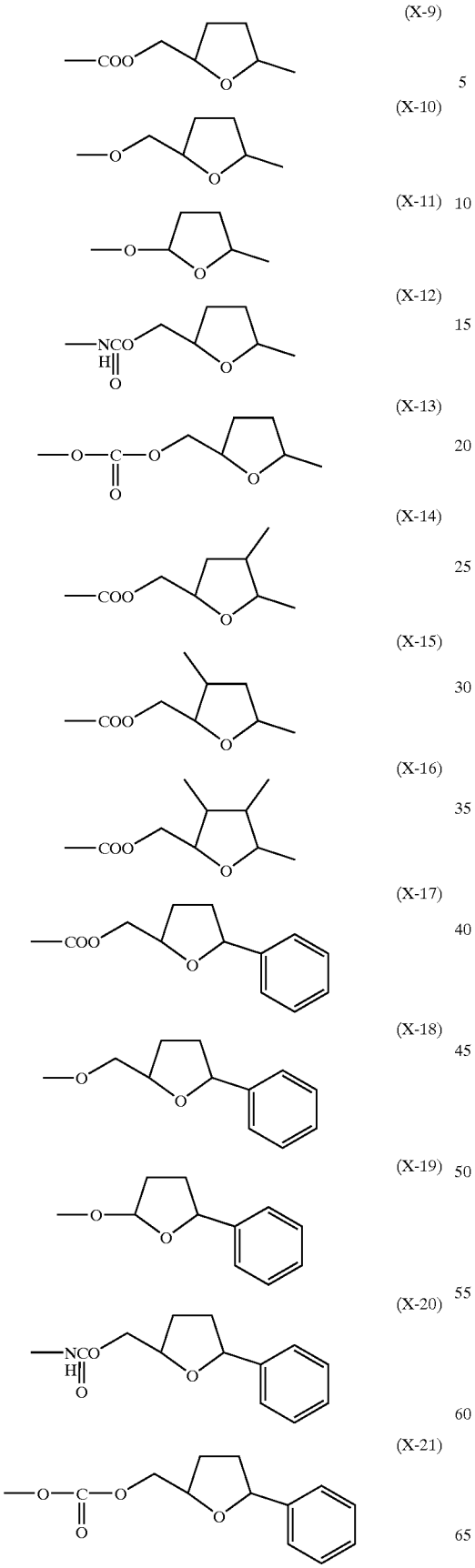
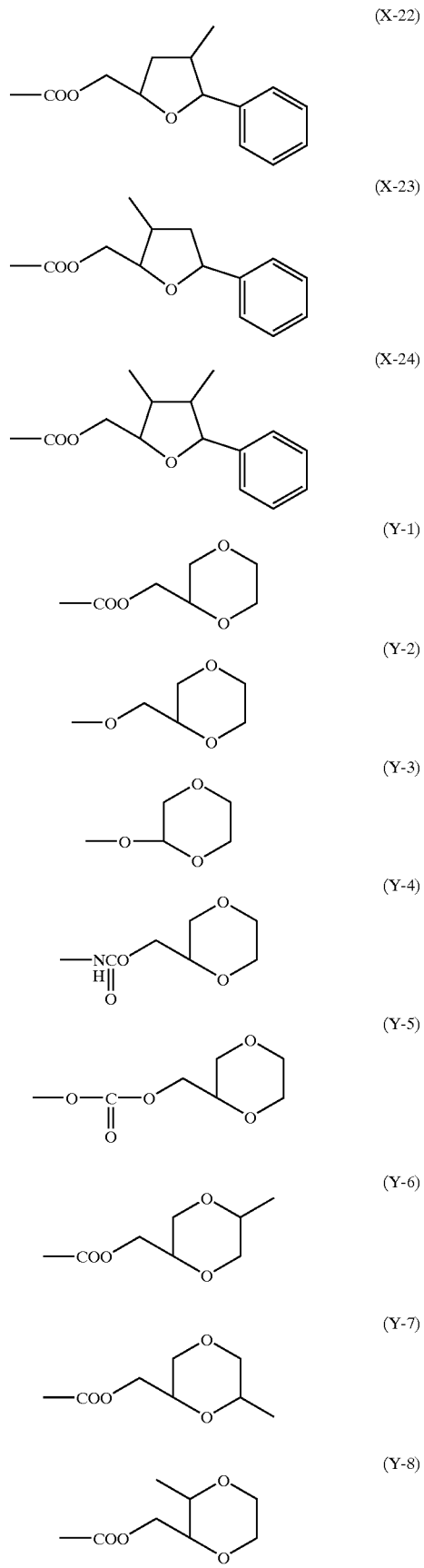

-continued

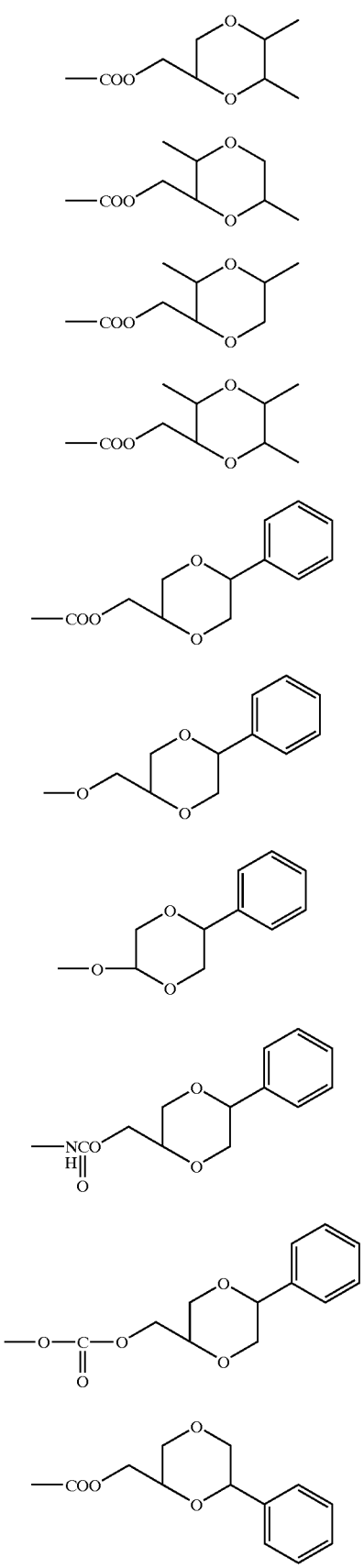

(Y-9)
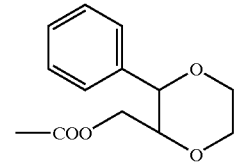

(Y-19)
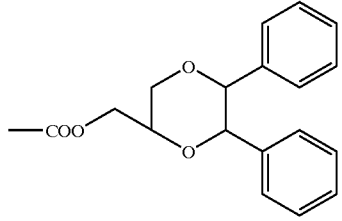

(Y-20)
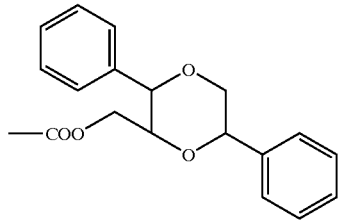

(Y-21)
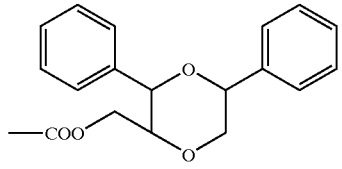

(Y-22)
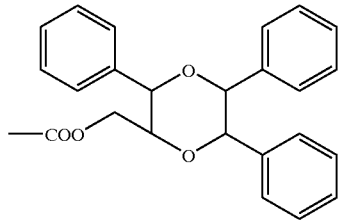

(Y-23)
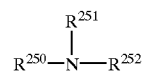

The addition amount of the cyclic ether compound (preferably the compound represented by formula (X) or (Y)) in the resist composition of the present invention is preferably from 0.5 to 50 wt % based on the entire weight of the composition (solid contents), more preferably from 3 to 30 wt %.

(c) Organic Basic Compound

Preferred organic basic compound (c) that can be used in the present invention is a compound having stronger basicity than a phenol. A nitrogen-containing basic compound is preferred above all.

Structures represented by the following formulae (A) to (E) can be exemplified as preferred chemical environment.

(A)
$$R^{250}-N\underset{\underset{R^{251}}{|}}{}-R^{252}$$

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be bonded to each other to form a ring.

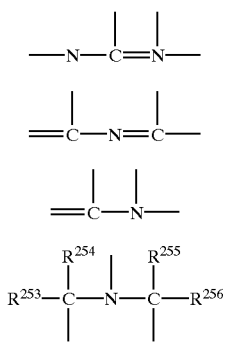

wherein $R^{253}$, $R^{254}$, $R^{255}$ and $R^{256}$, which may be the same or different, each represents an alkyl group having from 1 to 6 carbon atoms.

The compound is more preferably a nitrogen-containing basic compound having two or more nitrogen atoms different in the chemical environment in one molecule, and particularly preferably a compound containing both a substituted or unsubstituted amino group and a ring structure containing a nitrogen atom, or a compound containing an alkylamino group.

The preferred specific examples of such compounds include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine. The examples of the preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group, and a cyano group.

The particularly preferred examples of organic basic compound (c) include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, diazabicyclononene, 1,8-diazabicyclo[5.4.0]undeca-7-ene, 1,5-diazabicyclo[4.3.0]nona-5-ene, and 2,4,5-triphenylimidazole. Of these compounds, 1,8-diazabicyclo[5.4.0]undeca-7-ene, 1,5-diazabicyclo[4.3.0]-nona-5-ene, and 2,4,5-triphenylimidazole are particularly preferred, however, the present invention is not limited to these compounds.

These organic basic compounds (c) can be used alone or two or more of them can be used in combination. The proportion of the organic basic compound is generally from 0.01 to 10 mol %, preferably from 0.1 to 5 mol %, based on the content of (b1) or (b) component. The effect of component (c) cannot be obtained when the use amount is less than 0.01 mol %, while when the addition amount exceeding 10 mol % may cause a decrease in sensitivity and deterioration of developing property in the unexposed areas.

The constitution examples of the resist composition in the first embodiment of the present invention are shown below. However, these examples should not be construed as limiting the scope of the present invention.

1-1) Positive chemical amplification resist composition comprising component (a), component (b), component (c), and component (e).

1-2) Positive chemical amplification resist composition comprising component (a), component (b), component (c), component (f), and component (g).

1-3) Positive chemical amplification resist composition comprising component (a), component (b), component (c), component (e), and component (f).

The constitution examples of the resist composition in the second embodiment of the present invention are shown below. However, these examples should not be construed as limiting the scope of the present invention.

2-1) Positive electron beam or X-ray resist composition comprising component (b1), component (h), component (c), and component (e).

2-2) Positive electron beam or X-ray resist composition comprising component (b1), component (h), component (c), component (f), and component (g).

2-3) Positive electron beam or X-ray resist composition comprising component (b1), component (h), component (c), component (e), and component (f).

In each of the above constitution examples, the use amount of component (e) in item 1-1) and 2-1), the amount of component (g) in item 1-2) and 2-2), and the amount of component (e) in item 1-3) and 2-3) in the composition are preferably from 40 to 99 wt %, more preferably from 50 to 90 wt %, each based on the solid content of the entire composition.

The use amount of component (f) in the composition is preferably from 3 to 45 wt %, more preferably from 5 to 30 wt %, and still more preferably from 10 to 30 wt %, based on the solid content of the entire composition, in any of the above constitution examples.

[VII] (d) A Surfactant Containing at Least One of a Fluorine Atom and a Silicon Atom (Surfactant (d))

The surfactant (d) can be used in the present invention as component (d). The examples of fluorine-containing surfactants and silicon-containing surfactants include, e.g., Eftop EF301 and EF303 (manufactured by Shin-Akita Chemical Co., Ltd.), Florad FC430 and FC431 (manufactured by Sumitomo 3M Co., Limited), Megafac F171, F173, F176, F189 and R08 (manufactured by Dainippon Ink & Chemicals, Co., Ltd.), Sarfron S-382, SC-101, SC-102, SC-103, SC-104, SC-105 and SC-106 (manufactured by Asahi Glass Co., Ltd.), and Troy Sol S-366 (manufactured by Troy Chemical Inc.) can be exemplified. Polysiloxane polymer KP-341 (manufactured by Shin-Etsu Chemical Co., Ltd.) can also be used as the silicon-containing surfactant.

Surfactants other than fluorine- and/or silicon-containing surfactants can also be used in combination. The specific examples of other surfactants which can be used in the present invention include nonionic surfactants such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylaryl ethers (e.g., polyoxyethylene octylphenol ether, and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate), and acrylic acid or methacrylic acid (co)polymers Polyflow No. 75, No. 95 (Kyoei-Sha Oils and Fats Chemical Industries Co., Ltd.).

The proportion of surfactant (d) is generally from 0.001 to 2 wt %, preferably from 0.01 to 1 wt %, based on the entire solid content in the resist composition according to the present invention.

These surfactants may be used alone or two or more surfactants may be used in combination.

[VIII] Other Components for Use in the Present Invention

The positive resist composition according to the present invention can further contain, if necessary, dyes, pigments, plasticizers, photosensitizers, and compounds having two or more phenolic OH groups which accelerate solubility in a developing solution.

The compounds having two or more phenolic OH groups which can be used in the present invention are phenolic compounds preferably molecular weight of 1,000 or less. It is necessary for these compounds to have at least two phenolic hydroxyl groups in the molecule, but when the number of the phenolic hydroxyl groups exceeds 10, improving effect of development latitude is lost. Further, if the ratio of the phenolic hydroxyl groups to the aromatic ring is less than 0.5, the dependency on the film thickness becomes large and development latitude is liable to be narrow. When this ratio exceeds 1.4, the stability of the composition is reduced, and high resolving power and excellent film thickness dependency are obtained with difficulty.

The preferred addition amount of the phenol compound is preferably from 2 to 50 wt %, more preferably from 5 to 30 wt %, based on the weight alkali-soluble resin (g). When the proportion of the phenol compound exceeds 50 wt %, development residue becomes noticeable and a new drawback of pattern deformation disadvantageously occurs during development.

Such a phenol compound having a molecular weight of 1,000 or less can be easily produced with referring to the methods disclosed, e.g., in JP-A-4-122938, JP-A-2-28531, U.S. Pat. No. 4,916,210, and EP 219294.

The specific examples of phenol compounds are shown below but the present invention is not limited thereto.

There can be excited resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucocide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4-($\alpha$-methylbenzylidene)bisphenol, $\alpha,\alpha',\alpha''$-tris(4-hydroxyphenyl)-1,3,5-triisopropylbenzene, $\alpha,\alpha',\alpha''$-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris-(hydroxyphenyl)butane, and p-[$\alpha,\alpha,\alpha',\alpha''$-tetrakis(4-hydroxyphenyl)]xylene.

Each component of the composition of the present invention is dissolved in a solvent to prepare a coating solution and coated on a substrate. The examples of the solvents preferably used in the present invention include ethylene dichloride, cyclohexanone, cyclopentanone, 2-heptanone, $\gamma$-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, propylene glycol monomethyl ether propionate, toluene, ethyl acetate, methyl lactate, ethyl lactate, methylmethoxy propionate, ethylethoxy propionate, methyl pyruvate, ethyl pyruvate, propyl pyruvate, N,N-dimethylformamide, dimethyl sulfoxide, N-methylpyrrolidone, and tetrahydrofuran. These solvents can be used alone or in combination of two or more.

Of the solvents exemplified above, propylene glycol monomethyl ether acetate (PGMEA) is particularly preferably used and excellent in-plane uniformity can be obtained. The solvent preferably contains PGMEA in an amount of 10 wt % to 100 wt % based on total amount of the solvent, more preferably 20 wt % to 90 wt %, still more preferably 30 wt % to 80 wt %.

In the course of searching for further progress of the semiconductor, in addition to essential performance of the resist, such as high resolution, compositions having high performances come to be required from various viewpoints, such as sensitivity, a coating property, a required minimum coating amount, an adhering property to a substrate, heat resistance, and the storage stability of composition.

A tendency to use a big sized wafer to make a device is seen lately to increase the absolute amount of finished chips to be obtained.

However, when a big sized wafer is coated, since there is some fear of the reduction of a coating property, in particular, the in-plane uniformity of film thickness, the improvement of the in-plane uniformity of film thickness of a big sized wafer is required. The uniformity can be confirmed by measuring the film thickness of a water at many points in the wafer, taking the standard deviation of the measured values, and multiplying the standard deviation by 3. It can be said that the smaller the value, the higher is the in-plane uniformity. The value obtained by multiplying the standard deviation by 3 is preferably 100 or less, more preferably 50 or less.

Further, CD linearity is regarded as most important also in the production of a mask for photo-lithography, and the improvement of the in-plane uniformity of film thickness in blanks is required.

The resist composition of the present invention can be filtered after being dissolved in a solvent. The filter for use for this purpose is selected from among those used in the field of the resist, specifically materials containing polyethylene, nylon or polysulfone are used as the filter.

More specifically, Microgard, Microgard Plus, Microgard Minichem-D, Microgard Minichem-D PR, Millipore Optimizer DEV/DEV-C and Millipore Optimizer 16/14 (manufactured by MILLIPORE Co.), and Ultibore N66, Posidyne and Nylon Falcon (manufactured by Pole Co.) can be exemplified. The pore diameters of filters confirmed by the following method can be used. That is, PSL standard particles (polystyrene latex beads having a particle diameter of 0.100 µm) are dispersed in super pure water, continuously moved with a tube pump to the primary side of the filter at a constant rate, and challenge concentration is measured by a particle counter. Those capable of capturing 90% or more of the particles can be used as filters having a pore diameter of 0.1 µM.

After coating the positive resist composition of the present invention on a substrate as used in the production of precise integrated circuit elements (e.g., a silicon/silicon dioxide-coated substrate) or on a substrate as used in the production of masks for photo-lithography (e.g., a glass/Cr-coated substrate) by an appropriate coating method such as a spinner or a coater, the coated substrate is subjected to exposure through a predetermined mask, baking and then development, thereby a good resist pattern can be obtained.

Developing solutions such as alkaline aqueous solutions of inorganic alkalis, e.g., sodium hydroxide, potassium hydroxide, sodium carbonate, sodium silicate, sodium metasilicate, and aqueous ammonia; primary amines, e.g., ethylamine and n-propylamine; secondary amines, e.g., diethylamine and di-n-butylamine; tertiary amines, e.g., triethylamine and methyldiethylamine; alcohol amines, e.g., dimethyl ethanolamine and triethanolamine; quaternary ammonium salts, e.g., tetramethylammonium hydroxide and tetraethylammonium hydroxide; and cyclic amines, e.g., pyrrole and piperidine, can be used for the composition of the present invention.

The above alkaline aqueous solutions can further contain appropriate amounts of alcohols and surfactants.

EXAMPLE

The present invention is explained in more detail with reference to the following examples, but the present invention should not be construed as limiting the scope of the present invention.

Synthesis Example 1

Synthesis of Poly(p-hydroxystyrene/styrene) Copolymer p-tert-Butoxystyrene monomer (35.25 g) (0.2 mol) which had been dehydrated, distilled and purified according to ordinary manner, and 5.21 g (0.05 mol) of styrene monomer were dissolved in 100 ml of tetrahydrofuran. With stirring under nitrogen gas flow, 0.033 g of azobisisobutyronitrile (AIBN) was added to the above solution at 80° C. three times every 2.5 hours, then stirring was further continued for 5 hours to thereby perform polymerization reaction. The reaction solution was poured into 1,200 ml of hexane, as a result, a white resin was precipitated. The obtained resin after drying was dissolved in 150 ml of tetrahydrofuran.

4N hydrochloric acid was added to the above solution, refluxed with heating for 6 hours to thereby perform hydrolysis, this reaction product was reprecipitated in 5 liters of super-pure water, the resin was filtered, washed with water and dried. The resin was further dissolved in 200 ml of tetrahydrofuran, the solution was dropwise added to 5 liters of super-pure water with vigorously stirring, and reprecipitated. This procedure of reprecipitation was repeated 3 times. The thus-obtained resin was dried in a vacuum drier at 120° C. for 12 hours, thereby poly(p-hydroxystyrene/styrene) copolymer was obtained.

Synthesis Example 2

Synthesis of Exemplified Resin (c-21)

p-Acetoxystyrene (32.4 g) (0.2 mol) and 7.01 g (0.07 mol) of t-butyl methacrylate were dissolved in 120 ml of butyl acetate. With stirring under nitrogen gas flow, 0.033 g of azobisisobutyronitrile (AIBN) was added to the above solution at 80° C. three times every 2.5 hours, then stirring was further continued for 5 hours to thereby perform polymerization reaction. The reaction solution was poured into 1,200 ml of hexane, as a result, a white resin was precipitated. The obtained resin after drying was dissolved in 200 ml of methanol.

An aqueous solution of 50 ml of water containing 7.7 g (0.19 mol) of sodium hydroxide was added to the above solution, refluxed with heating for 1 hour to thereby perform hydrolysis. Then, 200 ml of water was added to dilute the reaction product, neutralized with hydrochloric acid, thereby a white resin was precipitated. The resin was filtered, washed with water and dried. The resin was further dissolved in 200 ml of tetrahydrofuran, the solution was dropwise added to 5 liters of super-pure water with vigorously stirring, and reprecipitated. This procedure of reprecipitation was repeated 3 times. The thus-obtained resin was dried in a vacuum drier at 120° C. for 12 hours, thereby poly(p-hydroxystyrene/t-butyl methacrylate) copolymer was obtained.

Synthesis Example 3

Synthesis of Exemplified Resin (c-3)

Poly(p-hydroxystyrene) (10 g) (VP-8000, manufactured by Nippon Soda Co. Ltd.) was dissolved in 50 ml of pyridine. Di-t-butyldicarbonate (3.63 g) was dropwise added to this solution with stirring at room temperature.

After stirring for 3 hours at room temperature, the reaction solution was dropwise added to a solution of 1 liter of ion exchange water containing 20 g of concentrated hydrochloric acid. The powder precipitated was filtered, washed with water and dried, thereby exemplified resin (c-3) was obtained.

Synthesis Example 4

Synthesis of Exemplified Resin (c-33)

p-Cyclohexylphenol (83.1 g) (0.5 mol) was dissolved in 300 ml of toluene. Subsequently, 150 g of 2-chloroethyl vinyl ether, 25 g of sodium hydroxide, 5 g of tetrabutylammonium bromide, and 60 g of triethylamine were added to the above solution and the solution was allowed to react at 120° C. for 5 hours. The reaction solution was washed with water and the excess amounts of chloroethyl vinyl ether and toluene were distilled off. The obtained oil was purified by distillation under reduced pressure, thereby 4-cyclohexylphenoxyethyl vinyl ether was obtained.

Poly(p-hydroxystyrene) (20 g) (VP-8000, manufactured by Nippon Soda Co. Ltd.) and 6.5 g of 4-cyclohexylphenoxyethyl vinyl ether were dissolved in 80 ml of THF, and 0.01 g of p-toluenesulfonic acid was added to the above solution and the solution was allowed to react at room temperature for 18 hours. The reaction solution was dropwise added to 5 liters of distilled water with vigorously stirring. The powder precipitated was filtered and dried, thereby exemplified resin (c-33) was obtained.

Exemplified resins (c-4), (c-28) and (c-30) were also synthesized by the same manner as above using each corresponding matrix polymer and vinyl ether.

Resins (c-3)', (c-33)', (c-4)', (c-28)' and (c-30)' were obtained by the same procedure as above except for using poly(p-hydroxystyrene) VP-5000 (manufactured by Nippon Soda Co. Ltd.) in place of poly(p-hydroxystyrene) VP-8000 (manufactured by Nippon Soda Co. Ltd.).

Polymer (poly(p-hydroxystyrene/styrene) copolymer (2)) (c-21)' having a reduced molecular weight to about 60% was obtained by adjusting the amount of the initiator.

Synthesis Example 1 of Dissolution Inhibiting Compound

Synthesis of Exemplified Compound 16

Forty-two point four (42.4) grams (0.10 mol) of 1-[α-methyl-α-(4'-hydroxyphenyl)ethyl]-4-[α',α'-bis(4"-hydroxyphenyl)ethyl]benzene was dissolved in 300 ml of N,N-dimethylacetamide, and thereto were added 49.5 g (0.35 mol) of potassium carbonate and 84.8 g (0.33 mol) of cumyl ester bromoacetate. Then, the reaction solution was stirred at 120° C. for 7 hours. The reaction mixture was put in 2 liters of ion exchange water, neutralized with acetic acid, and extracted with ethyl acetate. The ethyl acetate extract was concentrated and purified, thereby 70 g of compound 16 was obtained (R was all —$CH_2COOC(CH_3)_2C_6H_5$ groups).

Synthesis Example 2 of Dissolution Inhibiting Compound

Synthesis of Exemplified Compound 41

Forty-four (44) grams of 1,3,3,5-tetrakis(4-hydroxyphenyl)pentane was dissolved in 250 ml of N,N-dimethylacetamide, and thereto were added 70.7 g of potassium carbonate and 90.3 g of t-butyl bromoacetate in order, and the reaction solution was stirred at 120° C. for 7 hours. The reaction mixture was put in 2 liters of ion exchange water, and the obtained viscous product was washed with water, and purified by column chromatography, thereby 87 g of compound 41 was obtained (R was all —$CH_2COOC_4H_9(t)$)

Synthesis Example 3 of Dissolution Inhibiting Compound

Synthesis of Exemplified Compound 43

Twenty (20) grams of α,α,α',α',α",α"-hexakis(4-hydroxyphenyl)-1,3,5-triethylbenzen e was dissolved in 400 ml of diethyl ether. To this solution were added 42.4 g of 3,4-dihydro-2H-pyran and a catalytic amount of hydrochloric acid under nitrogen atmosphere, and the solution was refluxed for 24 hours. After the reaction was terminated, a small amount of sodium hydroxide was added and the solution was filtered. The filtrate was concentrated, and purified by column chromatography, thereby 55.3 g of compound 43 was obtained (R was all THP groups).

Synthesis Example 4 of Dissolution Inhibiting Compound

Synthesis of Exemplified Compound 43-2

Twenty (20) grams of α,α,α',α',α",α"-hexakis(4-hydroxyphenyl)-1,3,5-triethylbenzen e was dissolved in 200 ml of N,N-dimethylacetamide. To this solution were added 28.2 g of potassium carbonate and 36.0 g of butyl bromoacetate, and the solution was stirred at 120° C. for 7 hours. The reaction product was put in 2 liters of ion exchange water, and the obtained viscous product was washed with water, and purified by column chromatography, thereby 37 g of compound 43-2 was obtained (R was all —$CH_2COOC_4H_9(t)$)

Synthesis of (a) a Compound Which Directly or Indirectly Generates Radical (A) on Irradiation with an Energy Ray

Synthesis 1

Equimolar amount of 2-bromomethyl-1,3-dioxolan and terephthalic acid were mixed, five times the mol of potassium carbonate was added thereto, and reaction was performed at 60° C. Water was added to the mixture and the mixed product was extracted with ethyl acetate. The ethyl acetate extract was washed with water and dried, thereby compound (b-6) was obtained as a white solid.

Other compounds (b-7) and (b-8) were obtained in the same method.

Commercially available products were used as compounds (b-4), (b-9) to (b-40)

Each of compounds (b-4), (b-6) to (b-40) has the structural formula as shown below.

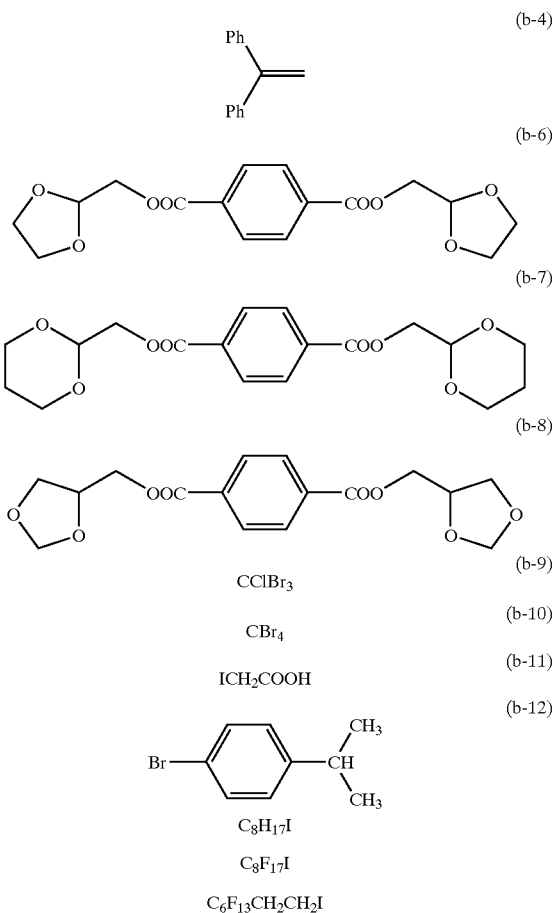

-continued (b-16) 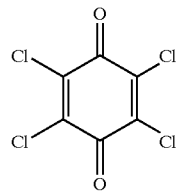

(b-17) 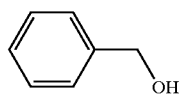

(b-19) 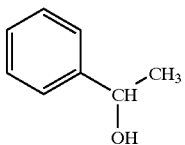

(b-21) C₁₈H₃₇SH (b-22) HS—CH₂CH₂COOH (b-24) HSCH₂CH₂OH (b-25) (CH₃)₃C—SH (b-27) C(CH₂—O—COCH₂SH)₄

(b-28) 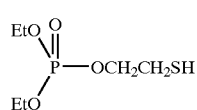

(b-29) 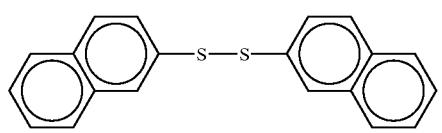

(b-30) 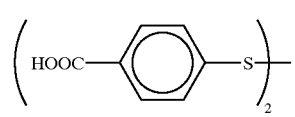

(b-31) 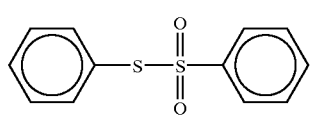

(b-32) C₈H₁₇SC₂H₅

(b-33) C₁₂H₂₅S—C(=O)—CH₃

(b-35) 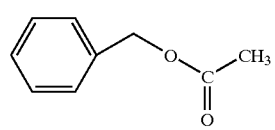

(b-36) 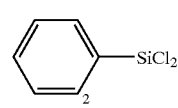

(b-37) Br₂CH₂COOC₂H₅

(b-38) Br₃CCOOC₂H₅

(b-39) 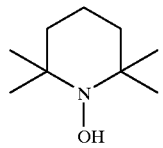

(b-40) 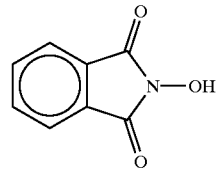

Synthesis Example of Cyclic Ether Compound

Synthesis Example 1

Synthesis of Compound A-3

Trimesic acid chloride (13.25 g) (0.05 mol) and 18.35 g (0.18 mol) of tetrahydrofurfuryl alcohol were dissolved in 150 ml of tetrahydrofuran. Triethylamine (20.23 g) (0.20 mol) was slowly added dropwise to the solution, and the solution was stirred at room temperature for 2 hours.

The reaction solution was extracted with ethyl acetate and water, the extract was washed with water and dried under reduced pressure, thereby 20.23 g of compound A-3 was obtained as a white solid.

Compounds A-1, A-2, A-4, A-5 and A-6 were synthesized in the same method.

A-1
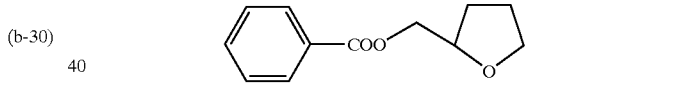

A-2
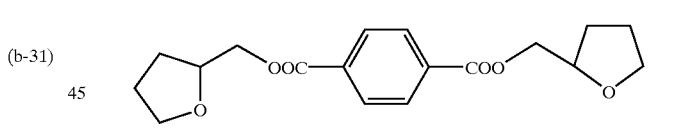

A-3
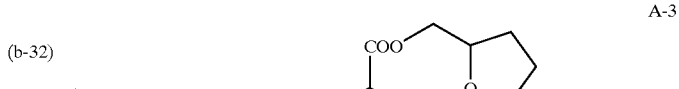

A-4
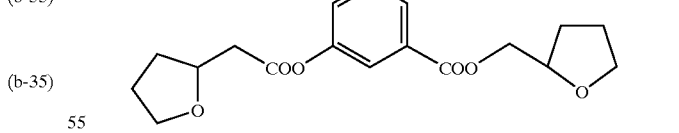

A-5
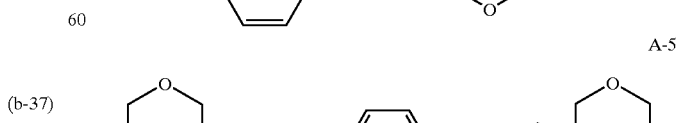

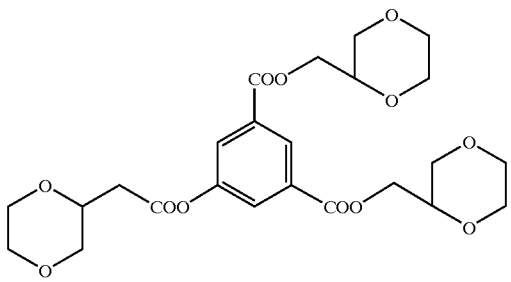

A-6

Examples 1 to 103 and Comparative Examples 1 to 6

(1) Coating of Resist

Components shown in Tables 1 to 7 below were dissolved in 8.2 g of propylene glycol monomethyl ether acetate, and the solution was filtered through a Teflon filter having a pore diameter of 0.1 μm. Thus, a resist solution was prepared. In the composition in Example 35, 8.2 g of ethyl lactate was used as the solvent.

Each sample solution was coated on a silicon wafer by a spin coater, and the coated layer was dried by a vacuum suction type hot plate at 110° C. for 90 seconds, thereby a resist film A having a film thickness of 0.5 μm was obtained.

Further, each sample solution was coated on a silicon wafer by a spin coater, and the coated layer was dried by a vacuum suction type hot plate at 110° C. for 90 seconds, thereby a resist film B having a film thickness of 0.4 μm was obtained.

(2) Formation of Resist Pattern

Each of resist film A and B was subjected to irradiation using an electron beam imaging apparatus (applied voltage: 50 KV).

After irradiation, the resist film was heated using a vacuum suction type hot plate (resist film A: 110° C. for 60 seconds, resist film B: 110° C. for 60 seconds), immersed in a 2.38% aqueous solution of tetramethylammonium hydroxide (TMAH) for 60 seconds, rinsed with water for 30 seconds, and dried.

The shapes of the cross sections of the obtained contact hole pattern (resist film A was used) and line-and-space pattern (resist film B was used) were observed by a scanning electron microscope.

(3) Evaluation of Sensitivity and Resolution

Critical resolution at the contact hole pattern (the minimum diameter of the hole) was taken as resolution, and the minimum dose capable of defining the critical resolution was taken as sensitivity.

Further, the dose required to define a 0.2 μm line-and-space in 1/1 pattern was taken as sensitivity, and the minimum size which could be defined by the dose was taken as resolution.

(4) Evaluation of PCD

The resist film obtained according to the above method (1) was allowed to stand in the electron beam imaging apparatus for 150 minutes under high vacuum, and a resist pattern was formed according to the method (2). The minimum contact hole size (diameter) or line-and-space of the formed resist pattern which could be defined by the same dose as the sensitivity obtained by the method of the above (3) (in this case, the resist film was irradiated immediately after formation without standing under high vacuum for 150 minutes after the resist film formation) were found. The closer the size and the critical resolution obtained in (3), the better is the PCD stability.

(5) Evaluation of PED

Evaluation was performed in the same manner as in the method (2) except that the resist film was allowed to stand in the electron beam imaging apparatus under high vacuum for 150 minutes after irradiation when the resist patter was formed. The minimum contact hole size (diameter) or line-and-space of the formed resist pattern which could be defined by the same dose as the sensitivity obtained by the method of (3) (in this case, the resist film was immediately heated after irradiation without standing under high vacuum for 150 minutes) were found. The closer the size and the critical resolution obtained in (3), the better is the PED stability.

TABLE 1

Resist Film A (contact hole)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 1 | III-1 (0.072) | PHS-2 (1.19) | b-4 (0.18) | (43-2) (0.36) | B-1 (0.004) | W-1 (1,000) |
| Example 2 | III-1 (0.072) | PHS-2 (1.19) | b-6 (0.18) | (43-2) (0.36) | B-1 (0.004) | W-1 (1,000) |
| Example 3 | III-1 (0.072) | PHS-2 (1.19) | b-7 (0.18) | (43-2) (0.36) | B-1 (0.004) | W-1 (1,000) |
| Example 4 | III-1 (0.072) | PHS-2 (1.19) | b-8 (0.18) | (43-2) (0.36) | B-1 (0.004) | W-1 (1,000) |
| Example 5 | III-1 (0.072) | PHS-2 (1.19) | b-9 (0.18) | (43-2) (0.36) | B-1 (0.004) | W-1 (1,000) |
| Example 6 | III-1 (0.072) | PHS-2 (1.19) | b-10 (0.18) | (43-2) (0.36) | B-1 (0.004) | W-1 (1,000) |
| Example 7 | III-1 (0.072) | PHS-2 (1.19) | b-11 (0.18) | (43-2) (0.36) | B-1 (0.004) | W-1 (1,000) |
| Example 8 | III-1 (0.072) | PHS-2 (1.19) | b-12 (0.18) | (43-2) (0.36) | B-1 (0.004) | W-1 (1,000) |
| Example 9 | III-1 (0.072) | PHS-2 (1.19) | b-13 (0.18) | (43-2) (0.36) | B-1 (0.004) | W-1 (1,000) |
| Example 10 | III-1 (0.072) | PHS-2 (1.19) | b-14 (0.18) | (43-2) (0.36) | B-1 (0.004) | W-1 (1,000) |
| Example 11 | III-1 (0.072) | PHS-2 (1.19) | b-15 (0.18) | (43-2) (0.36) | B-1 (0.004) | W-1 (1,000) |
| Example 12 | III-1 (0.072) | PHS-2 (1.19) | b-16 (0.18) | (43-2) (0.36) | B-1 (0.004) | W-1 (1,000) |
| Example 13 | III-1 (0.072) | PHS-2 (1.19) | b-17 (0.18) | (43-2) (0.36) | B-1 (0.004) | W-1 (1,000) |
| Example 14 | III-1 (0.072) | PHS-2 (1.19) | b-19 (0.18) | (43-2) (0.36) | B-1 (0.004) | W-1 (1,000) |

*Based on solid contents

TABLE 2

Resist Film A (contact hole)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 15 | III-1 (0.072) | PHS-2 (1.19) | b-21 (0.18) | (43-2) (0.36) | B-1 (0.004) | W-1 (1,000) |
| Example 16 | III-1 (0.072) | PHS-2 (1.19) | b-22 (0.18) | (43-2) (0.36) | B-1 (0.004) | W-1 (1,000) |
| Example 17 | III-1 (0.072) | PHS-2 (1.19) | b-24 (0.18) | (43-2) (0.36) | B-1 (0.004) | W-1 (1,000) |
| Example 18 | III-1 (0.072) | PHS-2 (1.19) | b-25 (0.18) | (43-2) (0.36) | B-1 (0.004) | W-1 (1,000) |
| Example 19 | III-1 (0.072) | PHS-2 (1.19) | b-27 (0.18) | (43-2) (0.36) | B-1 (0.004) | W-1 (1,000) |
| Example 20 | III-1 (0.072) | PHS-2 (1.19) | b-28 (0.18) | (43-2) (0.36) | B-1 (0.004) | W-1 (1,000) |
| Example 21 | III-1 (0.072) | PHS-2 (1.19) | b-29 (0.18) | (43-2) (0.36) | B-1 (0.004) | W-1 (1,000) |
| Example 22 | III-1 (0.072) | PHS-2 (1.19) | b-30 (0.18) | (43-2) (0.36) | B-1 (0.004) | W-1 (1,000) |
| Example 23 | III-1 (0.072) | PHS-2 (1.19) | b-31 (0.18) | (43-2) (0.36) | B-1 (0.004) | W-1 (1,000) |
| Example 24 | III-1 (0.072) | PHS-2 (1.19) | b-32 (0.18) | (43-2) (0.36) | B-1 (0.004) | W-1 (1,000) |
| Example 25 | III-1 (0.072) | PHS-2 (1.19) | b-33 (0.18) | (43-2) (0.36) | B-1 (0.004) | W-1 (1,000) |
| Example 26 | III-1 (0.072) | PHS-2 (1.19) | b-35 (0.18) | (43-2) (0.36) | B-1 (0.004) | W-1 (1,000) |
| Example 27 | III-1 (0.072) | PHS-2 (1.19) | b-36 (0.18) | (43-2) (0.36) | B-1 (0.004) | W-1 (1,000) |
| Example 28 | III-1 (0.072) | PHS-2 (1.19) | b-37 (0.18) | (43-2) (0.36) | B-1 (0.004) | W-1 (1,000) |
| Example 29 | III-1 (0.072) | PHS-2 (1.19) | b-38 (0.18) | (43-2) (0.36) | B-1 (0.004) | W-1 (1,000) |
| Example 30 | III-1 (0.072) | PHS-2 (1.19) | b-39 (0.18) | (43-2) (0.36) | B-1 (0.004) | W-1 (1,000) |
| Example 31 | III-1 (0.072) | PHS-2 (1.19) | b-40 (0.18) | (43-2) (0.36) | B-1 (0.004) | W-1 (1,000) |

*Based on solid contents

TABLE 3

Resist Film A (contact hole)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 32 | III-1 (0.072) | PHS-2 (1.19) | b-4 (0.18) | (43-2) (0.36) | — | W-1 (1,000) |
| Example 33 | III-1 (0.072) | PHS-2 (1.19) | b-4 (0.18) | (43-2) (0.36) | B-1 (0.004) | — |
| Example 34 | III-1 (0.072) | PHS-2 (1.19) | b-4 (0.18) | (43-2) (0.36) | — | — |
| Example 35 | III-1 (0.072) | PHS-2 (1.19) | b-4 (0.18) | (43-2) (0.36) | B-1 (0.004) | W-1 (1,000) |
| Example 36 | III-1 (0.072) | PHS-2 (1.19) | b-4 (0.18) | (16) (0.36) | B-1 (0.004) | W-1 (1,000) |
| Example 37 | III-1 (0.072) | PHS-2 (1.19) | b-4 (0.18) | (41) (0.36) | B-1 (0.004) | W-1 (1,000) |
| Example 38 | III-1 (0.072) | PHS-2 (1.19) | b-4 (0.18) | (43) (0.36) | B-1 (0.004) | W-1 (1,000) |
| Example 39 | III-1 (0.072) | PHS/St2 (1.37) | b-4 (0.18) | (43) (0.18) | B-1 (0.004) | W-1 (1,000) |
| Example 40 | III-1 (0.072) | (c-3)' (1.37) | b-4 (0.18) | (43) (0.18) | B-1 (0.004) | W-1 (1,000) |
| Example 41 | III-1 (0.072) | (c-4)' (1.55) | b-4 (0.18) | — | B-1 (0.004) | W-1 (1,000) |
| Comparative Example 1 | PAG-1 (0.072) | (c-3)' (1.73) | — | — | — | — |
| Comparative Example 2 | II-3 (0.072) | (c-4)' (1.37) | — | (43) (0.36) | — | — |

*Based on solid contents

TABLE 4

Resist Film A (line-and-space)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 42 | III-1 (0.072) | PHS-1 (1.19) | b-4 (0.18) | (43-2) (0.36) | B-1 (0.004) | W-1 (1,000) |
| Example 43 | III-1 (0.072) | PHS-1 (1.19) | b-6 (0.18) | (43-2) (0.36) | B-1 (0.004) | W-1 (1,000) |
| Example 44 | III-1 (0.072) | PHS-1 (1.19) | b-7 (0.18) | (43-2) (0.36) | B-1 (0.004) | W-1 (1,000) |
| Example 45 | III-1 (0.072) | PHS-1 (1.19) | b-8 (0.18) | (43-2) (0.36) | B-1 (0.004) | W-1 (1,000) |
| Example 46 | III-1 (0.072) | PHS-1 (1.19) | b-9 (0.18) | (43-2) (0.36) | B-1 (0.004) | W-1 (1,000) |
| Example 47 | III-1 (0.072) | PHS-1 (1.19) | b-10 (0.18) | (43-2) (0.36) | B-1 (0.004) | W-1 (1,000) |
| Example 48 | III-1 (0.072) | PHS-1 (1.19) | b-11 (0.18) | (43-2) (0.36) | B-1 (0.004) | W-1 (1,000) |
| Example 49 | III-1 (0.072) | PHS-1 (1.19) | b-12 (0.18) | (43-2) (0.36) | B-1 (0.004) | W-1 (1,000) |
| Example 50 | III-1 (0.072) | PHS-1 (1.19) | b-13 (0.18) | (43-2) (0.36) | B-1 (0.004) | W-1 (1,000) |
| Example 51 | III-1 (0.072) | PHS-1 (1.19) | b-14 (0.18) | (43-2) (0.36) | B-1 (0.004) | W-1 (1,000) |
| Example 52 | III-1 (0.072) | PHS-1 (1.19) | b-15 (0.18) | (43-2) (0.36) | B-1 (0.004) | W-1 (1,000) |
| Example 53 | III-1 (0.072) | PHS-1 (1.19) | b-16 (0.18) | (43-2) (0.36) | B-1 (0.004) | W-1 (1,000) |
| Example 54 | III-1 (0.072) | PHS-1 (1.19) | b-17 (0.18) | (43-2) (0.36) | B-1 (0.004) | W-1 (1,000) |
| Example 55 | III-1 (0.072) | PHS-1 (1.19) | b-19 (0.18) | (43-2) (0.36) | B-1 (0.004) | W-1 (1,000) |

*Based on solid contents

TABLE 5

Resist Film A (line-and-space)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 56 | III-1 (0.072) | PHS-1 (1.19) | b-21 (0.18) | (43-2) (0.36) | B-1 (0.004) | W-1 (1,000) |
| Example 57 | III-1 (0.072) | PHS-1 (1.19) | b-22 (0.18) | (43-2) (0.36) | B-1 (0.004) | W-1 (1,000) |
| Example 58 | III-1 (0.072) | PHS-1 (1.19) | b-24 (0.18) | (43-2) (0.36) | B-1 (0.004) | W-1 (1,000) |
| Example 59 | III-1 (0.072) | PHS-1 (1.19) | b-25 (0.18) | (43-2) (0.36) | B-1 (0.004) | W-1 (1,000) |
| Example 60 | III-1 (0.072) | PHS-1 (1.19) | b-27 (0.18) | (43-2) (0.36) | B-1 (0.004) | W-1 (1,000) |
| Example 61 | III-1 (0.072) | PHS-1 (1.19) | b-28 (0.18) | (43-2) (0.36) | B-1 (0.004) | W-1 (1,000) |
| Example 62 | III-1 (0.072) | PHS-1 (1.19) | b-29 (0.18) | (43-2) (0.36) | B-1 (0.004) | W-1 (1,000) |
| Example 63 | III-1 (0.072) | PHS-1 (1.19) | b-30 (0.18) | (43-2) (0.36) | B-1 (0.004) | W-1 (1,000) |
| Example 64 | III-1 (0.072) | PHS-1 (1.19) | b-31 (0.18) | (43-2) (0.36) | B-1 (0.004) | W-1 (1,000) |
| Example 65 | III-1 (0.072) | PHS-1 (1.19) | b-32 (0.18) | (43-2) (0.36) | B-1 (0.004) | W-1 (1,000) |
| Example 66 | III-1 (0.072) | PHS-1 (1.19) | b-33 (0.18) | (43-2) (0.36) | B-1 (0.004) | W-1 (1,000) |
| Example 67 | III-1 (0.072) | PHS-1 (1.19) | b-35 (0.18) | (43-2) (0.36) | B-1 (0.004) | W-1 (1,000) |
| Example 68 | III-1 (0.072) | PHS-1 (1.19) | b-36 (0.18) | (43-2) (0.36) | B-1 (0.004) | W-1 (1,000) |
| Example 69 | III-1 (0.072) | PHS-1 (1.19) | b-37 (0.18) | (43-2) (0.36) | B-1 (0.004) | W-1 (1,000) |
| Example 70 | III-1 (0.072) | PHS-1 (1.19) | b-38 (0.18) | (43-2) (0.36) | B-1 (0.004) | W-1 (1,000) |
| Example 71 | III-1 (0.072) | PHS-1 (1.19) | b-39 (0.18) | (43-2) (0.36) | B-1 (0.004) | W-1 (1,000) |
| Example 72 | III-1 (0.072) | PHS-1 (1.19) | b-40 (0.18) | (43-2) (0.36) | B-1 (0.004) | W-1 (1,000) |
| Comparative Example 3 | PAG-1 (0.072) | (c-3)' (1.73) | — | — | — | — |
| Comparative Example 4 | II-3 (0.072) | (c-4)' (1.37) | — | (43) (0.36) | — | — |

*Based on solid contents

TABLE 6

Resist Film B (line-and-space)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 73 | III-1 (0.072) | PHS-1 (1.19) | b-4 (0.18) | (43-2) (0.36) | B-1 (0.004) | W-1 (1,000) |
| Example 74 | III-1 (0.072) | PHS-1 (1.19) | b-6 (0.18) | (43-2) (0.36) | B-1 (0.004) | W-1 (1,000) |
| Example 75 | III-1 (0.072) | PHS-1 (1.19) | b-7 (0.18) | (43-2) (0.36) | B-1 (0.004) | W-1 (1,000) |
| Example 76 | III-1 (0.072) | PHS-1 (1.19) | b-8 (0.18) | (43-2) (0.36) | B-1 (0.004) | W-1 (1,000) |
| Example 77 | III-1 (0.072) | PHS-1 (1.19) | b-9 (0.18) | (43-2) (0.36) | B-1 (0.004) | W-1 (1,000) |
| Example 78 | III-1 (0.072) | PHS-1 (1.19) | b-10 (0.18) | (43-2) (0.36) | B-1 (0.004) | W-1 (1,000) |
| Example 79 | III-1 (0.072) | PHS-1 (1.19) | b-11 (0.18) | (43-2) (0.36) | B-1 (0.004) | W-1 (1,000) |
| Example 80 | III-1 (0.072) | PHS-1 (1.19) | b-12 (0.18) | (43-2) (0.36) | B-1 (0.004) | W-1 (1,000) |
| Example 81 | III-1 (0.072) | PHS-1 (1.19) | b-13 (0.18) | (43-2) (0.36) | B-1 (0.004) | W-1 (1,000) |
| Example 82 | III-1 (0.072) | PHS-1 (1.19) | b-14 (0.18) | (43-2) (0.36) | B-1 (0.004) | W-1 (1,000) |
| Example 83 | III-1 (0.072) | PHS-1 (1.19) | b-15 (0.18) | (43-2) (0.36) | B-1 (0.004) | W-1 (1,000) |
| Example 84 | III-1 (0.072) | PHS-1 (1.19) | b-16 (0.18) | (43-2) (0.36) | B-1 (0.004) | W-1 (1,000) |
| Example 85 | III-1 (0.072) | PHS-1 (1.19) | b-17 (0.18) | (43-2) (0.36) | B-1 (0.004) | W-1 (1,000) |
| Example 86 | III-1 (0.072) | PHS-1 (1.19) | b-19 (0.18) | (43-2) (0.36) | B-1 (0.004) | W-1 (1,000) |

*Based on solid contents

TABLE 7

Resist Film B (line-and-space)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 87 | III-1 (0.072) | PHS-1 (1.19) | b-21 (0.18) | (43-2) (0.36) | B-1 (0.004) | W-1 (1,000) |
| Example 88 | III-1 (0.072) | PHS-1 (1.19) | b-22 (0.18) | (43-2) (0.36) | B-1 (0.004) | W-1 (1,000) |
| Example 89 | III-1 (0.072) | PHS-1 (1.19) | b-24 (0.18) | (43-2) (0.36) | B-1 (0.004) | W-1 (1,000) |
| Example 90 | III-1 (0.072) | PHS-1 (1.19) | b-25 (0.18) | (43-2) (0.36) | B-1 (0.004) | W-1 (1,000) |
| Example 91 | III-1 (0.072) | PHS-1 (1.19) | b-27 (0.18) | (43-2) (0.36) | B-1 (0.004) | W-1 (1,000) |
| Example 92 | III-1 (0.072) | PHS-1 (1.19) | b-28 (0.18) | (43-2) (0.36) | B-1 (0.004) | W-1 (1,000) |
| Example 93 | III-1 (0.072) | PHS-1 (1.19) | b-29 (0.18) | (43-2) (0.36) | B-1 (0.004) | W-1 (1,000) |
| Example 94 | III-1 (0.072) | PHS-1 (1.19) | b-30 (0.18) | (43-2) (0.36) | B-1 (0.004) | W-1 (1,000) |
| Example 95 | III-1 (0.072) | PHS-1 (1.19) | b-31 (0.18) | (43-2) (0.36) | B-1 (0.004) | W-1 (1,000) |
| Example 96 | III-1 (0.072) | PHS-1 (1.19) | b-32 (0.18) | (43-2) (0.36) | B-1 (0.004) | W-1 (1,000) |

TABLE 7-continued

Resist Film B (line-and-space)

| Example No. | Acid Generating Agent (g) | Binder (g) | Compound (a) (g) | Dissolution Inhibiting Compound (g) | Organic Basic Compound (g) | Surfactant* (ppm) |
|---|---|---|---|---|---|---|
| Example 97 | III-1 (0.072) | PHS-1 (1.19) | b-33 (0.18) | (43-2) (0.36) | B-1 (0.004) | W-1 (1,000) |
| Example 98 | III-1 (0.072) | PHS-1 (1.19) | b-35 (0.18) | (43-2) (0.36) | B-1 (0.004) | W-1 (1,000) |
| Example 99 | III-1 (0.072) | PHS-1 (1.19) | b-36 (0.18) | (43-2) (0.36) | B-1 (0.004) | W-1 (1,000) |
| Example 100 | III-1 (0.072) | PHS-1 (1.19) | b-37 (0.18) | (43-2) (0.36) | B-1 (0.004) | W-1 (1,000) |
| Example 101 | III-1 (0.072) | PHS-1 (1.19) | b-38 (0.18) | (43-2) (0.36) | B-1 (0.004) | W-1 (1,000) |
| Example 102 | III-1 (0.072) | PHS-1 (1.19) | b-39 (0.18) | (43-2) (0.36) | B-1 (0.004) | W-1 (1,000) |
| Example 103 | III-1 (0.072) | PHS-1 (1.19) | b-40 (0.18) | (43-2) (0.36) | B-1 (0.004) | W-1 (1,000) |
| Comparative Example 5 | PAG-1 (0.072) | (c-3)' (1.73) | — | — | — | — |
| Comparative Example 6 | II-3 (0.072) | (c-4)' (1.37) | — | (43) (0.36) | — | — |

*Based on solid contents

Acid Generating Agent PAG-1

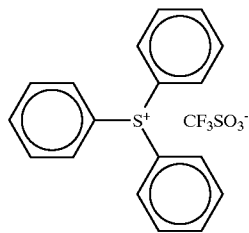

PAG-1

The compositions and physical properties of the binder resins used are as follows.

(c-3): p-hydroxystyrene/p-t-butoxycarboxystyrene copolymer (molar ratio: 80/20), weight average molecular weight (Mw): 13,000, molecular weight distribution (Mw/Mn): 1.4
(c-3)': Mw: 8,000
(c-4): p-hydroxystyrene/p-(1-ethoxyethoxy)styrene copolymer (molar ratio: 70/30), Mw: 12,000, molecular weight distribution (Mw/Mn): 1.3
(c-4)': Mw: 7,000
(c-21): p-hydroxystyrene/t-butyl methacrylate copolymer (molar ratio: 70/30), Mw: 16,000, molecular weight distribution (Mw/Mn): 2.0
(c-21)': Mw: 9,500
(c-22): p-hydroxystyrene/p-(1-t-butoxyethoxy) styrene copolymer (molar ratio: 85/15), Mw: 12,000, molecular weight distribution (Mw/Mn): 1.1
(c-22)': Mw: 7,000
(c-28): p-hydroxystyrene/p-(1-phenethyloxyethoxy)styrene copolymer (molar ratio: 85/15), Mw: 12,000, molecular weight distribution (Mw/Mn): 1.2
(c-28)': Mw: 7,000
(c-30): p-hydroxystyrene/p-(1-phenoxyethoxyethoxy) styrene copolymer (molar ratio: 85/15), Mw: 13,000, molecular weight distribution (Mw/Mn): 1.2
(c-30)': Mw: 8,000
(c-33): p-hydroxystyrene/p-(1-p-cyclohexylphenoxyethoxy) styrene copolymer (molar ratio: 85/15), Mw: 13,000, molecular weight distribution (Mw/Mn): 1.2
(c-33)': Mw: 8,000
(PHS-1): poly(p-hydroxystyrene) (VP-8000, manufactured by Nippon Soda Co. Ltd.)
(PHS-2): poly(p-hydroxystyrene) (VP-5000, manufactured by Nippon Soda Co. Ltd.)
(PHS-3): poly (p-hydroxystyrene) (H-80A, manufactured by Nippon Soda Co. Ltd.)
(PHS-4): poly (p-hydroxystyrene) (H-60A, manufactured by Nippon Soda Co. Ltd.)
(PHS/St: synthesized in Synthesis Example 1): p-hydroxystyrene/styrene copolymer (molar ratio: 80/20), Mw: 26,000, molecular weight distribution (Mw/Mn): 1.9
(PHS/St2): Mw: 15,600

The organic basic compounds used are as follows.

B-1: 2,4,5-triphenylimidazole
B-2: 1,5-diazabicyclo[4.3.0]nona-5-ene
B-3: 4-dimethylaminopyridine
B-4: 1,8-diazabicyclo[5.4.0]undeca-7-ene
B-5: N-cyclohexyl-N'-morpholinoethylthiourea The surfactants are as follows.

W-1: Troy Sol S-366 (manufactured by Troy Chemical Inc.)
W-2: Megafac F176 (manufactured by Dainippon Ink & Chemicals, Co., Ltd.)
W-3: Megafac R08 (manufactured by Dainippon Ink & Chemicals, Co., Ltd.)
W-4: polysiloxane polymer KP-341 (manufactured by Shin-Etsu Chemical Co., Ltd.)
W-5: Surfron S-382 (manufactured by Asahi Glass Co., Ltd.)

TABLE 8

Resist Film A (contact hole)

| Example No. | Sensitivity ($\mu C/cm^2$) | Resolution ($\mu m$) | Profile | PCD ($\mu m$) | PED ($\mu m$) |
|---|---|---|---|---|---|
| Example 1 | 0.8 | 0.06 | rectangular | 0.06 | 0.06 |
| Example 2 | 2.1 | 0.05 | rectangular | 0.05 | 0.05 |
| Example 3 | 1.4 | 0.06 | rectangular | 0.06 | 0.06 |
| Example 4 | 2.2 | 0.09 | rectangular | 0.09 | 0.09 |
| Example 5 | 0.8 | 0.08 | rectangular | 0.08 | 0.08 |
| Example 6 | 2.0 | 0.09 | rectangular | 0.09 | 0.09 |
| Example 7 | 1.7 | 0.09 | rectangular | 0.09 | 0.09 |
| Example 8 | 1.6 | 0.08 | rectangular | 0.08 | 0.08 |
| Example 9 | 0.9 | 0.09 | rectangular | 0.09 | 0.09 |

TABLE 8-continued

Resist Film A (contact hole)

| Example No. | Sensitivity (μC/cm$^2$) | Resolution (μm) | Profile | PCD (μm) | PED (μm) |
|---|---|---|---|---|---|
| Example 10 | 2.0 | 0.09 | rectangular | 0.09 | 0.09 |
| Example 11 | 1.1 | 0.10 | rectangular | 0.10 | 0.10 |
| Example 12 | 2.2 | 0.06 | rectangular | 0.06 | 0.06 |
| Example 13 | 2.2 | 0.08 | rectangular | 0.08 | 0.08 |
| Example 14 | 1.5 | 0.09 | rectangular | 0.09 | 0.09 |

TABLE 9

Resist Film A (contact hole)

| Example No. | Sensitivity (μC/cm$^2$) | Resolution (μm) | Profile | PCD (μm) | PED (μm) |
|---|---|---|---|---|---|
| Example 15 | 1.4 | 0.08 | rectangular | 0.08 | 0.08 |
| Example 16 | 1.4 | 0.07 | rectangular | 0.07 | 0.07 |
| Example 17 | 2.4 | 0.08 | rectangular | 0.08 | 0.08 |
| Example 18 | 2.2 | 0.09 | rectangular | 0.09 | 0.09 |
| Example 19 | 0.8 | 0.05 | rectangular | 0.05 | 0.05 |
| Example 20 | 1.0 | 0.07 | rectangular | 0.07 | 0.07 |
| Example 21 | 1.1 | 0.10 | rectangular | 0.10 | 0.10 |
| Example 22 | 0.7 | 0.05 | rectangular | 0.05 | 0.05 |
| Example 23 | 0.8 | 0.07 | rectangular | 0.07 | 0.07 |
| Example 24 | 1.1 | 0.10 | rectangular | 0.10 | 0.10 |
| Example 25 | 1.0 | 0.05 | rectangular | 0.05 | 0.05 |
| Example 26 | 1.4 | 0.06 | rectangular | 0.06 | 0.06 |
| Example 27 | 1.7 | 0.07 | rectangular | 0.07 | 0.07 |
| Example 28 | 1.2 | 0.05 | rectangular | 0.05 | 0.05 |
| Example 29 | 2.4 | 0.10 | rectangular | 0.10 | 0.10 |
| Example 30 | 0.7 | 0.07 | rectangular | 0.07 | 0.07 |
| Example 31 | 0.8 | 0.09 | rectangular | 0.09 | 0.09 |

TABLE 10

Resist Film A (contact hole)

| Example No. | Sensitivity (μC/cm$^2$) | Resolution (μm) | Profile | PCD (μm) | PED (μm) |
|---|---|---|---|---|---|
| Example 32 | 0.6 | 0.09 | rectangular | 0.10 | 0.10 |
| Example 33 | 1.5 | 0.11 | rectangular | 0.11 | 0.11 |
| Example 34 | 0.6 | 0.12 | rectangular | 0.13 | 0.13 |
| Example 35 | 1.2 | 0.11 | rectangular | 0.11 | 0.11 |
| Example 36 | 1.5 | 0.06 | rectangular | 0.06 | 0.06 |
| Example 37 | 1.2 | 0.07 | rectangular | 0.07 | 0.07 |
| Example 38 | 1.8 | 0.06 | rectangular | 0.06 | 0.06 |
| Example 39 | 1.5 | 0.07 | rectangular | 0.07 | 0.07 |
| Example 40 | 1.2 | 0.06 | rectangular | 0.06 | 0.06 |
| Example 41 | 1.1 | 0.09 | rectangular | 0.09 | 0.09 |
| Comparative Example 1 | 7.0 | 0.17 | capping, visor-like | 0.25 | 0.23 |
| Comparative Example 2 | 5.5 | 0.18 | capping, visor-like | 0.28 | 0.25 |

TABLE 11

Resist Film A (line-and-space)

| Example No. | Sensitivity (μC/cm$^2$) | Resolution (μm) | Profile | PCD (μm) | PED (μm) |
|---|---|---|---|---|---|
| Example 42 | 0.6 | 0.05 | rectangular | 0.05 | 0.05 |
| Example 43 | 1.7 | 0.04 | rectangular | 0.04 | 0.04 |
| Example 44 | 1.1 | 0.05 | rectangular | 0.05 | 0.05 |
| Example 45 | 1.8 | 0.08 | rectangular | 0.08 | 0.08 |

TABLE 11-continued

Resist Film A (line-and-space)

| Example No. | Sensitivity (μC/cm$^2$) | Resolution (μm) | Profile | PCD (μm) | PED (μm) |
|---|---|---|---|---|---|
| Example 46 | 0.6 | 0.07 | rectangular | 0.07 | 0.07 |
| Example 47 | 1.6 | 0.08 | rectangular | 0.08 | 0.08 |
| Example 48 | 1.4 | 0.08 | rectangular | 0.08 | 0.08 |
| Example 49 | 1.3 | 0.07 | rectangular | 0.07 | 0.07 |
| Example 50 | 0.7 | 0.08 | rectangular | 0.08 | 0.08 |
| Example 51 | 1.6 | 0.08 | rectangular | 0.08 | 0.08 |
| Example 52 | 0.9 | 0.09 | rectangular | 0.09 | 0.09 |
| Example 53 | 1.8 | 0.05 | rectangular | 0.05 | 0.05 |
| Example 54 | 1.8 | 0.07 | rectangular | 0.07 | 0.07 |
| Example 55 | 1.2 | 0.08 | rectangular | 0.08 | 0.08 |

TABLE 12

Resist Film A (line-and-space)

| Example No. | Sensitivity (μC/cm$^2$) | Resolution (μm) | Profile | PCD (μm) | PED (μm) |
|---|---|---|---|---|---|
| Example 56 | 1.1 | 0.07 | rectangular | 0.07 | 0.07 |
| Example 57 | 1.1 | 0.06 | rectangular | 0.06 | 0.06 |
| Example 58 | 1.9 | 0.07 | rectangular | 0.07 | 0.07 |
| Example 59 | 1.8 | 0.08 | rectangular | 0.08 | 0.08 |
| Example 60 | 0.6 | 0.04 | rectangular | 0.04 | 0.04 |
| Example 61 | 0.8 | 0.06 | rectangular | 0.06 | 0.06 |
| Example 62 | 0.9 | 0.09 | rectangular | 0.09 | 0.09 |
| Example 63 | 0.6 | 0.04 | rectangular | 0.04 | 0.04 |
| Example 64 | 0.6 | 0.06 | rectangular | 0.06 | 0.06 |
| Example 65 | 0.9 | 0.09 | rectangular | 0.09 | 0.09 |
| Example 66 | 0.8 | 0.04 | rectangular | 0.04 | 0.04 |
| Example 67 | 1.1 | 0.05 | rectangular | 0.05 | 0.05 |
| Example 68 | 1.4 | 0.06 | rectangular | 0.06 | 0.06 |
| Example 69 | 1.0 | 0.04 | rectangular | 0.04 | 0.04 |
| Example 70 | 1.9 | 0.09 | rectangular | 0.09 | 0.09 |
| Example 71 | 0.8 | 0.06 | rectangular | 0.06 | 0.06 |
| Example 72 | 0.6 | 0.08 | rectangular | 0.08 | 0.08 |
| Comparative Example 3 | 7.1 | 0.15 | taper | 0.23 | 0.20 |
| Comparative Example 4 | 5.6 | 0.14 | taper | 0.24 | 0.23 |

TABLE 13

Resist Film B (line-and-space)

| Example No. | Sensitivity (μC/cm$^2$) | Resolution (μm) | Profile | PCD (μm) | PED (μm) |
|---|---|---|---|---|---|
| Example 73 | 0.8 | 0.06 | rectangular | 0.06 | 0.06 |
| Example 74 | 2.1 | 0.05 | rectangular | 0.05 | 0.05 |
| Example 75 | 1.4 | 0.06 | rectangular | 0.06 | 0.06 |
| Example 76 | 2.2 | 0.09 | rectangular | 0.09 | 0.09 |
| Example 77 | 0.8 | 0.08 | rectangular | 0.08 | 0.08 |
| Example 78 | 2.0 | 0.09 | rectangular | 0.09 | 0.09 |
| Example 79 | 1.7 | 0.09 | rectangular | 0.09 | 0.09 |
| Example 80 | 1.6 | 0.08 | rectangular | 0.08 | 0.08 |
| Example 81 | 0.9 | 0.09 | rectangular | 0.09 | 0.09 |
| Example 82 | 2.0 | 0.09 | rectangular | 0.09 | 0.09 |
| Example 83 | 1.1 | 0.10 | rectangular | 0.10 | 0.10 |
| Example 84 | 2.2 | 0.06 | rectangular | 0.06 | 0.06 |
| Example 85 | 2.2 | 0.08 | rectangular | 0.08 | 0.08 |
| Example 86 | 1.5 | 0.09 | rectangular | 0.09 | 0.09 |

TABLE 14

Resist Film A (line-and-space)

| Example No. | Sensitivity ($\mu C/cm^2$) | Resolution ($\mu m$) | Profile | PCD ($\mu m$) | FED ($\mu m$) |
|---|---|---|---|---|---|
| Example 87 | 1.4 | 0.08 | rectangular | 0.08 | 0.08 |
| Example 88 | 1.4 | 0.07 | rectangular | 0.07 | 0.07 |
| Example 89 | 2.4 | 0.08 | rectangular | 0.08 | 0.08 |
| Example 90 | 2.2 | 0.09 | rectangular | 0.09 | 0.09 |
| Example 91 | 0.8 | 0.05 | rectangular | 0.05 | 0.05 |
| Example 92 | 1.0 | 0.07 | rectangular | 0.07 | 0.07 |
| Example 93 | 1.1 | 0.10 | rectangular | 0.10 | 0.10 |
| Example 94 | 0.7 | 0.05 | rectangular | 0.05 | 0.05 |
| Example 95 | 0.8 | 0.07 | rectangular | 0.07 | 0.07 |
| Example 96 | 1.1 | 0.10 | rectangular | 0.10 | 0.10 |
| Example 97 | 1.0 | 0.05 | rectangular | 0.05 | 0.05 |
| Example 98 | 1.4 | 0.06 | rectangular | 0.06 | 0.06 |
| Example 99 | 1.7 | 0.07 | rectangular | 0.07 | 0.07 |
| Example 100 | 1.2 | 0.05 | rectangular | 0.05 | 0.05 |
| Example 101 | 2.4 | 0.10 | rectangular | 0.10 | 0.10 |
| Example 102 | 0.7 | 0.07 | rectangular | 0.07 | 0.07 |
| Example 103 | 0.8 | 0.09 | rectangular | 0.09 | 0.09 |
| Comparative Example 5 | 7.1 | 0.15 | taper | 0.24 | 0.21 |
| Comparative Example 6 | 5.6 | 0.15 | taper | 0.24 | 0.23 |

It can be seen from the results in Tables 8 to 14 that the positive resist composition of the present invention is excellent in sensitivity and resolution, provides a rectangular pattern profile, in addition extremely excellent in PCD stability and PED stability.

When the same procedure was repeated in Examples 1, 4, 5, 14, 15, 20, 21, 29, 30 and 31 except for replacing organic basic compound B-1 with B-2, B-3, B-4 and B-5, the same performances could be obtained respectively.

Further, when the same procedure was repeated in Examples 1, 4, 5, 14, 15, 20, 21, 29, 30 and 31 except for replacing surfactant W-1 with W-2, W-3, W-4 and W-5, the same performances could be obtained respectively.

When the same procedure was repeated in Examples 1, 4, 6, 8, 13 and 14 except for replacing PHS-2 with PHS-4, the same performances could be obtained respectively.

When the same procedure was repeated in Example 41 except for replacing the binder with (c-21)', (c-22)', (c-28)', (c-30)' and (c-33)', the same performances could be obtained respectively.

When the same procedure was repeated in Examples except for replacing PHS-1 with PHS-3, the same performances could be obtained respectively.

Further, when the same procedure was repeated in Examples 1, 4, 5, 14, 15, 20, 39, 40 and 41 except for replacing the solvent with propylene glycol monomethyl ether acetate/propylene glycol monomethyl ether 80/20 (weight ratio), the same performances could be obtained respectively.

When the same procedure was repeated in Examples 1, 5, 11 and 28 except for replacing the acid generating agent with compounds (II-1), (II-7), (II-5), (II-6) and (III-3), the same performances could be obtained respectively.

Further, each component shown in Table 1 was dissolved in each of the above solvents, and each solution of the composition in Examples 1 to 31 and 35 was filtered through a polyethylene filter having a pore diameter of 0.1 $\mu m$ to prepare a resist solution. The in-plane uniformity of each resist solution was evaluated as follows.

In-plane Uniformity

A resist film for measuring in-plane uniformity was prepared by coating each resist solution on an 8-inch silicon wafer by the same procedure as the above resist layer coating. Measuring was performed at 36 points uniformly along the direction of the diameter of the wafer in a manner to form a cross with Lambda A (manufactured by Dai Nippon Screen Mgf. Co., Ltd.). The standard deviation of each measured value was taken, and evaluation was performed by the following criteria:

o: The value obtained by multiplying the standard deviation by 3 was less than 50 x: exceeding 50.

As a result, the in-plane uniformity of the resist films coated using propylene glycol monomethyl ether acetate (PGMEA) (Examples 1 to 31) was graded o, contrary to this, the film coated with ethyl lactate (EL) (Example 35) graded x.

From this results, it can be seen that PGMEA is preferred as a resist coating solvent in the present invention.

(6) Patterning by Equi-magnification X-ray Exposure

A resist film having a film thickness of 0.40 $\mu m$ was prepared using each of the resist compositions in Example 42 and Comparative Examples 1 and 2 in the same manner as in the above resist film B in the above method (1). Patterning was performed in the same manner as in the above (2) except for using an equi-magnification x-ray exposure apparatus (gap value: 20 nm), and the resist performances (sensitivity, resolution and pattern shape) were evaluated in the same manner as in the above method (3). The results of evaluation are shown in Table 15.

TABLE 15

| Resist Composition | Sensitivity ($mJ/cm^2$) | Resolution ($\mu m$) | Pattern Shape |
|---|---|---|---|
| Example 42 | 50 | 0.10 | rectangular |
| Comparative Example 1 | 185 | 0.18 | taper, film decrease |
| Comparative Example 2 | 185 | 0.18 | taper |

From the results in Table 15, the resist composition of the present invention shows extremely excellent performances even in X-ray exposure.

Examples 201 to 230 and Comparative Examples 101 to 104

(1) Coating of Resist

Each component shown in Table 16 below was dissolved in 8.2 g of propylene glycol monomethyl ether acetate, and the solution was filtered through a Teflon filter having a pore diameter of 0.1 $\mu m$. Thus, a resist solution was prepared. In the composition in Example 221, 8.2 g of ethyl lactate was used as the solvent.

Each sample solution was coated on a silicon wafer by a spin coater, and the coated layer was dried by a vacuum suction type hot plate at 120° C. for 90 seconds, thereby a resist film having a film thickness of 0.5 $\mu m$ was obtained.

(2) Formation of Resist Pattern

Each resist film was subjected to irradiation using an electron beam imaging apparatus (applied voltage: 50 KeV). After irradiation, the resist film was heated using a vacuum suction type hot plate at 110° C. for 60 seconds, immersed in a 2.38% aqueous solution of tetramethylammonium hydroxide (TMAH) for 60 seconds, rinsed with water for 30 seconds, and dried. The shapes of the cross sections of the obtained contact hole pattern was observed by a scanning electron microscope.

(3) Evaluation of Sensitivity and Resolution

Critical resolution at the contact hole pattern (the minimum diameter of the hole) was taken as resolution, and the minimum dose capable of defining the critical resolution was taken as sensitivity.

(4) Evaluation of PBD

Each resist film obtained according to the above method (1) was subjected to irradiation using an electron beam imaging apparatus (applied voltage: 50 KeV). After irradiation, the resist film was heated using a vacuum suction type hot plate at 110° C. for 60 seconds, allowed to stand for 120 minutes, immersed in a 2.38% aqueous solution of TMAH for 60 seconds, rinsed with water for 30 seconds, and dried. The shapes of the cross sections of the obtained contact hole pattern was observed by a scanning electron microscope. The minimum pattern size which could be defined with the same dose as the minimum dose obtained by the method in (3) was obtained.

o: The difference between this size and that obtained by method (3) was 3% or less.
Δ: The difference exceeds 3% but not more than 5%.
x: The difference exceeds 5%.

Acid Generating Agent PAG-2

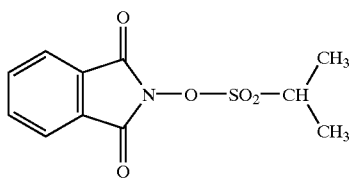

The compositions and physical properties of the binder resins used are as follows.

(c-3): p-hydroxystyrene/p-t-butoxycarboxystyrene copolymer (molar ratio: 80/20), weight average molecular weight: 13,000, molecular weight distribution (Mw/Mn): 1.4

(c-4): p-hydroxystyrene/p-(1-ethoxyethoxy)styrene copolymer (molar ratio: 70/30), weight average molecular weight: 12,000, molecular weight distribution (Mw/Mn): 1.3

(c-21): p-hydroxystyrene/t-butyl methacrylate copolymer (molar ratio: 70/30), weight average molecular weight: 16,000, molecular weight distribution (Mw/Mn): 2.0

TABLE 16

| Example No1 | Acid Generating Agent (g) | Binder (g) | Dissolution Inhibiting Compound (g) | Cyclic Ether Compound (g) | Organic Basic Compound (g) | Surfactant (g) | Other Additives (g) |
|---|---|---|---|---|---|---|---|
| Example 201 | I-1 (0.072) | PHS (1.19) | (43-2) (0.36) | (A-1) (0.18) | (B-1) (0.002) | (W-1) (0.001) | — |
| Example 202 | " | " | " | (A-2) (0.18) | " | " | — |
| Example 203 | " | " | " | (A-3) (0.18) | " | " | — |
| Example 204 | " | " | " | (A-4) (0.18) | " | " | — |
| Example 205 | " | " | " | (A-5) (0.18) | " | " | — |
| Example 206 | " | " | " | (A-6) (0.18) | " | " | — |
| Example 207 | " | PHS/St (1.39) | (43-2) (0.16) | (A-2) (0.18) | " | " | — |
| Example 208 | " | (c-3) (1.49) | (43-2) (0.06) | " | " | " | — |
| Example 209 | " | (c-3) (1.55) | — | " | " | " | — |
| Example 210 | " | (c-4) (1.49) | (43-2) (0.06) | " | " | " | — |
| Example 211 | " | (c-4) (1.55) | — | " | " | " | — |
| Example 212 | " | (c-21) (1.49) | (43-2) (0.06) | " | " | " | — |
| Example 213 | " | (c-21) (1.55) | — | " | " | " | — |
| Example 214 | " | (c-22) (1.55) | — | " | " | " | — |
| Example 215 | " | (c-28) (1.55) | — | " | " | " | — |
| Example 216 | " | (c-30) (1.55) | — | " | " | " | — |
| Example 217 | " | PHS (1.19) | (43-2) (0.36) | " | (B-2) (0.002) | " | — |
| Example 218 | " | " | " | " | (B-3) (0.002) | " | — |
| Example 219 | " | " | " | " | (B-4) (0.002) | " | — |
| Example 220 | " | " | " | " | (B-5) (0.002) | " | — |
| Example 221 | I-1 (0.072) | PHS (1.19) | (16) (0.36) | (A-2) (0.18) | (B-1) (0.002) | (W-1) (0.001) | — |
| Example 222 | " | " | (41) (0.36) | " | " | " | — |
| Example 223 | " | " | (43) (0.36) | " | " | " | — |
| Example 224 | II-1 (0.072) | " | (43-2) (0.36) | " | " | " | — |
| Example 225 | III-1 (0.072) | " | " | " | " | " | — |
| Example 226 | mixture of I-9 and II-1 | " | " | " | " | " | — |
| Example 227 | I-1 (0.072) | " | " | " | " | (W-2) (0.001) | — |
| Example 228 | " | " | " | " | " | (W-3) (0.001) | — |
| Example 229 | " | " | " | " | " | (W-4) (0.001) | — |
| Example 230 | " | " | " | " | " | (W-5) (0.001) | — |
| Comparative Example 101 | I-1 (0.072) | PHS (1.37) | (16) (0.36) | — | " | (W-1) (0.001) | — |
| Comparative Example 102 | PAG-2 (0.072) | (c-3) (1.73) | — | — | " | " | — |
| Comparative Example 103 | II-3 (0.072) | (c-4) (1.37) | (43) (0.36) | — | " | " | — |
| Comparative Example 104 | I-1 (0.072) | PHS (1.19) | (43-2) (0.36) | — | " | " | 1-Phenoxyethyl vinyl ether (0.36) |

(c-22): p-hydroxystyrene/p-(1-t-butoxyethoxy) styrene copolymer (molar ratio: 85/15), weight average molecular weight: 12,000, molecular weight distribution (Mw/Mn): 1.1

(c-28): p-hydroxystyrene/p-(1-phenethyloxyethoxy) styrene copolymer (molar ratio: 85/15), weight average molecular weight: 12,000, molecular weight distribution (Mw/Mn): 1.2

(c-30): p-hydroxystyrene/p-(1-phenoxyethoxyethoxy) styrene copolymer (molar ratio: 85/15), weight average molecular weight: 13,000, molecular weight distribution (Mw/Mn): 1.2

(PHS): poly-p-hydroxystyrene (VP-15000, manufactured by Nippon Soda Co. Ltd.)

(PHS/St: synthesized in Synthesis Example 1): p-hydroxystyrene/styrene copolymer (molar ratio: 80/20), weight average molecular weight: 26,000, molecular weight distribution (Mw/Mn): 1.9

The organic basic compounds and surfactants used are as follows.

Organic Basic Compounds

B-1: 2,4,5-triphenylimidazole
B-2: 1,5-diazabicyclo[4.3.0]nona-5-ene
B-3: 4-dimethylaminopyridine
B-4: 1,8-diazabicyclo[5.4.0]undeca-7-ene
B-5: N-cyclohexyl-N'-morpholinoethylthiourea Surfactant W-3: Megafac R08 (manufactured by Dainippon Ink & Chemicals, Co., Ltd.)
W-2: Megafac F176 (manufactured by Dainippon Ink & Chemicals, Co., Ltd.)
W-4: Troy Sol S-366 (manufactured by Troy Chemical Inc.)
W-4: polysiloxane polymer KP-341 (manufactured by Shin-Etsu Chemical Co., Ltd.)
W-5: Surfron S-382 (manufactured by Asahi Glass Co., Ltd.)

TABLE 17

| Example No. | Sensitivity ($\mu C/cm^2$) | Resolution ($\mu m$) | PBD Stability |
|---|---|---|---|
| Example 201 | 3.0 | 0.09 | o |
| Example 202 | 3.0 | 0.09 | o |
| Example 203 | 3.0 | 0.09 | o |
| Example 204 | 3.0 | 0.09 | o |
| Example 205 | 3.0 | 0.09 | o |
| Example 206 | 3.5 | 0.09 | o |
| Example 207 | 3.5 | 0.09 | o |
| Example 208 | 3.5 | 0.08 | o |
| Example 209 | 3.5 | 0.09 | o |
| Example 210 | 3.5 | 0.08 | o |
| Example 211 | 3.5 | 0.09 | o |
| Example 212 | 3.5 | 0.08 | o |
| Example 213 | 3.5 | 0.08 | o |
| Example 214 | 3.5 | 0.08 | o |
| Example 215 | 3.5 | 0.08 | o |
| Example 216 | 3.5 | 0.08 | o |
| Example 217 | 3.0 | 0.08 | o |
| Example 218 | 3.0 | 0.08 | o |
| Example 219 | 3.0 | 0.08 | o |
| Example 220 | 3.0 | 0.08 | o |
| Example 221 | 3.0 | 0.08 | o |
| Example 222 | 3.0 | 0.08 | o |
| Example 223 | 3.0 | 0.08 | o |
| Example 224 | 2.5 | 0.09 | o |
| Example 225 | 2.5 | 0.09 | o |
| Example 226 | 2.5 | 0.09 | o |
| Example 227 | 3.0 | 0.09 | o |

TABLE 17-continued

| Example No. | Sensitivity ($\mu C/cm^2$) | Resolution ($\mu m$) | PBD Stability |
|---|---|---|---|
| Example 228 | 3.0 | 0.09 | o |
| Example 229 | 3.0 | 0.09 | o |
| Example 230 | 3.0 | 0.09 | o |
| Comparative Example 101 | 4.0 | 0.17 | x |
| Comparative Example 102 | 6.0 | 0.20 | Δ |
| Comparative Example 103 | 5.5 | 0.18 | x |
| Comparative Example 104 | 3.0 | 0.10 | x |

It can be seen from the results in Table 17 that the positive electron beam resist composition of the present invention is high in sensitivity and resolution, and extremely excellent in PBD stability. The pattern profile was rectangular.

Further, each component shown in Table 16 was dissolved in each of the above solvents, and each solution of the composition in Examples 201 to 230 was filtered through a polyethylene filter having a pore diameter of 0.1 $\mu m$ to prepare a resist solution. The in-plane uniformity of each resist solution was evaluated as follows.

In-plane Uniformity

A resist film for measuring in-plane uniformity was prepared by coating each resist solution on an 8-inch silicon wafer by the same procedure as the above resist layer coating. Measuring was performed at 36 points uniformly along the direction of the diameter of the wafer in a manner to form a cross with Lambda A (manufactured by Dai Nippon Screen Mgf. Co., Ltd.). The standard deviation of each measured value was taken, and evaluation was performed by the following criteria:

o: The value obtained by multiplying the standard deviation by 3 was less than 50 x: exceeding 50.

As a result, the in-plane uniformity of the resist films coated using propylene glycol monomethyl ether acetate (PGMEA) (Examples 201 to 230) was graded o.

(6) Patterning by Equi-magnification X-ray Exposure

A resist film having a film thickness of 0.40 $\mu m$ was prepared using each of the resist compositions in Example 220 and Comparative Examples 101 and 102 in the same manner as in the above method (1). Patterning was performed in the same manner as in the above (2) except for using an equi-magnification X-ray exposure apparatus (gap value: 20 nm), and the resist performances (sensitivity and resolution) and PBD stability were evaluated in the same manner as in the above method (3). The pattern shape in Example 220 was rectangular.

TABLE 18

| Resist Composition | Sensitivity ($mJ/cm^2$) | Resolution ($\mu m$) | PBD Stability |
|---|---|---|---|
| Example 220 | 80 | 0.10 | o |
| Comparative Example 101 | 190 | 0.18 | x |
| Comparative Example 102 | 250 | 0.17 | x |

From the results in Table 18, the resist composition of the present invention shows extremely excellent performances even in X-ray exposure.

The positive resist composition of the present invention is excellent in sensitivity and resolution, can provide an excellent rectangular profile and further extremely excellent in PCD, PED and PBD stabilities.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A positive chemical amplification resist composition which comprises (a) a compound capable of directly or indirectly generating a radical (A) on irradiation with an energy ray.

2. The positive chemical amplification resist composition as claimed in claim 1, which further comprises (b) a compound capable of generating an acid on irradiation with an energy ray.

3. The positive chemical amplification resist composition as claimed in claim 2, wherein the compound (b) contains at least one compound represented by formula (II) or (III):

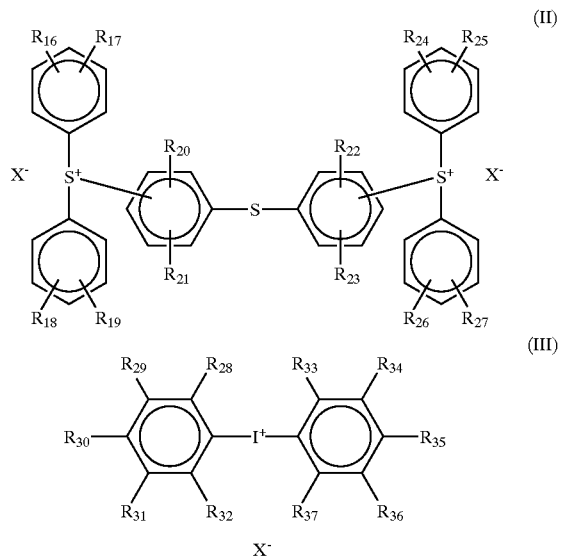

wherein $R_{16}$ to $R_{37}$, which are the same or different, each represents a hydrogen atom, a straight chain, branched or cyclic alkyl group, a straight chain, branched or cyclic alkoxyl group, a hydroxyl group, a halogen atom, or an —S—$R_{38}$ group; $R_{38}$ represents a straight chain, branched or cyclic alkyl group, or an aryl group, and at least two of $R_{16}$ to $R_{27}$, and at least two of $R_{28}$ to $R_{37}$ may be bonded to form a ring containing at least one selected from a single bond, a carbon atom, an oxygen atom, a sulfur atom and a nitrogen atom; and X$^-$ represents an anion of a sulfonic acid.

4. The positive chemical amplification resist composition as claimed in claim 3, wherein X$^-$ represents an anion of an alkylsulfonic acid, a benzenesulfonic acid, a naphthalenesulfonic acid or an anthracenesulfonic acid, each of which has at least one group selected from the group consisting of:

at least one fluorine atom;
a straight chain, branched, or cyclic alkyl group substituted with at least one fluorine atom;
a straight chain, branched, or cyclic alkoxyl group substituted with at least one fluorine atom;
an acyl group substituted with at least one fluorine atom;
an acyloxy group substituted with at least one fluorine atom;
a sulfonyl group substituted with at least one fluorine atom;
a sulfonyloxy group substituted with at least one fluorine atom;
a sulfonylamino group substituted with at least one fluorine atom;
an aryl group substituted with at least one fluorine atom;
an aralkyl group substituted with at least one fluorine atom; and
an alkoxycarbonyl group substituted with at least one fluorine atom.

5. The positive chemical amplification resist composition as claimed in claim 1, which further comprises at least one of:

(e) a resin: containing an acid-decomposable group; and being capable of increasing the solubility in an alkali developer by the action of an acid; and (g) a resin insoluble in water and soluble in an alkali developer.

6. The positive chemical amplification resist composition as claimed in claim 1, which further comprises (f) a low molecular weight dissolution-inhibiting compound: having a molecular weight of 3,000 or less; containing an acid-decomposable group; and being capable of increasing the solubility in an alkali developer by the action of an acid.

7. The positive chemical amplification resist composition as claimed in claim 1, wherein the radical (A) is capable of generating an acid by a reaction with the compound (a).

8. The positive chemical amplification resist composition as claimed in claim 1, wherein the compound (a) is at least one compound selected from the group consisting of:

(1) an alkyl halide other than an alkyl fluoride, an aryl halide other than an aryl fluorine, an aralkyl halide other than an aralkyl fluorine, and an allyl halide other than an allyl fluorine,
in which a part or all of the hydrogens in the alkyl halide, the aryl halide, the aralkyl halide and the allyl halide may be substituted with a fluorine, (2) a thiol compound, a secondary alcohol, a substituted or unsubstituted allyl alcohol, a benzyl alcohol which may be a substituent on the aromatic ring, ester and ether compounds of them, a sulfide compound, and a disulfide compound, (3) a halogen-containing silicon compound and an alkoxy silicon compound, (4) a straight chain, branched or cyclic acetal compound, and (5) an N-hydroxyl compound.

9. The positive chemical amplification resist composition as claimed in claim 1, which further comprises (c) an organic basic compound.

10. The positive chemical amplification resist composition as claimed in claim 1, which further comprises (d) a surfactant containing at least one of a fluorine atom and a silicon atom.

11. The positive chemical amplification resist composition as claimed in claim 1, which further comprises propylene glycol monomethyl ether acetate as a solvent.

12. The positive chemical amplification resist composition as claimed in claim 1, wherein the energy ray is one of an electron beam and an X-ray.

* * * * *